(12) United States Patent
Fuse et al.

(10) Patent No.: US 7,550,739 B2
(45) Date of Patent: Jun. 23, 2009

(54) STATIC ELECTRICITY DEFLECTING DEVICE, ELECTRON BEAM IRRADIATING APPARATUS, SUBSTRATE PROCESSING APPARATUS, SUBSTRATE PROCESSING METHOD AND METHOD OF MANUFACTURING SUBSTRATE

(75) Inventors: Takashi Fuse, Tokyo (JP); Tadashi Kotsugi, Tokyo (JP); Kyo Tsuboi, Tokyo (JP); Koji Takeya, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 155 days.

(21) Appl. No.: 11/615,485

(22) Filed: Dec. 22, 2006

(65) Prior Publication Data

US 2007/0228275 A1  Oct. 4, 2007

(30) Foreign Application Priority Data

Mar. 30, 2006  (JP) .............................. 2006-092639

(51) Int. Cl.
*H01J 49/22* (2006.01)
*H01J 49/06* (2006.01)

(52) U.S. Cl. ............................... 250/396 R; 250/492.2; 250/492.1; 250/492.3; 250/306; 250/307

(58) Field of Classification Search ............. 250/396 R, 250/492.2, 492.1, 492.3, 306, 307
See application file for complete search history.

(56) References Cited

U.S. PATENT DOCUMENTS

| | | | |
|---|---|---|---|
| 4,661,709 A | 4/1987 | Walker et al. | |
| 5,719,402 A | 2/1998 | Satoh et al. | |
| 6,055,719 A | 5/2000 | Ooaeh et al. | |
| 6,125,522 A | 10/2000 | Nakasuji | |
| 6,566,658 B1 | 5/2003 | Okubo | |
| 2007/0228285 A1* | 10/2007 | Fuse et al. | 250/396 R |
| 2008/0062608 A1* | 3/2008 | Fuse et al. | 361/212 |
| 2008/0067429 A1* | 3/2008 | Fuse et al. | 250/492.2 |

FOREIGN PATENT DOCUMENTS

JP  2002-231170  8/2002

OTHER PUBLICATIONS

U.S. Appl. No. 11/615,621, filed Dec. 22, 2006, Shinozaki, et al.
U.S. Appl. No. 11/614,224, filed Dec. 21, 2006, Shinozaki, et al.
U.S. Appl. No. 11/615,676, filed Dec. 22, 2006, Shinozaki, et al.
U.S. Appl. No. 11/614,310, filed Dec. 21, 2006, Shinozaki, et al.
U.S. Appl. No. 11/614,367, filed Dec. 21, 2006, Shinozaki, et al.
U.S. Appl. No. 11/615,485, filed Dec. 22, 2006, Fuse, et al.

* cited by examiner

*Primary Examiner*—Nikita Wells
(74) *Attorney, Agent, or Firm*—Oblon, Spivak, McClelland, Maier & Neustadt, P.C.

(57) ABSTRACT

A substrate processing apparatus which irradiates a substrate under processing with an electron beam and processes the substrate with the electron beam is disclosed. The substrate processing apparatus includes an electron beam generation mechanism which generates the electron beam, first area having a plurality of first static electricity deflecting devices whose thicknesses gradually increase in a traveling direction of the electron beam, and a second area disposed on a downstream side of the electron beam of the first area and having a plurality of second static electricity deflecting devices whose thicknesses are nearly same in the traveling direction of the electron beam. The substrate processing apparatus may further include a plurality of lenses whose thicknesses gradually decrease in the traveling direction of the electron beam, at least one of the plurality of lenses being disposed in each of the first area and the second area.

19 Claims, 44 Drawing Sheets

STATIC ELECTRICITY DEFLECTING DEVICE, ELECTRON BEAM IRRADIATING APPARATUS, SUBSTRATE PROCESSING APPARATUS, SUBSTRATE PROCESSING METHOD AND METHOD OF MANUFACTURING SUBSTRATE

BACKGROUND OF THE INVENTION

1. Field of the Invention

The present invention relates to a static electricity deflecting device, an electron beam irradiating apparatus, a substrate processing apparatus, a substrate processing method, and a method of manufacturing a substrate.

2. Description of the Related Art In recent years, an exposing method using for example an electron beam has been accomplished instead of photolithography technology.

In a conventional exposing apparatus using an electron beam, an objective lens that irradiates a wafer with an electron beam and a static electricity deflecting device that deflects the position of the electron beam on the wafer are disposed in a cylindrical column. In the static electricity deflecting device, a plurality of deflecting electrodes are disposed on an inner wall surface of a base member composed of cylindrical ceramic such that the deflecting electrodes are electrically divided as described in for example Japanese Patent Application Laid-Open No. 2002-231170 (hereinafter this related art is referred to as Patent Document 1).

In the static electricity deflecting device of such an exposing apparatus, ceramic or the like is exposed on a non-electrode are of the inner wall surface of the cylindrical base member. Thus, a material that dos not easily discharge static electricity, such as exposed ceramic, tends to be charged up. As a result, an electron beam is deflected to an undesired position, resulting in deterioration of exposure accuracy.

The present invention is made from the foregoing point of view. An object of the present invention is to provide a static electricity deflecting device that suppresses occurrence of charge-up and to an electron beam irradiating apparatus, a substrate processing apparatus, a substrate processing method, and a method of manufacturing a substrate that use the static electricity deflecting device.

SUMMARY OF THE INVENTION

To solve the foregoing problem, a static electricity deflecting device of the present invention includes a cylindrical member having an electron beam passing portion, a plurality of deflecting electrodes which are disposed on an inner wall surface of the cylindrical member along a cylindrical axis thereof and each of which is electrically divided, a plurality of space portions each of which is connected to a gap portion formed by adjacent two of the plurality of deflecting electrodes, each of the plurality of space portions being disposed at an outer position of the gap portion when each of the plurality of space portions is viewed from the electron beam passing portion, and a first conductive film formed in each of the plurality of space portions In the structure of the present invention, of electrons that passed through the electron beam passing portion, electrons that entered a gap portion of adjacent deflecting electrodes enters into a space portion. The electrons are discharged by the first conduction film. Thus, occurrence of charge-up is suppressed. An electron beam emitted by the electron beam irradiating apparatus that has such a static electricity deflecting device is not unnecessarily deflected by charge-up. Thus, the electron beam can be deflected in a desired manner. An exposing device that has such an electron beam irradiating apparatus can perform an exposing process with high accuracy.

In addition, the deflecting electrode and the first conductive film are insulated.

In such a manner, the deflecting electrode and the conductive film are insulated.

The space portion is wider than the gap portion.

In such a structure, since the gap portion is narrowed, electrons do not easily enter from the electron beam passing portion to the space portion and electrons that entered into the space portion do not easily return to the electron beam passing portion.

Electrons that cause charge-up can be captured in the space portion. In addition, the electron beam is not largely affected by electrons charged in the insulative area.

In addition, the space portion is curved.

In such a structure, when electrons that entered into the space portion collide with and bounce from the wall surface of the space portion, they do not easily return to the electron beam passing portion.

The first conductive film is disposed in an area that is visible when each of the plurality of space portions is viewed from the electron beam passing portion.

Thus, it is thought that many electrons that enter into the space portion through the gap portion reaches the area that is visible when the space portion is viewed from the electron beam passing portion. Thus, the first conductive film is formed at least in the area that is visible when the space portion is viewed from the electron beam passing portion. Thus, electrons can be securely discharged by the first conductive film.

In addition, a connection portion that connects the gap portion and the space portion is disposed.

In such a structure, since the connection portion is disposed between the gap portion and the space portion, the area of which the insulative area is exposed can be decreased. Such a structure can be easily manufactured, the manufacturing cost can be reduced. In addition, adjacent deflecting electrodes can be securely insulated.

The connection portion includes a first connection portion that is connected to the electron beam passing portion, and a second connection portion that is wider than the first connection portion and narrower than each of the plurality of space portions and that is connected to each of the plurality of space portions.

In such a structure, since a portion that is not coated with the conductive film can be decreased in the space portion, charge-up can be suppressed.

In addition, a second conductive film that electrically connects each of the deflecting electrodes and that is disposed in the connection portion insulated from the first conductive film is provided.

In such a structure, electrons do not easily enter from the electron beam passing portion to the space portion. In addition, electrons that entered into the space portion do not easily return to the electron beam passing portion. Moreover, the electron beam is not largely affected by electrons charged in the insulative area. In addition, since electrons that entered into the connection portion pass between two second conductive films, the potential therebetween prevents the electrons from entering into the space portion.

In addition, a connection conductive film that electrically connect the first conductive film disposed in each space portion is provided.

In such a structure, since a plurality of first conductive films can be collectively grounded, the structure of the static electricity deflecting device can be simplified.

In addition, the first conductive film is grounded.

In such a structure, electricity stored in the first conductive film can be quickly discharged.

In addition, an insulative area is disposed between the deflecting electrode and the first conductive film.

In such a structure, the deflecting electrode and the first conductive film can be insulated.

In addition, the deflecting electrode and the first conductive film are made of the same material.

In such a manner, the deflecting electrode and the first conductive film can be made of the same material.

In addition, the material of the cylindrical member is ceramic whose volume resistivity is $10^7$ to $10^{10}$ ohm·cm.

Thus, as the material of the cylindrical member, ceramic whose volume resistivity is $10^7$ to $10^{10}$ ohm·cm can be used.

In addition, the deflecting electrode is composed of a metal film.

Thus, as the deflecting electrode, a metal film can be used.

In addition, the metal film is a platinum group metal.

In such a manner, a platinum group metal can be used. Thus, when the front surface of the electrode is cleaned with active oxygen gas, the electrode is not insulated.

In addition, the platinum group metal is one of ruthenium, rhodium, palladium, osmium, iridium, and platinum.

Thus, as the platinum group metal, ruthenium, rhodium, palladium, osmium, iridium, and platinum can be used.

In addition, the deflecting electrode is made of a conductive oxide.

Thus, as the deflecting electrode, a conductive oxide can be used. When the electron beam irradiating apparatus that has the static electricity deflecting device is cleaned with a strong oxidizer, the apparatus is not easily oxidized.

In addition, the conductive oxide is one of ruthenium oxide, iridium oxide, and platinum oxide.

Thus, as the conductive oxide, ruthenium oxide, iridium oxide, or platinum oxide can be used.

In addition, a temperature adjustment mechanism that can set the static electricity deflecting device at a predetermined temperature is also provided.

In the electron beam irradiating apparatus having the static electricity deflecting device, when the deflecting electrode is heated by the temperature adjustment mechanism and the interior of the electron beam irradiating apparatus is cleaned with active oxygen gas, a contaminant that adheres to the front surface of the deflecting electrode can be effectively removed.

The electron beam irradiating apparatus according to the present invention is an electron beam irradiating apparatus that includes an electron gun that emits an electron beam and a static electricity deflecting device that controls the electron beam. The static electricity deflecting device includes a cylindrical member having an electron beam passing portion, a plurality of deflecting electrodes that are disposed on an inner wall surface of the cylindrical member along a cylindrical axis thereof and each of which is electrically divided, a plurality of space portions each of which is connected to a gap portion formed by adjacent two of the plurality of deflecting electrodes, each of the plurality of space portions being disposed at an outer position of the gap portion when each of the plurality of space portions is viewed from the electron beam passing portion, and a first conductive film formed in each of the plurality of space portions In the structure of the present invention, of electrons that passed through the electron beam passing portion, electrons that entered into a gap portion of adjacent deflecting electrodes enters into a space portion. The electrons are discharged by the first conduction film. Thus, occurrence of charge-up is suppressed. An electron beam emitted by the electron beam irradiating apparatus that has such a static electricity deflecting device is not unnecessarily deflected by charge-up. Thus, the electron beam can be deflected in a desired manner. An exposing device that has such an electron beam irradiating apparatus can perform an exposing process with high accuracy.

As described above, according to the present invention, occurrence of charge-up can be suppressed and exposure accuracy can be prevented from deteriorating.

These and other objects, features and advantages of the present invention will become more apparent in light of the following detailed description of a best mode embodiment thereof, as illustrated in the accompanying drawings.

DESCRIPTION OF PREFERRED EMBODIMENTS

Next, with reference to the accompanying drawings, embodiments of the present invention will be described.

Figure 1:
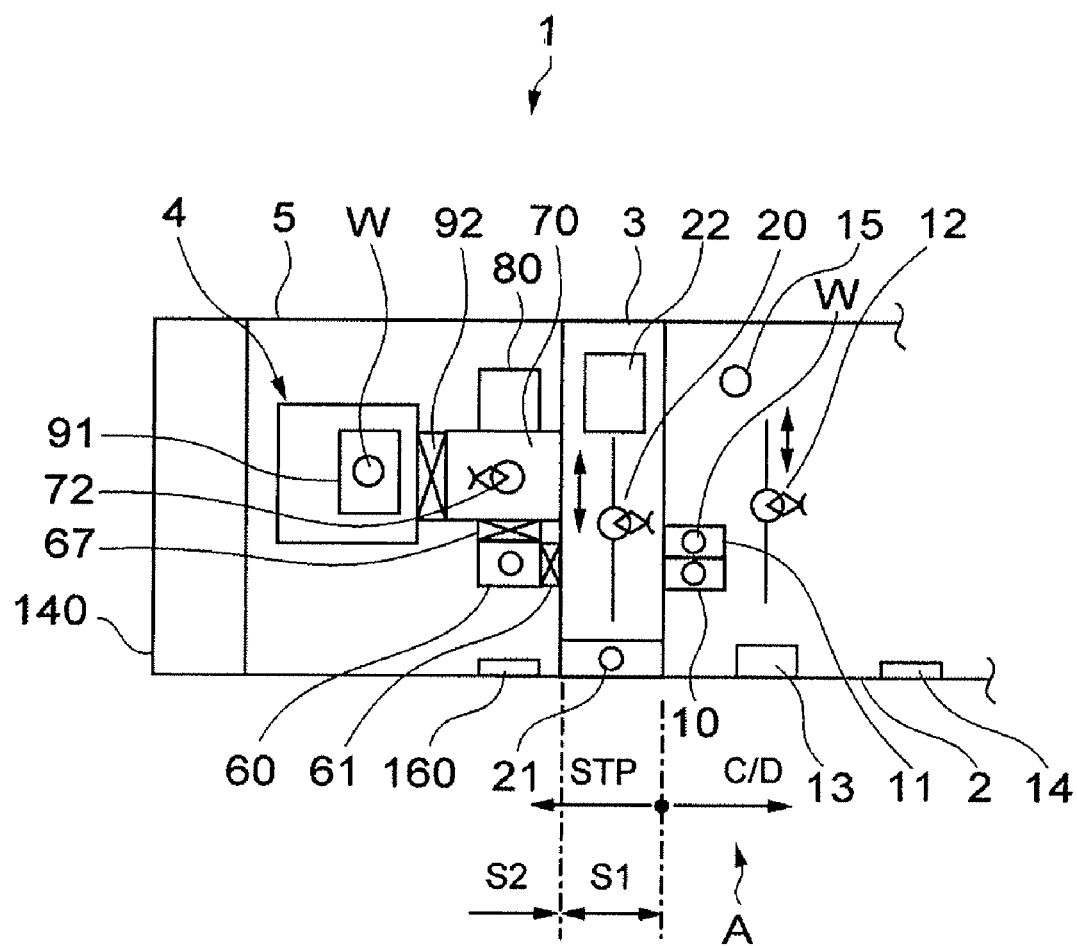
FIG. 1 is a plan view showing an outline of the structure of a substrate processing apparatus according to an embodiment of the present invention.

FIG. 1 is a schematic diagram showing the structure of a system of for example an exposing device as a substrate processing apparatus according to an embodiment of the present invention. The system of the exposing device designated as reference numeral 1 can be freely inline connected to another device, for example a resist processing device 2 (on a C/D side of FIG. 1). The resist processing device 2 has a coating device that coats resist solution on a process surface of a substrate under processing, for example a semiconductor wafer W (the coating device is referred to as a coater (COT)) and a developing device that develops a resist film formed on the process surface of the semiconductor wafer W (the developing device is referred to as a developer (DEV)). The exposing device 1 is composed of an atmospheric aligner section 3 (designated as S1 in FIG. 1) as a first unit (an interface section) having a linear space section and an exposure processing section 5 (designated as S2 in FIG. 1) as a second unit. The atmospheric aligner section 3 conveys a semiconductor wafer W in atmospheric pressure (non-reduced pressure). The exposure processing section 5 conveys a semiconductor wafer W in reduced pressure (non-atmospheric pressure) and performs an exposing process for the semiconductor wafer W.

Disposed on the resist processing device 2 side are a passing portion 10, a receiving portion 11, and a conveying mechanism 12. The passing portion 10 has a stage with an alignment mechanism (not shown) that physically holds and aligns a semiconductor wafer W to be passed to the exposing device 1. The receiving portion 11 has a stage with an alignment mechanism (not shown) that physically holds and aligns a semiconductor wafer W received from the exposing device 1. The conveying mechanism 12 is of a self propelled type and freely conveys a semiconductor wafer W to the passing portion 10 and the receiving portion 11.

Disposed on the resist processing device 2 side are also a cassette section 13 and an operation panel 14 that face an operator's working space area A. The cassette section 13 can hold at least one holding member for example a cassette that can contain a plurality of semiconductor wafers W that are loaded and unloaded by the conveying mechanism 12. The operation panel 14 is an operation mechanism with a display mechanism for a control mechanism that controls the resist processing device 2 side.

Disposed on the resist processing device 2 side is also an alignment mechanism 15 that faces the operator's working space area A side (non-working space area side). The alignment mechanism 15 aligns a semiconductor wafer W to be transferred to the passing portion 10 and/or a semiconductor wafer W received from the receiving portion 11 with reference to a cutout portion for example a notch portion or an orientation flag portion thereof. The conveying mechanism 12 can freely load and unload a semiconductor wafer W to and from the alignment mechanism 15.

Disposed in the atmospheric aligner section 3 (designated as S1 in FIG. 1) are a self-propelled conveying mechanism 20 and an alignment mechanism 21. The self-propelled conveying mechanism 20 can freely convey a semiconductor wafer W to the passing portion 10 and the receiving portion 11 disposed on the resist processing device 2 side. The alignment mechanism 21 is disposed on the working space area A side (on one end side in the longitudinal directions of the atmospheric aligner section 3). The alignment mechanism 21 aligns a semiconductor wafer W that has been received from the passing portion 10 on the resist processing device 2 side and/or a semiconductor wafer W to be transferred to the receiving portion 11 on the resist processing device 2 side with reference to a cutout portion, for example a notch portion or an orientation flat portion thereof. The self-propelled conveying mechanism 20 can freely load and unload a semiconductor wafer W to and from the alignment mechanism 21.

The alignment accuracy of the alignment mechanism 21 is important to improve the yield of semiconductor wafers W in the exposure process. Thus, the alignment mechanism 21 has higher alignment accuracy than does the alignment mechanism 15 on the resist processing device 2 side and/or the passing portion 10 or the receiving portion 11 on the resist processing device 2 side.

Figure 2:
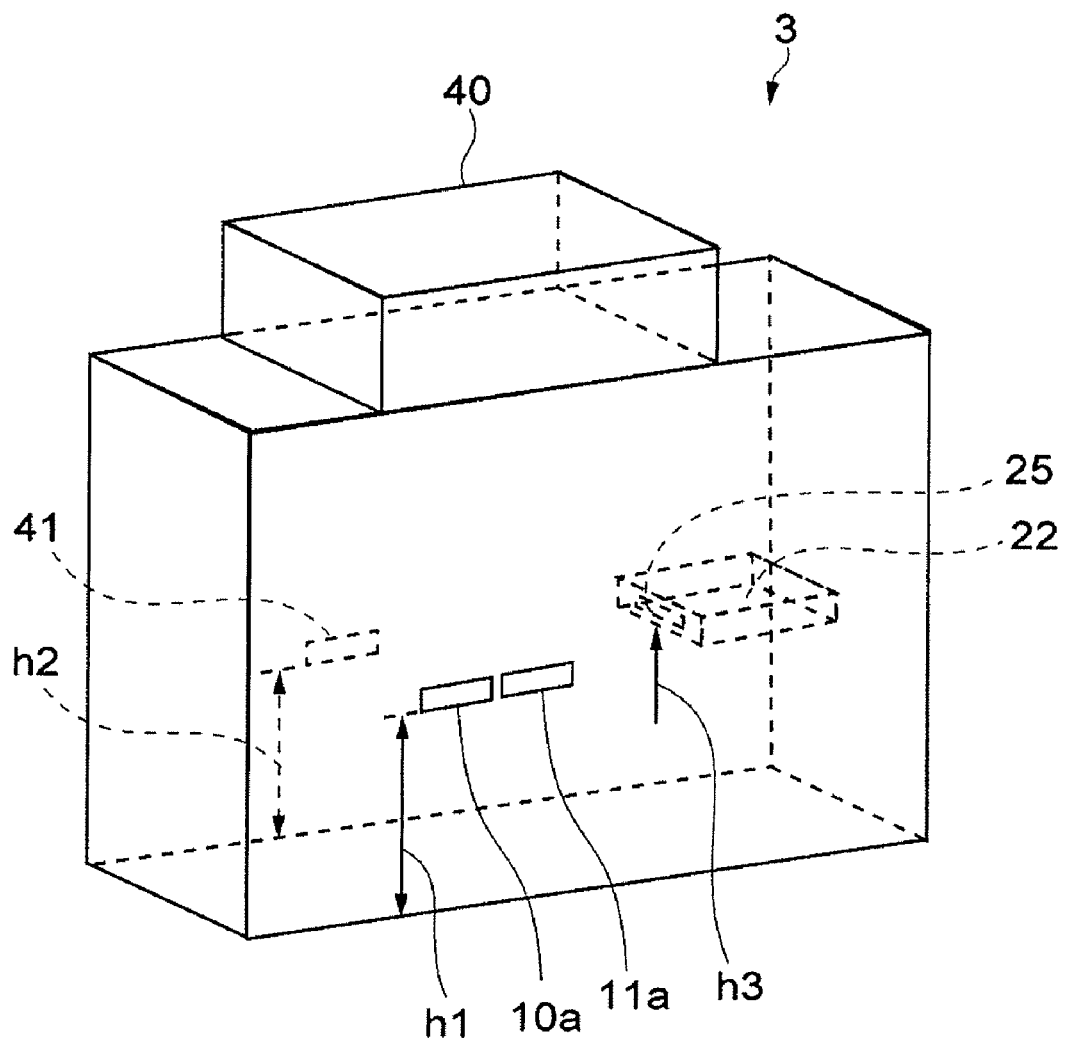
FIG. 2 is a perspective view describing an outline of the structure of an atmospheric aligner shown in FIG. 1.

Disposed in the atmospheric aligner section 3 (designated as S1 in FIG. 1) is also a heat processing section 22 that performs a Post Exposure Bake (PEB) process as a heat process for a semiconductor wafer W that has been exposed in the exposure processing section 5. The heat processing section 22 faces the working space area A side of the self-propelled conveying mechanism 20 (on the other end side in the longitudinal directions of the atmospheric aligner section 3) as shown in FIG. 2, FIG. 3, and FIG. 4.

The heat processing section 22 has a loading/unloading opening 25 through which a semiconductor wafer W is loaded and unloaded to and from the heat processing section 22. The heat processing section 22 contains a heating plate 26 as a heat process mechanism and a temperature adjustment plate 27 as a temperature adjustment mechanism. The heating plate 26 has a heating mechanism, for example a heater 31, that generates predetermined heat, for example in the range from 75° C. to 650° C., preferably for example in the range from 120° C. to 300° C., more preferably for example 250° C. for a semiconductor wafer W. The temperature adjustment plate 27 is a temperature adjustment mechanism that adjusts the temperature of a semiconductor wafer W to a predetermined temperature, for example 23° C. that is nearly the same as the inner temperature of the atmospheric aligner section 3 or the inner temperature of the resist processing device 2.

Of course, the temperature adjustment plate 27 adjusts the temperature of a semiconductor wafer W before and after it is conveyed to the heating plate 26. Instead, the temperature adjustment plate 27 may adjust the temperature of a semiconductor wafer W received from the passing portion 10 on the resist processing device 2 side by the self-propelled conveying mechanism 20 and/or a semiconductor wafer W to be conveyed to the receiving portion 11 of the resist processing device 2 by the self-propelled conveying mechanism 20 without conveying the semiconductor wafer W to the heating plate 26. The temperature adjustment plate 27 may adjust the temperature of a semiconductor wafer W before and/or after it is conveyed to the alignment mechanism 21.

Figure 3:
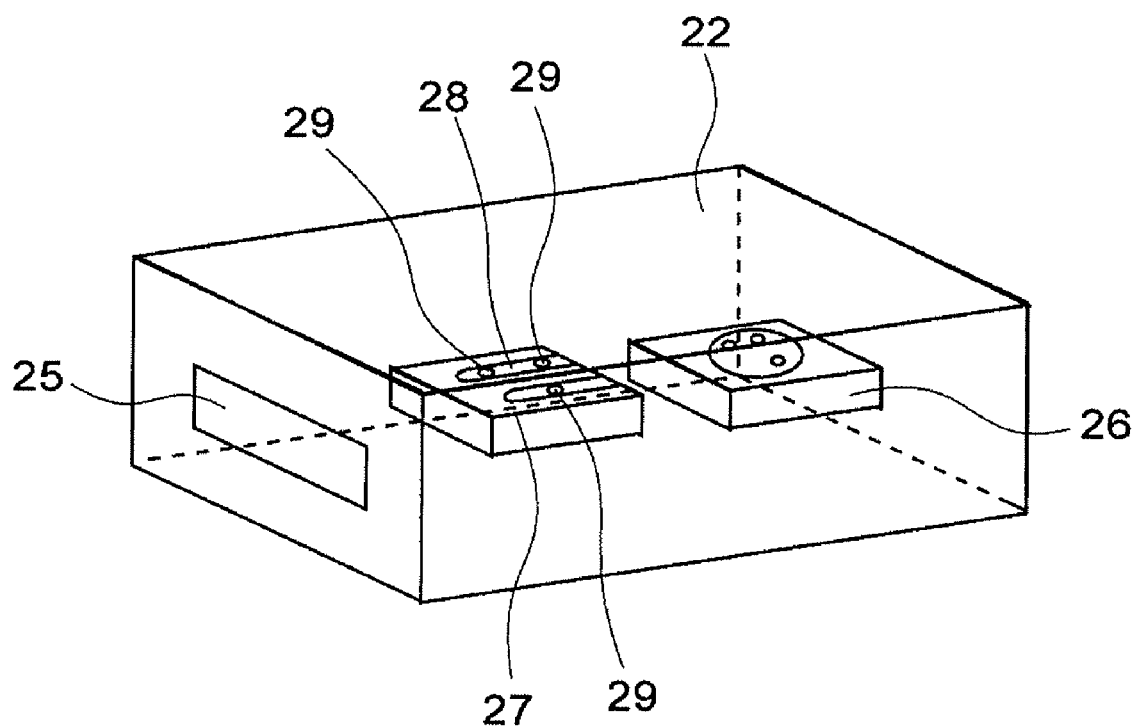
FIG. 3 is a perspective view describing an outline of the structure of a heat processing section shown in FIG. 2.
Figure 4:
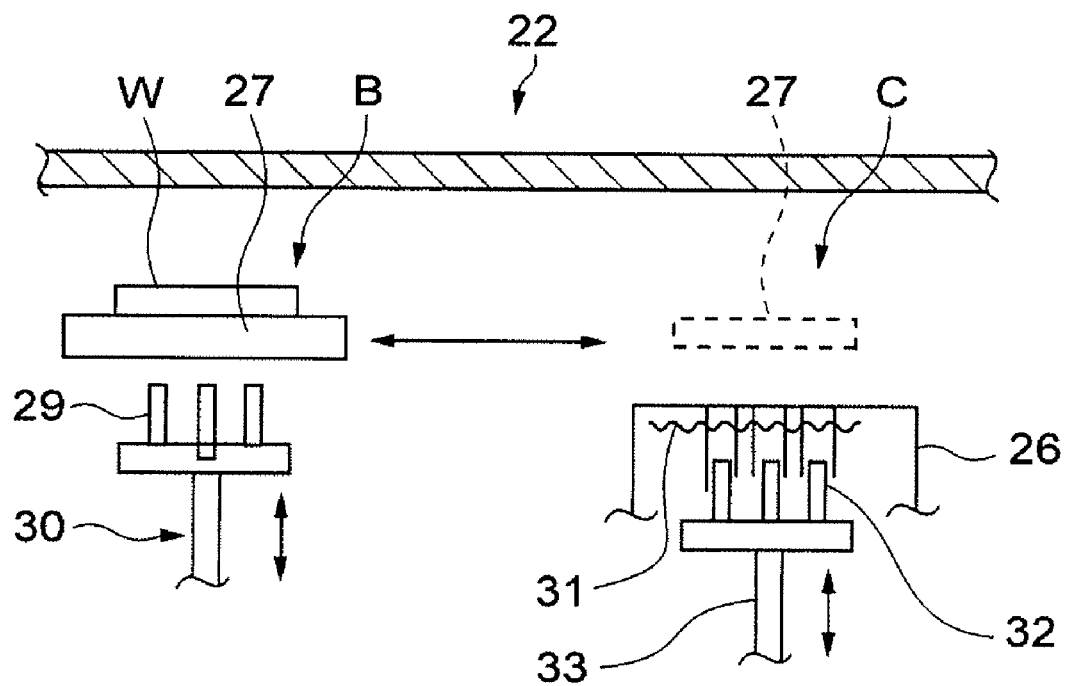
FIG. 4 is a sectional view describing an outline of the structure of the heat processing section shown in FIG. 2.

As shown in FIG. 3 and FIG. 4, the temperature adjustment plate 27 can be horizontally moved between a standby position B and an upper position B of the heating plate 26 by a moving mechanism (not shown). A support mechanism 30 is disposed below the temperature adjustment plate 27 and at the standby position B of the temperature adjustment plate 27. The support mechanism 30 has a plurality of support pins, for example three support pins, that protrude from cutout portions 28 of the temperature adjustment plate 27 and point-support the rear surface of the semiconductor wafer W.

In addition, the heating plate 26 has a support mechanism 33 with a plurality of support pins, for example three support pins, that raise and lower and point-support the rear surface of a semiconductor wafer W. Thus, a semiconductor wafer W conveyed by the self-propelled conveying mechanism 20 through the loading/unloading opening 25 is received at the up position of the support mechanism 30. The semiconductor wafer W is supported by the support pins 29. Thereafter, when the support mechanism 30 is lowered, the semiconductor wafer W on the support points 29 is transferred to the temperature adjustment plate 27.

After the temperature adjustment plate 27 is raised to the up position of the heat processing section 22, the support mechanism 33 is raised. The semiconductor wafer W on the temperature adjustment plate 27 is supported on the support pins 32. When or after the temperature adjustment plate 27 is moved to the standby position, the support mechanism 33 is lowered and the semiconductor wafer W is transferred to the heating plate 26.

As shown in FIG. 2, a fan filter unit (FFU) 40 is disposed above the atmospheric aligner section 3 (designated as S1 in FIG. 1). The FFU 40 generates a down-flow of clean air in the atmospheric aligner section 3. The temperature, the humidity, and/or concentration of a chemical compound, for example amine, of the clean air are controlled. The concentration of amine is controlled to a predetermined value for example 1 ppb or less by a filter mechanism (not shown). In addition, the inner pressure of the atmospheric aligner section 3 is controlled to a predetermined value.

Next, a conceptual example of suppressing occurrence of cross contamination in the atmospheric aligner section 3 (designated as S1 in FIG. 1) will be described. Now, the height of each of a loading opening 10a for a semiconductor wafer W from the passing portion 10 on the resist processing device 2 side and a unloading opening 11a for a semiconductor wafer W to the receiving portion 11 on the resist processing device 2 side is designated as h1. The height of a loading/unloading opening 41 for a semiconductor wafer W on the exposure processing section 5 side is designated as h2. The height of a loading/unloading opening 25 for a semiconductor wafer W loaded and unloaded to and from the heat processing section 22 is designated as h3. Since the exposure processing section 5 is operated in reduced pressure and the air cleanness class required in the exposure process is higher than that for the environment in the resist processing device 2, the condition of h2≧h1 is kept, preferably h2>h1. In addition, from a point of view of suppressing the influence of heat from the loading/unloading opening 25 of the heat processing section 22, the condition of h3≧(h1 or h2) is kept, preferably h3>(h1 or h2).

When the height of the loading opening 10a and/or the unloading opening 11a and the height of the loading/unloading opening 41 are nearly the same, it is preferred that they not just face each other, but with a slight deviation.

Figure 5:
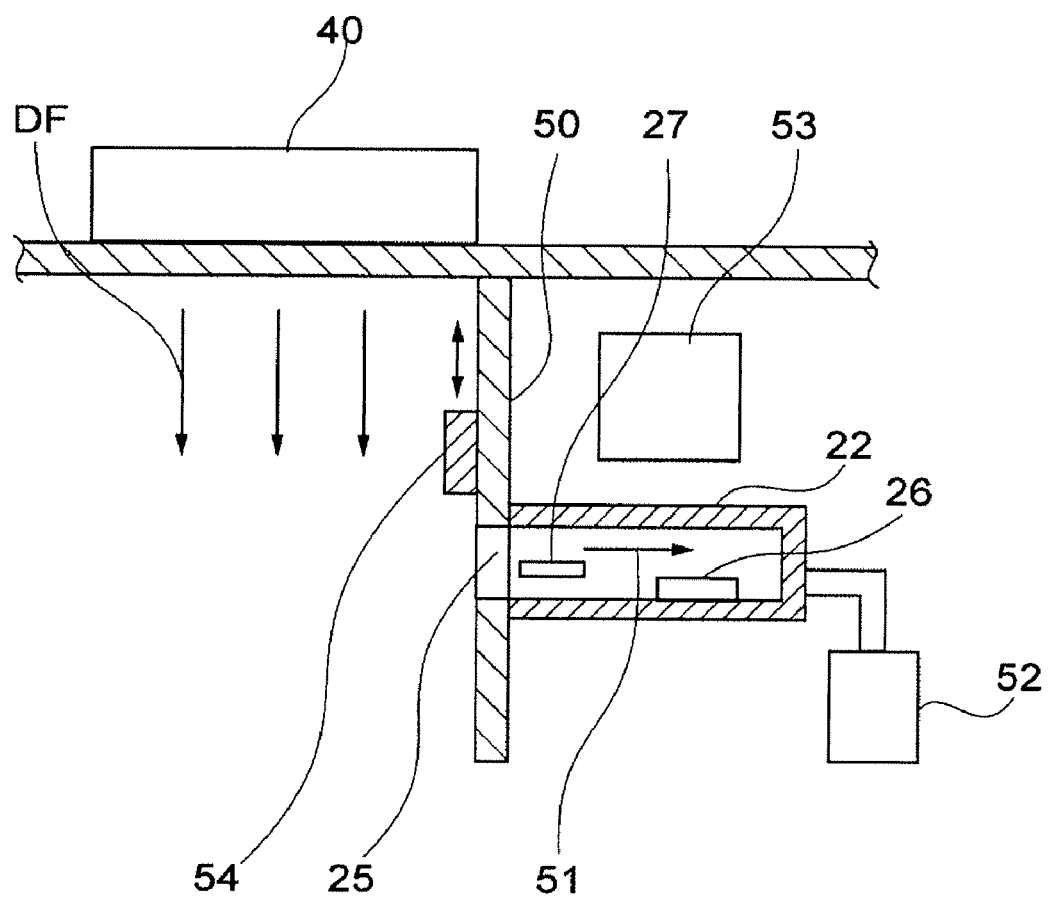
FIG. 5 is a sectional view describing an outline of the structure of the atmospheric aligner shown in FIG. 2.

Next, another conceptual example of suppression of influence of heat from the loading/unloading opening 25 of the heat processing section 22 will be described with reference to FIG. 5. A wall 50 is disposed above and below the loading/unloading opening 25 through which a semiconductor wafer W is loaded to and from the heat processing section 22. The wall 50 shields inner atmosphere of the heat processing section 22 from inner atmosphere of the self-propelled conveying mechanism 20. A venting mechanism, for example a vacuum pump 52, generates an air flow 51 in the heat processing section 22 so that the air flow 51 occurs from the temperature adjustment plate 27 side to the heating plate 26 side.

With an opening and closing mechanism 54 that can open and close an opening portion of the loading/unloading opening 25, radiation of heat can be suppressed. With this structure, an area for a down-flow DF in the atmospheric aligner section 3 can be decreased. As a result, the FFU 40 can be downsized. As the merits, the system can be downsized and the foot print and cost of the apparatus can be decreased. When a control mechanism 53 (and/or a heat generation mechanism such as a power supply mechanism) of the heat processing section 22 is disposed above the heat processing section 22, the influence of heat to a semiconductor wafer W in the atmospheric aligner section 3 can be suppressed.

Figure 6:
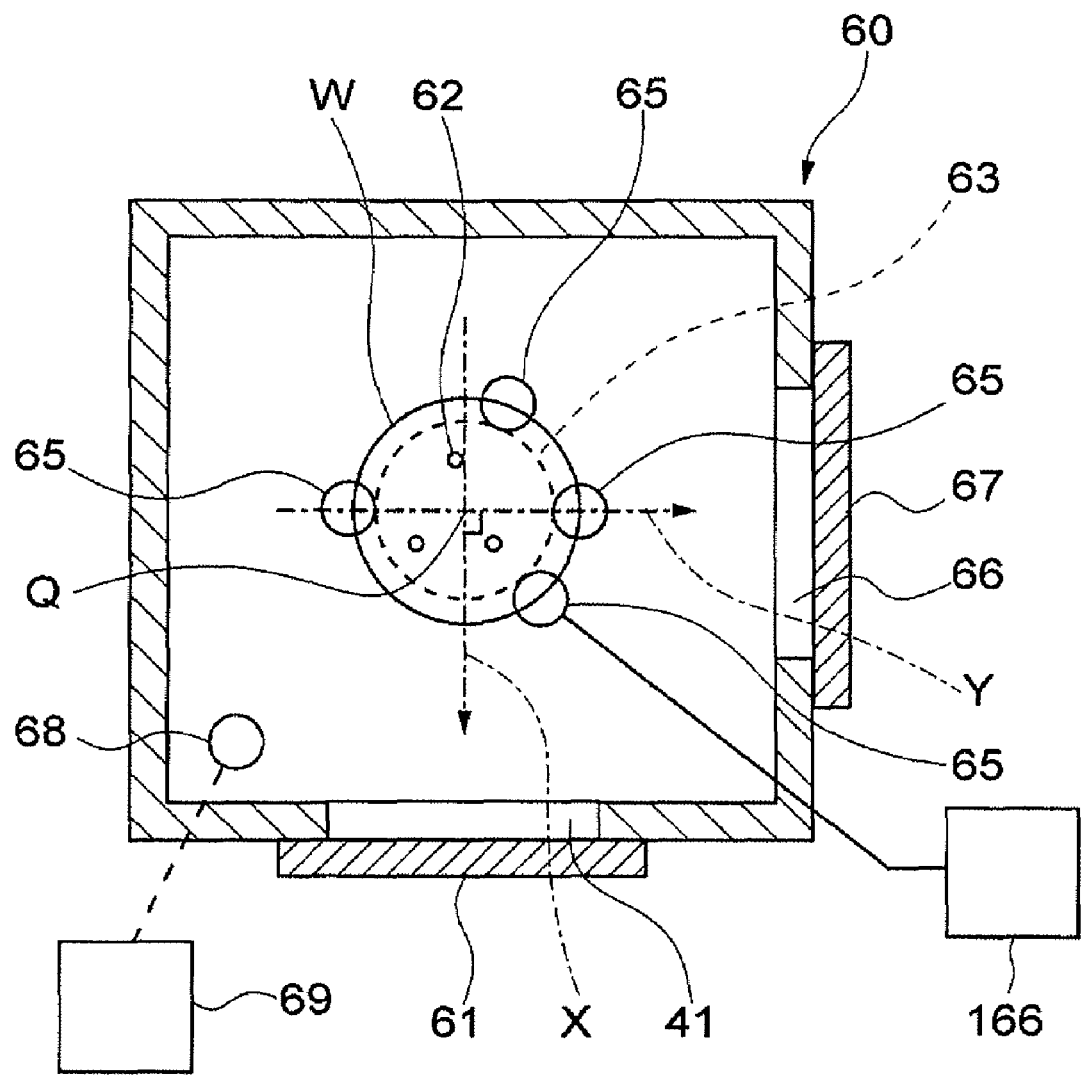
FIG. 6 is a plan view describing an outline of the structure of a vacuum preparation chamber shown in FIG. 1.

As shown in FIG. 6, a vacuum preparation chamber 60 is disposed in the exposure processing section 5. The vacuum preparation chamber 60 is a substrate loading and unloading section through which a semiconductor wafer W is loaded and unloaded by the self-propelled conveying mechanism 20 through the loading/unloading opening 41. Disposed at the loading/unloading opening 41 of the vacuum preparation chamber 60 is an opening and closing mechanism 61 that air-tightly seals the interior of the vacuum preparation chamber 60. The vacuum preparation chamber 60 has a holding table 63 with a support mechanism (not shown). The support mechanism has a plurality of support pins 62 for example three support pins 62 that point-support the bottom surface of a semiconductor wafer W that can be freely transferred by the self-propelled conveying mechanism 20.

In addition, the holding table 63 has a temperature adjustment mechanism (not shown). The temperature adjustment mechanism adjusts the temperature of the holding table 63 to a temperature lower than the temperatures of sections of the resist processing device 2, for example the temperature of a semiconductor wafer W processed by the coating device (coater COT) that coats resist solution on the semiconductor wafer W, the ambient temperature in the resist processing device 2, and/or the ambient temperature in the atmospheric aligner section 3, for example in the range from a fraction of 1° C. to 3° C. preferably in the range from 0.1° C. to 0.5° C. As a result, the accuracy of the exposure process can be prevented from deteriorating since a resist film formed on a semiconductor wafer W can be prevented from shrinking and expanding.

In addition, at least one image detection mechanism is disposed at an upper position of a semiconductor wafer W held on the holding table 63. For example, a plurality of CCD cameras 65 are disposed so that an image of at least a peripheral portion of a semiconductor wafer W can be freely detected. These CCD cameras 65 are disposed to detect at least an arrangement angle θ of a semiconductor wafer W. The CCD cameras 65 are disposed in such a manner that at least one CCD camera 65, preferably two CCD cameras 65, are disposed on the Y axis perpendicular to the conveying directions of a semiconductor wafer W by the self-propelled conveying mechanism 20, namely on the X axis and at least one CCD camera 65 is disposed with an angle on the Y axis. Thus, based on the arrangement angle θ and reference coordinates pre-registered on the X and Y axes, namely registered data and detected data are compared. The difference is calculated and detected by a control mechanism 166. In FIG. 6, Q denotes the center position of a semiconductor wafer W.

In addition, a conveying opening 66 is disposed in the directions on the Y axis of the vacuum preparation chamber 60. A semiconductor wafer W is conveyed to a reduced pressure conveying chamber (that will be described later) through the conveying opening 66. An opening and closing mechanism 67 that can air-tightly close the conveying opening 66 is disposed in the conveying opening 66. The vacuum preparation chamber 60 has an air venting nozzle 68 through which a venting mechanism, for example an exhaust pump 69, vents the vacuum preparation chamber 60. Thus, the supply amount of a predetermined gas, for example inert gas such as nitrogen gas, supplied from a gas supplying mechanism (not shown) and the amount of gas vented of the exhaust pump 69 can be freely set between a predetermined degree of vacuum and atmospheric pressure under the control of the control mechanism 166.

Figure 7:
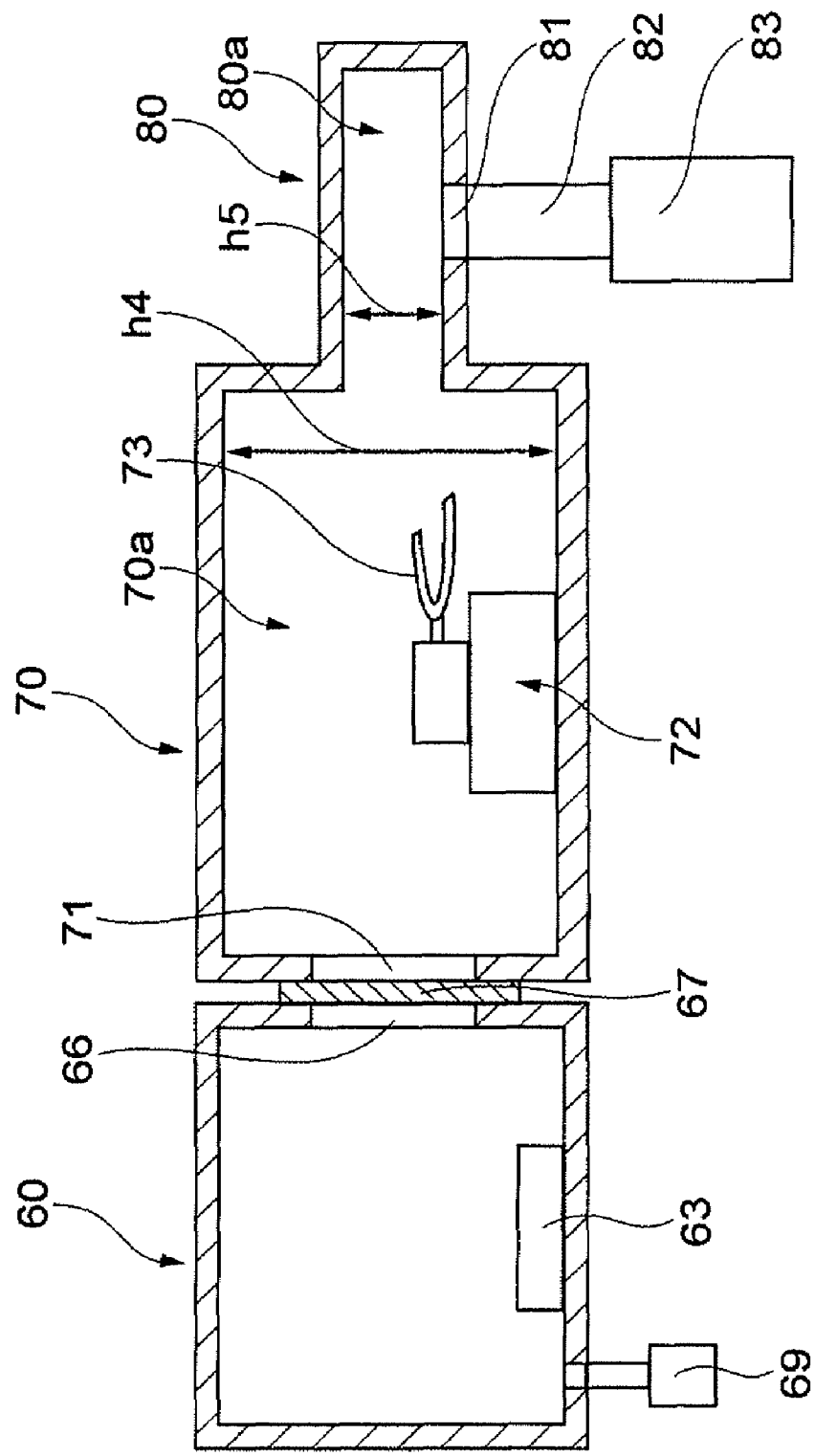
FIG. 7 is a sectional view describing an outline of the structure of a reduced pressure transferring chamber shown in FIG. 1.

Next, with reference to FIG. 1 and FIG. 7, the reduced pressure conveying chamber 70 will be described. Disposed in the reduced pressure conveying chamber 70 is a conveying mechanism 72 that conveys a semiconductor wafer W to the vacuum preparation chamber 60 through a conveying opening 71. The conveying mechanism 72 has an arm 73 that is a support mechanism having a surface contact function of at least one position of the peripheral portion of a semiconductor wafer W and/or a point contact function of a plurality of points on the rear surface of the semiconductor wafer W.

Disposed in the reduced pressure conveying chamber 70 is an gas venting chamber 80 opposite to the vacuum preparation chamber 60 of the reduced pressure conveying chamber 70. The gas venting chamber 80 is connected to the atmosphere of the reduced pressure conveying chamber 70. An air venting nozzle 81 is disposed below the gas venting chamber 80. A venting mechanism, for example a vacuum pump 83, vents not only the gas venting chamber 80 but the reduced pressure conveying chamber 70 from the air venting nozzle 81 through an air venting path 82.

Thus, venting means is not directly connected to the reduced pressure conveying chamber 70. Since the conveying mechanism 72 is disposed in the reduced pressure conveying chamber 70 and the venting mechanism is connected thereto, a problem of which the reduced pressure conveying chamber 70 becomes large is solved. Thus, the apparatus can be downsized and slimmed. In addition, even if the vacuum pump 83 and so forth get defective or the air venting path 82 is maintained, when the gas venting chamber 80 is removably structured, the maintenance time can be short. With respect to the relationship of a volume 70a of the reduced pressure conveying chamber 70 and a volume 80a of the gas venting chamber 80, the condition of volume 70a≧volume 80a is kept, more preferably volume 70a>volume 80a. Thus, the throughput of which the reduced pressure conveying chamber 70 is maintained in a predetermined degree of vacuum is improved. In addition, the height h4 of the space section of the reduced pressure conveying chamber 70 is greater than the height h5 of the space section of the gas venting chamber 80. As a result, the gas venting chamber 80 can be vented at high venting speed.

Figure 8:
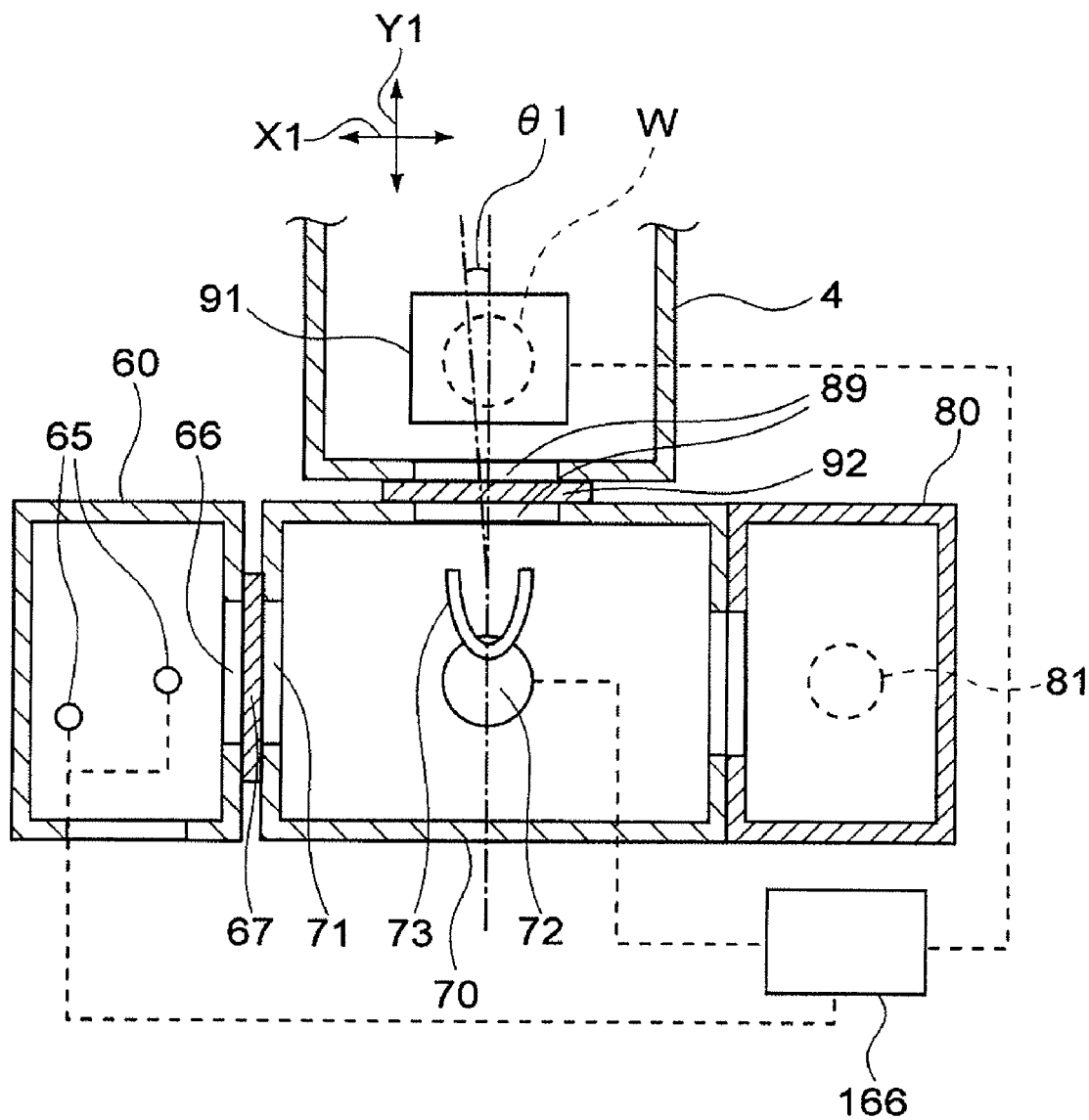
FIG. 8 is a plan view describing an outline of the structure of an exposure processing section shown in FIG. 1.

In addition, as shown in FIG. 8, the conveying mechanism 72 of the reduced pressure conveying chamber 70 is controlled by the control mechanism 166. When there is an error as a result of a calculation based on data captured by the CCD cameras 65, a conveying angle 01 of the arm 73 for a semiconductor wafer W held by the arm 73 to an exposure processing chamber 4 is varied and compensated (the position is adjusted by a rotation operation of the arm 73) based on information of the error. The semiconductor wafer W held by the arm 73 is conveyed through a loading opening 89 to a stage 91 of the exposure processing chamber 4 in which reduced pressure is maintained. In other words, the semiconductor wafer W is aligned and compensated on the stage 91. The loading opening 89 of the reduced pressure conveying chamber 70 and the loading opening 89 of the exposure processing chamber 4 can be air-tightly opened and closed.

In addition, the stage 91 in the exposure processing chamber 4 can freely move a semiconductor wafer W in directions on the X1 axis (left and right directions shown in FIG. 8) and directions on the Y1 axis (upper and lower directions shown in FIG. 8). When there is an error as a result of a calculation based on data captured by the CCD cameras 65, the control mechanism 166 horizontally aligns the semiconductor wafer W held on the stage 91 with respect to the X and Y axes based on the information about the error. When the semiconductor wafer W is conveyed by varying the conveying angle θ1 of the arm 73 to the exposure processing chamber 4, the stage 91 of the exposure processing chamber 4 is moved based on data of which the transfer position of the semiconductor wafer W by the arm 73 is predicted by the control mechanism 166.

Figure 9:
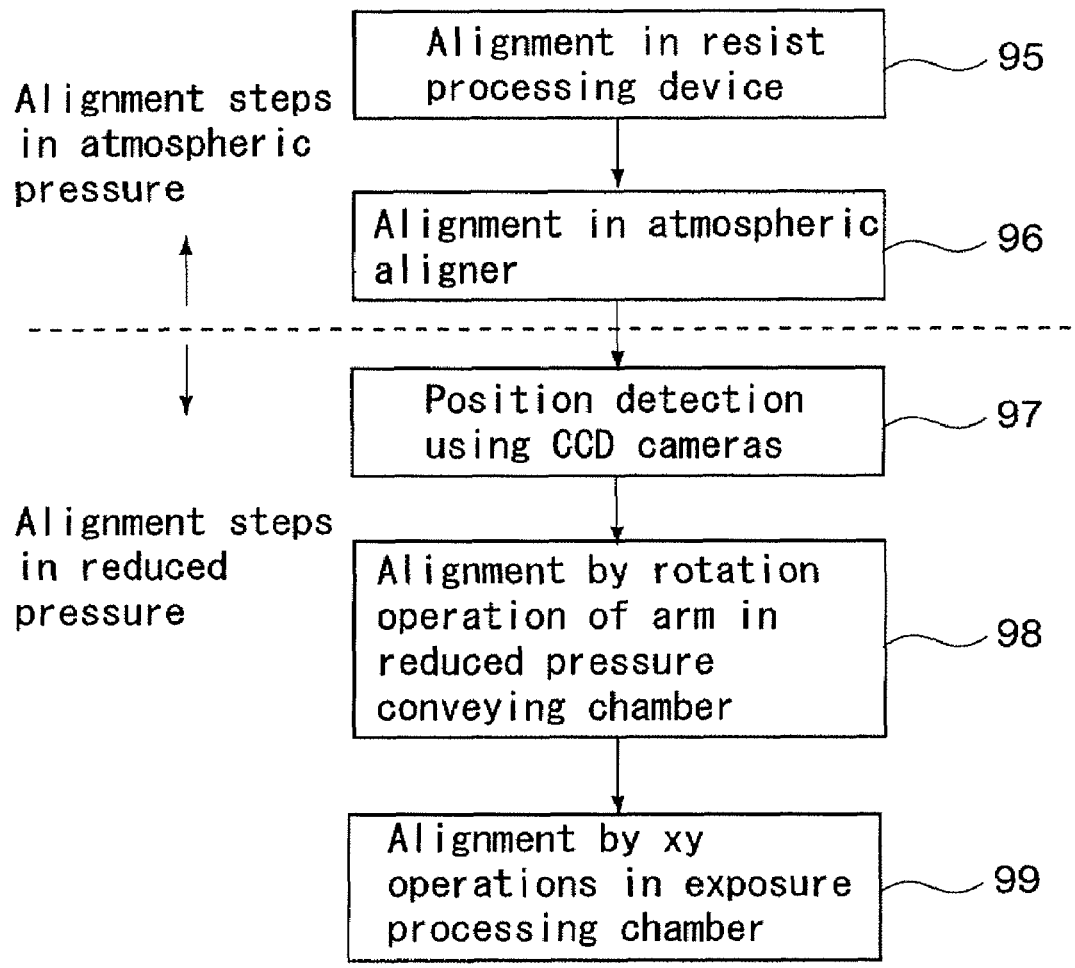
FIG. 9 is a flow chart describing a process flow with respect to the structure of the substrate processing apparatus shown in FIG. 1.

Thus, the semiconductor wafer W is aligned at steps shown in FIG. 9. At step 95, the semiconductor wafer W is aligned on the resist processing device 2 side as another device. At step 96, the semiconductor wafer W is aligned in the atmospheric aligner section 3. At these steps, the semiconductor wafer W is aligned in atmospheric pressure. Thereafter, at step 97, the position of the semiconductor wafer W is detected by the CCD cameras 65 of the vacuum preparation chamber 60 in reduced pressure. At step 98, while the rotation angle of the arm 73 of the reduced pressure conveying chamber 70 is being adjusted based on position data detected by the CCD cameras 65, the semiconductor wafer W held by the arm 73 is aligned in reduced pressure. Thereafter, at step 99, while the stage 91 of the exposure processing chamber 4 as another reduced pressure chamber is being moved on the X and Y axes, the semiconductor wafer W on the stage 91 is aligned in reduced pressure. The semiconductor wafer W is aligned at a plurality of positions in atmospheric pressure. Thereafter, the position of the semiconductor wafer W is detected in reduced pressure. In addition, the semiconductor wafer W is aligned at a plurality of positions in reduced pressure. Thus, the accuracy with which the semiconductor wafer W is aligned is improved.

Figure 10:
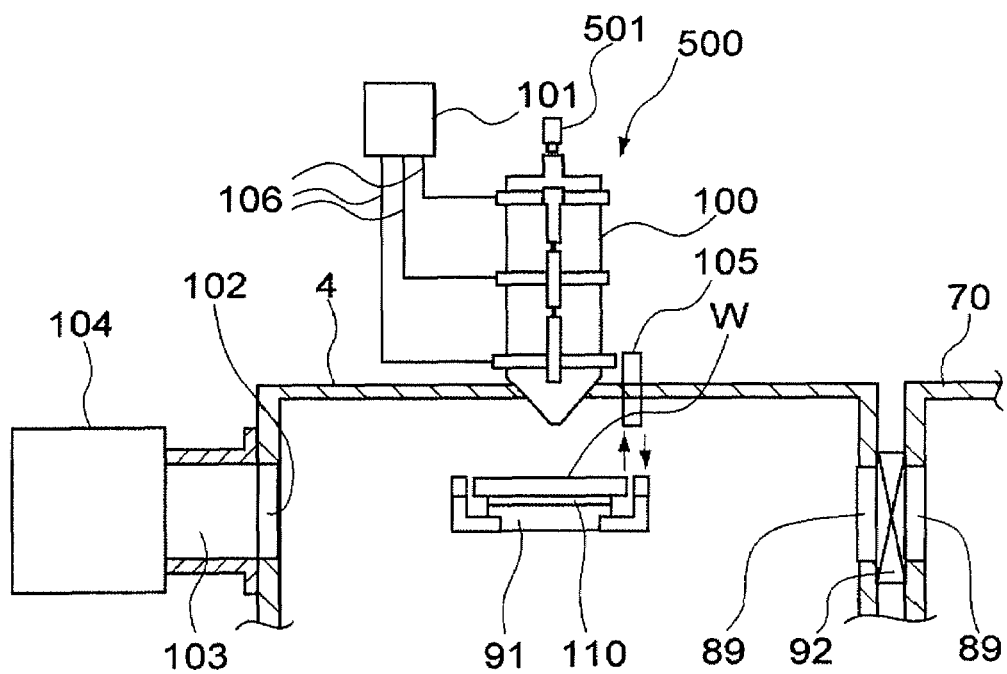
FIG. 10 is a schematic sectional view describing the structure of the exposure processing chamber shown in FIG. 1.

As shown in FIG. 10, the exposure processing chamber 4 has an electron beam irradiating apparatus 500 at a ceiling portion. The electron beam irradiating apparatus 500 irradiates a semiconductor wafer W on the stage 91 with an electron beam. The electron beam irradiating apparatus 500 has an electron gun 501 and a column 100. As will be described later, the column 100 is divided into a GL block 560, a CL block 561, a PL block 562, and a RL/OL block 563. The column 100 also has a venting mechanism, for example an ion pump 101, that highly vacuum-vents the electron gun section.

Figure 11:
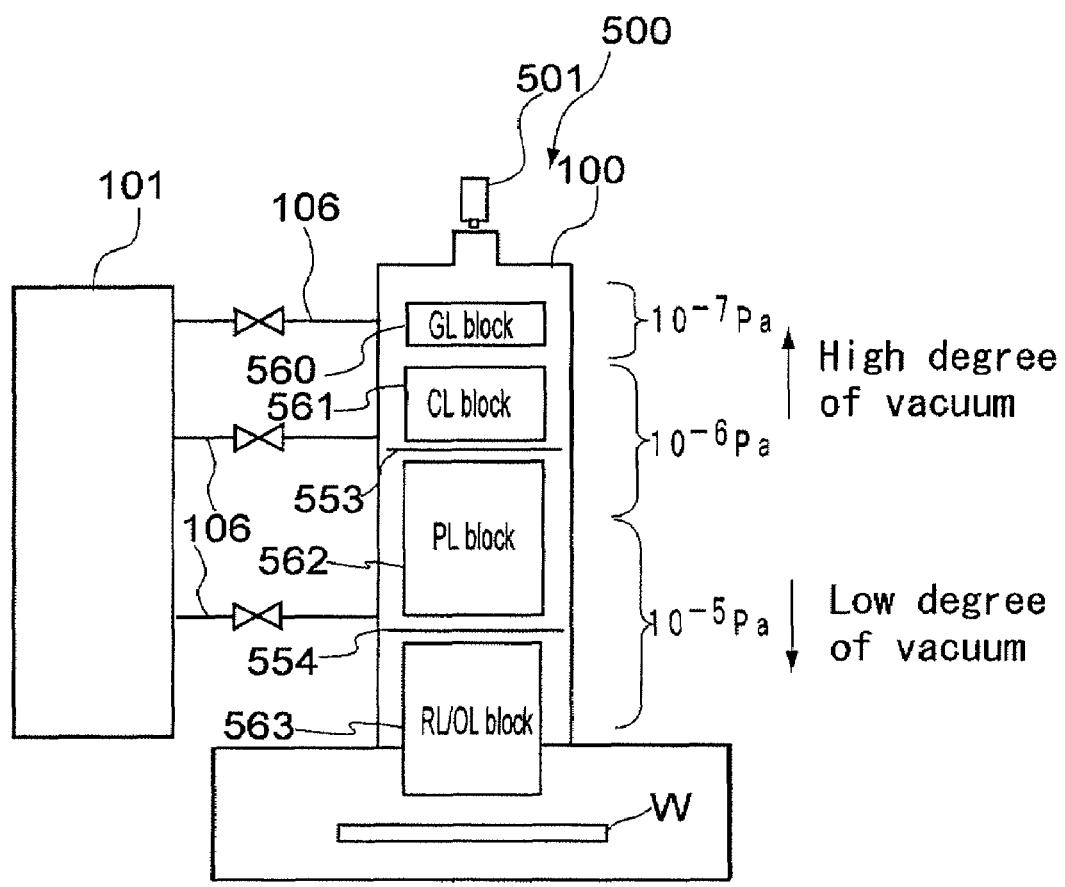
FIG. 11 is a sectional view describing an outline of the structure of principal portions of the exposure processing chamber shown in FIG. 10.

As shown in FIG. 11, a plurality of air vent lines 106 are disposed in the vertical direction of the column 100. According to this embodiment, the air vent lines 106 gradually decrease degrees of vacuum downwardly from the electron gun 501 to the semiconductor wafer W, for example, $10^{-7}$ Pa, $10^{-6}$ Pa, and $10^{-5}$ Pa. The degree of vacuum in an area of which a semiconductor wafer W is irradiated with an electron beam is set at $10^{-5}$ Pa.

In this embodiment, the air vent lines 106 are disposed in areas having different degrees of vacuum. The vent amounts of the air vent lines 106 are varied such that the degrees of vacuum of the areas vary. Since the degrees of vacuum decrease downwardly, straightness of the electron beam can be improved or energy can be prevented from lowering. In this embodiment, the air vent lines 106 are disposed in the areas that differ in degrees of vacuum and the vent amounts of the air vent lines 106 are varied. Instead, a plurality of air vent lines 106 having the same vent amount may be used such that the degrees of vacuum are varied by changing the number of air vent lines 106. In this case, the densities of the air vent lines decrease downwardly. In other words, the air vent lines 106 are disposed such that the amounts of vent substantially decrease downwardly in the column 100.

In addition, as shown in FIG. 10, the exposure processing chamber 4 has an air venting duct 102 in a side wall opposite to the reduced pressure conveying chamber 70 of the stage 91. A venting mechanism, for example, a high vacuum pump (turbo molecular pump) 104 that vents the inside of the exposure processing chamber 4 through an air vent line 103 is disposed. Disposed at a ceiling section of the exposure processing chamber 4 is also a mark detection mechanism 105 that optically detects a mark formed on the process surface of a semiconductor wafer W held on the stage 91. When necessary, the semiconductor wafer W is finally aligned by moving the stage 91 on the X and Y axes based on the detected mark.

Figure 12:
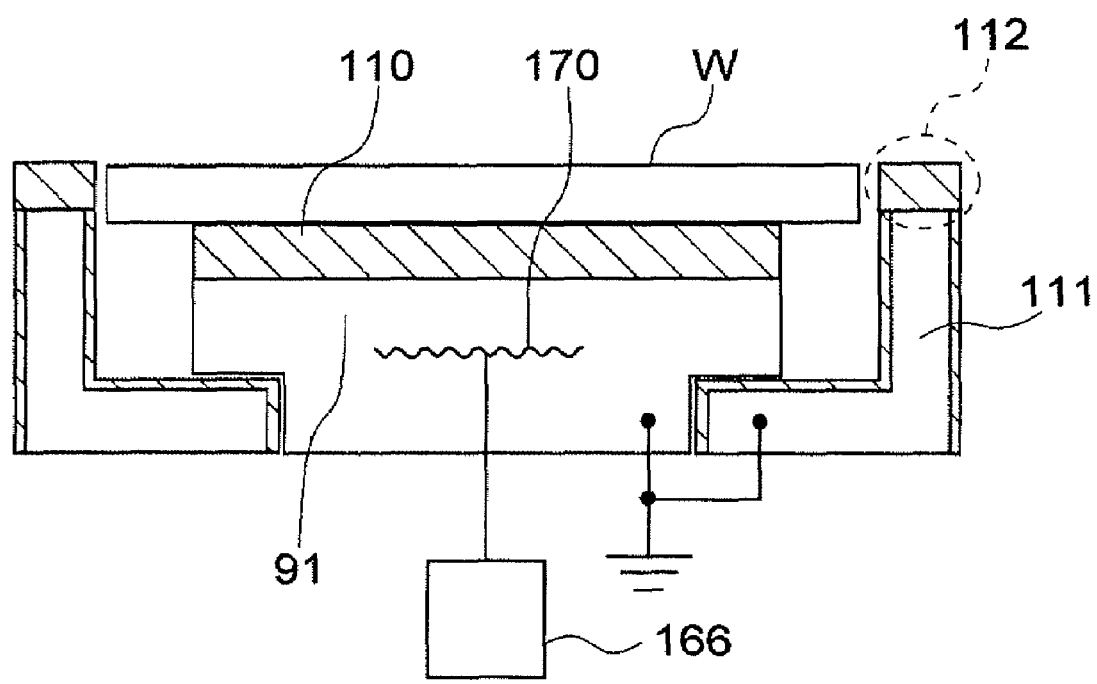
FIG. 12 is a sectional view describing an outline of the structure of principal portions of the exposure processing chamber shown in FIG. 10.
Figure 13:
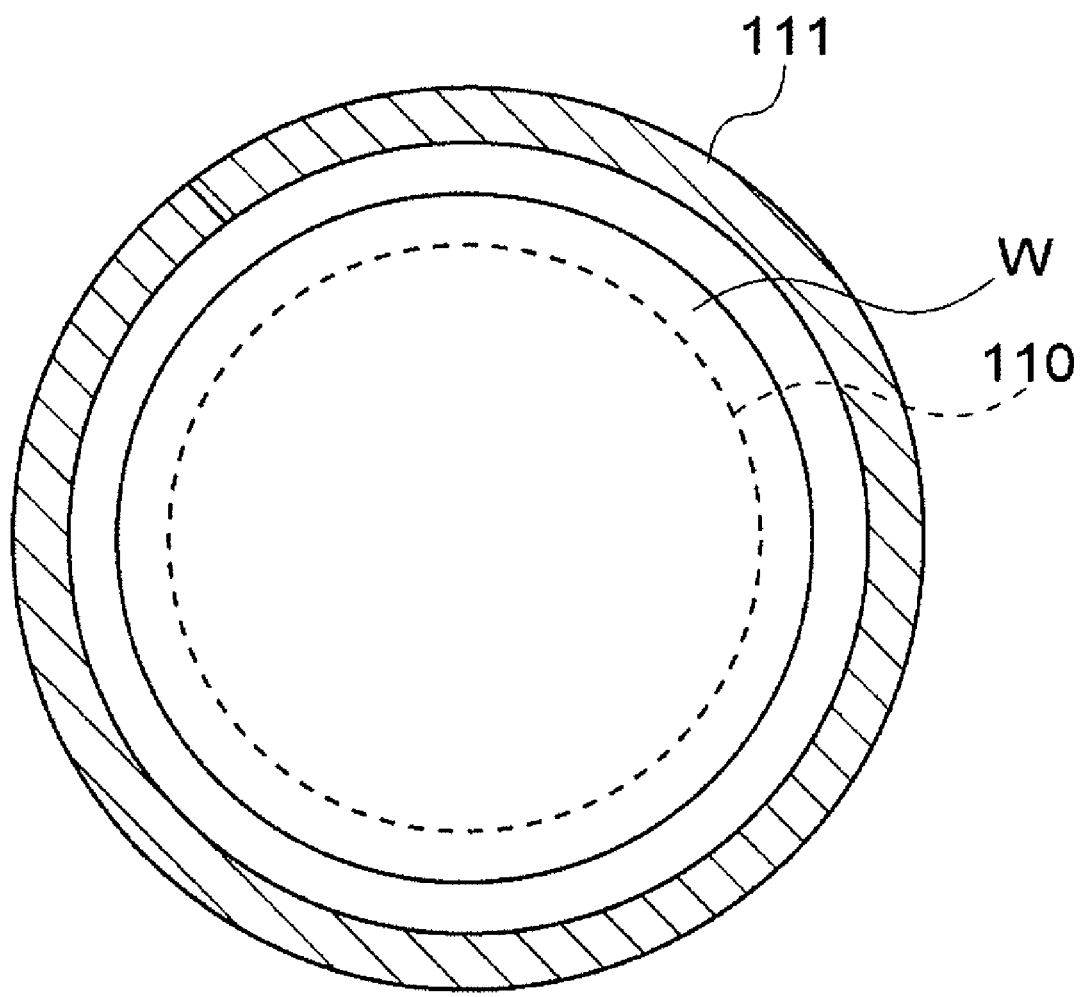
FIG. 13 is a plan view describing an outline of the structure of principal portions of a stage shown in FIG. 12.

In addition, as shown in FIG. 12 and FIG. 13, the stage 91 has a static electricity chuck mechanism 110 that electrostatically sucks a semiconductor wafer W. In addition, the stage 91 is made of for example alumina, which is an insulative material. The stage 91 is conductively coated. It is preferred the stage 91 be made of a material that is light, strong, and non-elastic to reduce the weight of the moving portion, increase the characteristic frequency, and reduce the thermal expansion. In addition, it is preferred that the stage 91 be conductively coated with a thin film. In other words, when the front surface of the stage 91 is charged with electrons, they adversely affect a path of an electron beam. Thus, it is preferred that the entire surface exposed to an electron beam be conductive such that electrons flow to the ground. In addition, when the thickness of the conductive member is thick, an eddy current occurs, resulting in adversely affecting the electron beam.

In addition, a ring-shaped member 111 is disposed around the stage 91. The ring-shaped member 111 is made of an insulative material, for example alumina. The front surface of the ring-shaped member 111 is coated with a conductive film. The outer circumferential portion of the ring-shaped member 111 has a flat portion 112 whose height is the same as the height of the process surface of a semiconductor wafer W sucked and held by the static electricity chuck mechanism 110 of the stage 91. In addition, the flat portion 112 is level with the semiconductor wafer W. The front surface of the ring-shaped member 111 is coated with an electron beam refraction protection film as an eddy current protection mechanism that suppresses the refraction of an electron beam emitted from a column 100, namely occurrence of an eddy current. The film is made of for example titan such as a TiN film. In addition, the ring-shaped member 111 and the stage 91 are grounded as shown in FIG. 12.

In addition, the stage 91 has a heating mechanism, for example a heater 170. The control mechanism 166 can freely adjust the temperature of the semiconductor wafer W on the stage 91 to a predetermined temperature along with a cooling mechanism (not shown). The predetermined temperature is lower than the temperature of a semiconductor wafer W in a process section of the resist processing device 2, for example, the coating device (coater (COT)), that coats resist solution on the semiconductor wafer W, the inner temperature of the resist processing device 2, and/or the inner temperature of the atmospheric aligner section 3. The predetermined temperature is for example a low temperature in the range from a fraction of 1° C. to 3° C., preferably in the range from 0.1° C. to 0.5° C.

In other words, the accuracy of the exposure process can be prevented from deteriorating against expansion or shrinkage of the resist film formed on the semiconductor wafer W. For example, when a load lock (for example, the vacuum preparation chamber 60) is vacuum-vented, since heat is removed from the semiconductor wafer W, the temperature of the semiconductor wafer W that has been just conveyed to the stage 91 tends to be lower than the temperature of the semiconductor wafer W in for example the atmospheric aligner section 3 before the semiconductor wafer W is conveyed to the load lock. Thus, when the temperature of the stage 91 is lowered for which the temperature of the semiconductor wafer W is lowered by vacuum venting, it is not necessary to wait until the temperature of the semiconductor wafer W conveyed to the stage becomes stable (namely, expansion of the semiconductor wafer W stops).

Figure 14:
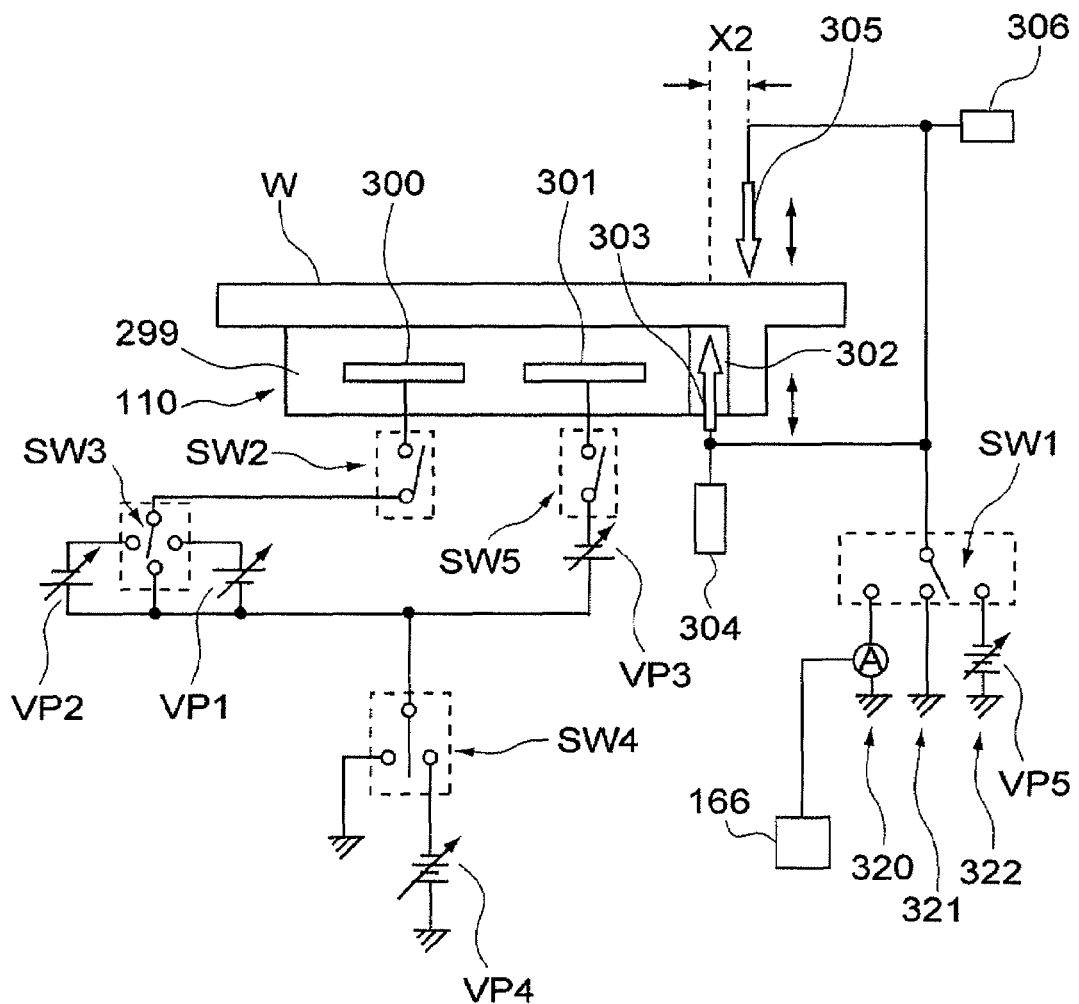
FIG. 14 is a schematic diagram describing the structure of a static electricity chuck mechanism section of the exposure processing chamber shown in FIG. 10.

In addition, as shown in FIG. 14, the static electricity chuck mechanism 110 has a plurality of electrodes, for example two electrodes, that are a first electrode 300 and a second electrode 301 buried in an insulative member 299 made of an insulator such as ceramics. A conductive needle 303 that is a conductive mechanism (grounding mechanism) is disposed outside the second electrode 301. The conductive needle 303 can be freely moved in a through-hole 302 formed in the insulative member 299 and contacted to a predetermined position on the rear surface of the semiconductor wafer W. In addition, a raising and lowering mechanism (first conductive needle contacting mechanism) 304 is disposed. The raising and lowering mechanism 304 raises and lowers the conductive needle 303 so that it contacts the rear surface of the semiconductor wafer W with a predetermined pressure.

In addition, a conductive needle 305 that is a conductive mechanism is disposed at a more outer peripheral position on the process surface of the semiconductor wafer W than the conductive needle 303 by a predetermined distance, for example X2 shown in FIG. 14. The conductive needle 305 can be contacted to a resist film area of the process surface of the semiconductor wafer W. In addition, a raising and lowering mechanism (second conductive needle contacting mechanism) 306 is disposed. The raising and lowering mechanism 306 raises and lowers the conductive needle 305 so that it contacts the process surface of the semiconductor wafer W with a predetermined pressure.

With respect to contacting of the conductive needle 303 and the conductive needle 305 to a semiconductor wafer W, the conductive needle 303 is pressed by the raising and lowering mechanism 304 so that the conductive needle 303 contacts at least a nitride film formed on the rear surface of the semiconductor wafer W, for example an SiN film, and an oxide film, for example a $SiO_2$ film as a base film thereof. Thus, the raising and lowering mechanism 304 needs to have a pressing force that causes the conductive needle 303 to pierce the SiN film. Instead, the raising and lowering mechanism 304 may cause the conductive needle 303 to pierce a plurality of films for example SiN and $SiO_2$, and contact Si. Si 312 is the material of the semiconductor wafer W itself. Thus, static electricity charged in the semiconductor wafer W can be effectively removed from the rear surface thereof by the conductive needle 303. In addition, since the conductive needle 303 does not reach Si 312, which is the material of the semiconductor wafer W itself, the problem of breakage and so forth of the semiconductor wafer W itself can be solved.

Figure 18:
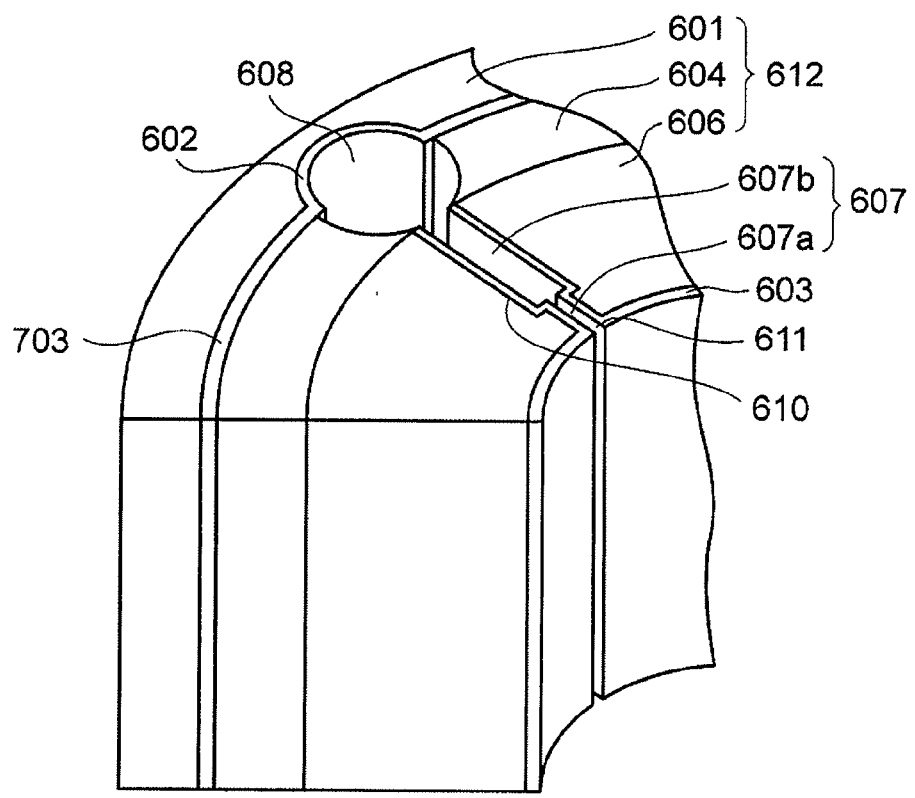
FIG. 18 is a perspective view showing an outline of the static electricity deflecting device shown in FIG. 16, the static electricity deflecting device being cut in an axial direction.

On the other hand, since the conductive needle 303 needs to pierce the SiN film 310, which is a harder film than a film on the process surface side, as shown in FIG. 18, a conductive hard material, for example a plurality of pieces of a conductive diamond 331, are buried in a tip portion 330 of the conductive needle 303. The material of the tip portion 330 or the material of the conductive needle 303 may be tungsten carbide, alumina titanium carbide type ceramic ($Al_2O_3$+TiC), thermite (TiC+TiN), tungsten, palladium, iridium, or beryllium-copper alloy besides conductive diamond. Important characteristics for the material of the conductive needles are conductive, hard, and nonmagnetic.

With respect to the contacting of the conductive needle 305 on the process surface side of the semiconductor wafer W, the conductive needle 305 is contacted to for example a circuit pattern area formed on the process surface side of the semiconductor wafer W, a resist film formed on the circuit pattern area, and an antistatic film formed on the resist film. As another example, the conductive needle is contacted to the circuit pattern area formed on the process surface side of the semiconductor wafer W, a conductive film formed on the circuit pattern area, and the resist film formed on the conductive film.

As another example, the conductive needle 305 is contacted to the circuit pattern area formed on the process surface side of the semiconductor wafer W, a conductive film formed in the circuit pattern area, and the resist film 316 formed in the circuit pattern area.

Thus, the semiconductor wafer W is not directly contacted to Si of the semiconductor wafer W itself. Instead, since the conductive needle 305 is contacted to a conductive film formed on Si of the semiconductor wafer W itself, static electricity charged in the semiconductor wafer W can be effectively removed from the process surface side by the conductive needle 305. In addition, since the conductive needle 305 does not reach Si, which is the material of the semiconductor wafer W itself, the problem of breakage and so forth of the semiconductor wafer W itself can be solved.

In addition, since the conductive needle 305 does not reach Si, which is the material of the semiconductor wafer W itself, a contact hole of the conductive needle 305 formed in the circuit pattern area and the resist film can be decreased. Thus, the contacting of the conductive needle 305 does not largely affect the later processes, for example coating of developing solution on the semiconductor wafer W in the developing process of the resist processing device 2. As a result, the yield of semiconductor wafers W can be improved.

In addition, as shown in FIG. 14, the conductive needle 303 and the conductive needle 305 can be freely connected to a first switch terminal 320, a second switch terminal 321, or a third switch terminal 322 selected through a switch mechanism, for example a switch SW1. The first switch terminal 320 is connected to a current detection mechanism, for example an ammeter, that detects a current that flows in the conductive needle 303 and/or the conductive needle 305. The second switch terminal 321 is connected to the ground. Thus, the conductive needle 303 and/or the conductive needle 305 is grounded through the second switch terminal 321. The third switch terminal 322 is connected to a power supply VP5 that applies a predetermined voltage to the conductive needle 303 and/or the conductive needle 305.

The term "and/or" of the conductive needle 303 and/or the conductive needle 305 means that the conductive needle 303 and the conductive needle 305 are connected and also they are connected to the first switch terminal 320, the second switch terminal 321, or the third switch terminal 222. Instead, for each of the conductive needle 303 and the conductive needle 305, the first switch terminal 320, the second switch terminal 321, and the third switch terminal 322 may be independently provided.

In addition, data of a current value in the ammeter connected to the first switch terminal 320 can be monitored by the control mechanism 166. In addition, for convenience, in the power supply connected to the third switch terminal 322, a negative voltage is applied to the conductive needle 303 and the conductive needle 305. Instead, a positive voltage may be applied to the conductive needle 303 and the conductive needle 305. When necessary, the polarities of the voltages applied may be changed.

In addition, the first electrode 300 is connected to a switch mechanism, for example a switch SW2, and another switch mechanism, for example a switch SW3. The switch SW3 can freely connect the first electrode 300 to a power supply VP1 that applies a predetermined negative voltage thereto or a power supply VP2 that applies a predetermined positive voltage thereto. In addition, the power supply VP1 and the power supply VP2 can be freely connected to a power supply VP4 that generates a reference voltage through a switch mechanism, for example a switch SW4. The switch SW4 can freely select one of the power supply VP4 side and the GND side. Thus, when the switch SW4 selects the GND, the reference voltage becomes 0 V.

In addition, the second electrode 301 can be freely connected to a power supply VP3 that applies a predetermined negative voltage through a switch mechanism, for example a switch SW5. In addition, the power supply VP3 can be freely connected to the power supply VP4 that applies the reference voltage through a switch mechanism, for example the switch SW4. Likewise, the switch SW4 can freely select one of the power supply VP4 side and the GND side. Thus, when the switch SW4 selects the GND, the reference voltage becomes 0 V.

In the foregoing description, the power supply VP1 applies a predetermined negative voltage; the power supply VP2 applies a predetermined positive voltage; and the power supply VP3 applies a predetermined negative voltage. In contrast, the power supply VP1 may apply a predetermined positive voltage; the power supply VP2 may apply a predetermined negative voltage; and the power supply VP3 may apply a predetermined positive voltage. In the drawing, the power supply VP4 applies a negative reference voltage. Instead, the power supply VP4 may apply a positive reference voltage. When necessary, the polarities of the voltages applied may be changed.

Thus, the contact position that the conductive needle 303 contacts on the rear surface of the semiconductor wafer W is closer to the center of the semiconductor wafer W than the contact position that the conductive needle 305 contacts on the process surface of the semiconductor wafer W.

Although the conductive needles are used to remove electrons stored on the semiconductor wafer W or potential of the static electricity chuck mechanism, since the resist film of the semiconductor wafer W is exposed by irradiating it with an electron beam, the distance of the conductive needle 305, which contacts on the process surface from the center of the semiconductor wafer W, is limited. In addition, the conductive needle 305 contact the process surface of the semiconductor wafer W above the insulative member 299. In other words, when the contact position of the conductive needle 305 contacts the process surface of the semiconductor wafer W apart from the insulative member 299, the pressing force of the conductive needle 305 causes the semiconductor wafer W to deviate from the insulative member 299 or fly.

Next, with reference to FIG. 15, the structure of the electron beam irradiating apparatus 500 of the exposure processing chamber 4 will be described in detail.

Figure 15:
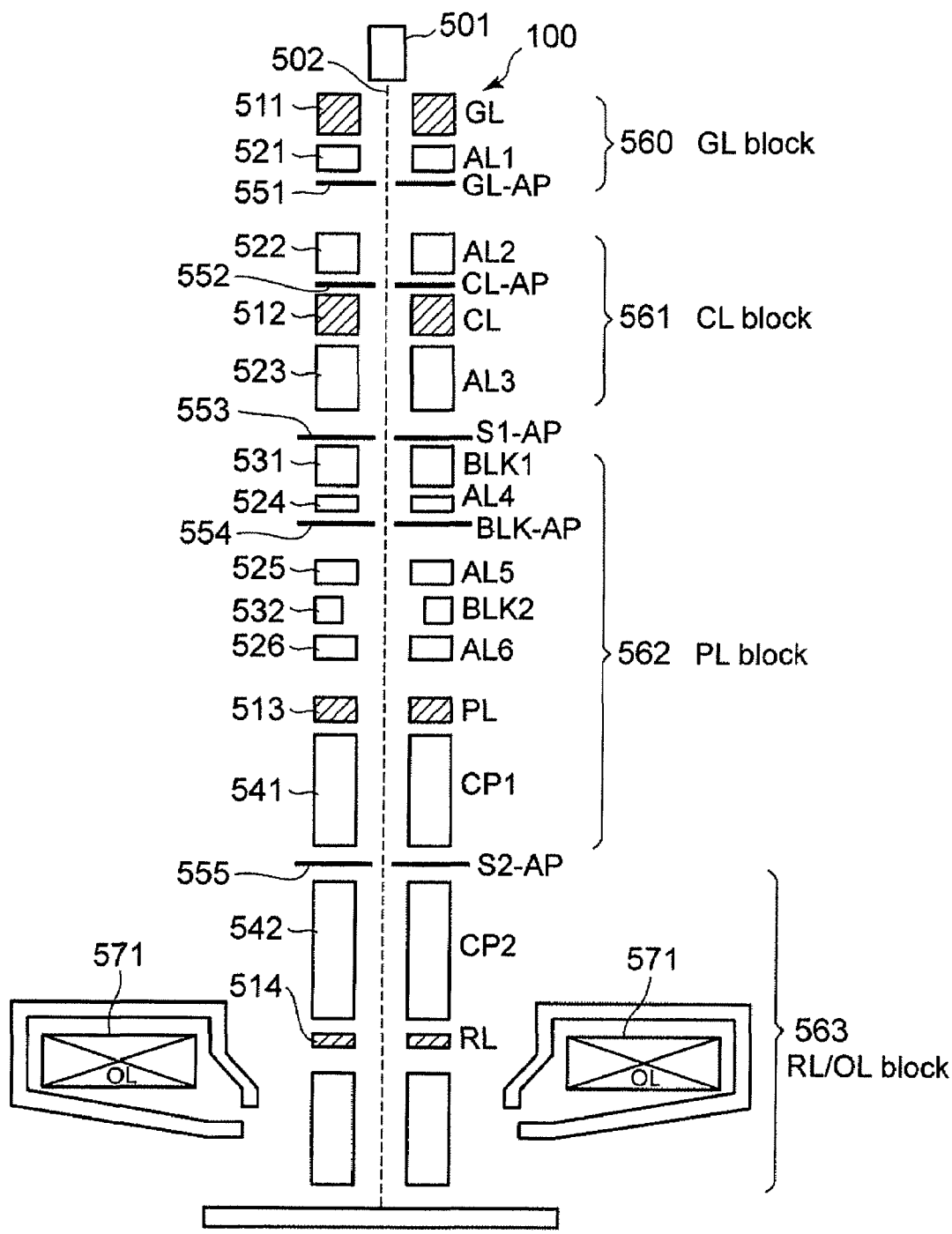
FIG. 15 is a conceptual diagram showing a basic structure of an electron beam irradiating apparatus disposed in the exposure processing chamber shown in FIG. 10.

FIG. 15 is a conceptual diagram showing a basic structure of the electron beam irradiating apparatus 500.

As shown in FIG. 15, the electron beam irradiating apparatus 500 has the electron gun 501 and the column 100. The electron gun 501 irradiates a semiconductor wafer W with an electron beam 502.

The column 100 is divided into four blocks of a gun lens (GL) block 560, a condenser lens (CL) block 561, a projection lens (PL) block 562, and a reduce lens/object lens (RL/OL) block 563. The PL block 562 is disposed between a first forming aperture S1-AP 553 and a second forming aperture S2-AP 555. The first forming aperture S1-AP 553, the second forming aperture S2-AP 555, and the air vent lines 106 satisfy the condition of which the number of air vent lines 106 disposed between the electron gun 501 and the first forming aperture S1-AP 553 is larger than the number of air vent lines 106 disposed between the first forming aperture S1-AP 553 and the second forming aperture S2-AP 555 and/or the interval of the air vent lines 106 disposed between the electron gun 501 and the first forming aperture S1-AP 553 is smaller than the interval of the air vent lines 106 disposed between the first forming aperture S1-AP 553 and the second forming aperture S2-AP 555.

The GL block 560 is an area in which the electron beam 502 emitted from the electron gun 501 is focused. The GL block 560 includes a gun lens 511, a first adjustment static electricity deflecting device (AL1) 521 and a gun lens aperture (GL-AP) 551. The electron beam 502 is focused by the GL 511. The first adjustment static electricity deflecting device (AL1) 521 adjusts the position of the electron beam 502 at the center of the column 100. The GL-AP 551 cuts the largest current portion from the electron beam 502.

The CL block 561 is an area in which the first forming aperture S1-AP 553 is irradiated with the electron beam. The CL block 561 includes a second adjustment static electricity deflecting device (AL2) 522, a condenser lens aperture (CL-AP) 552, a CL 512, and a third adjustment static electricity deflecting device (AL3) 523.

The electron beam 502 that passed through the GL block 560 is adjusted by the AL2 522 such that the electron beam 502 passes through the center of the CL 512. The electron beam 502 is adjusted by the CL-AP 552 and the CL 512 such that the number of electrons of the electron beam 502 becomes a desired value, namely desired brightness is obtained. The third adjustment static electricity deflecting device (AL3) irradiates the first forming aperture (S1-AP) 553 with the electron beam 502.

The S1-AP 553 forms the electron beam 502 in a desired shape. The electron beam 502 that passed through the CL block 561 is formed in a desired shape by the S1-AP 553. A plurality of static electricity deflecting devices disposed between the electron gun 501 and the first forming aperture S1-AP 553 (first area), for example the static electricity deflecting devices 521, 522, and 523 have different thicknesses (widths) as shown in FIG. 15. In this embodiment, the thicknesses of the static electricity deflecting devices increase in the direction from the electron gun 501 to the semiconductor wafer W, or in the traveling direction of the electron beam emitted from the electron gun 501 such that the electron beam is properly controlled.

The PL block 562 is an area in which an image of the S1-AP 553 is focused on the second forming aperture S2-AP 555. The PL block 562 includes a first blanking static electricity deflecting device (BLK1) 531, a fourth adjustment static electricity deflecting device (AL4) 524, a blanking aperture (BLK-AP) 554, a fifth adjustment static electricity deflecting device (AL5) 525, a second blanking static electricity deflecting device (BLK2) 532, a sixth adjustment static electricity deflecting device (AL6) 526, a PL 513, and a first character projection (CP) static electricity deflecting device (CP1) 541. A plurality of static electricity deflecting devices disposed between the first forming aperture S1-AP 553 and the BLK-AP 554 (second area), for example the static electricity deflecting devices 531 and 524 have different thicknesses (widths) as shown in FIG. 15. In this embodiment, the thicknesses of the static electricity deflecting devices decrease in the direction from the electron gun 501 to the semiconductor wafer W, or in the traveling direction of the electron beam emitted from the electron gun 501 such that the electron beam is properly controlled.

The electron beam 502 that passed through the S1-AP 553 is deflected by the blanking static electricity deflecting device 531 such that an unnecessary portion of the semiconductor wafer W is not exposed. The electron beam 502 is adjusted by the fourth adjustment static electricity deflecting device (AL4) 524 such that the electron beam 502 passes through the BLK-AP 554 and the electron beam is deflected on the BLK-AP 554. Thereafter, the electron beam is cut such that it dose not reach an unnecessary portion on the semiconductor wafer W.

The electron beam 502 that passed through the BLK-AP 554 is adjusted by the fifth adjustment static electricity deflecting device (AL5) 525 and the sixth adjustment static electricity deflecting device (AL6) 526 such that the electron beam 502 passes through the center of the PL. The PL 513 focuses an image of the S1-AP 553 on the second forming aperture S2-AP 555. The electron beam 502 is selected as any character or an electron beam having any size on the S2-AP 555 by the first CP static electricity deflecting device (CP1) 541. A plurality of static electricity deflecting devices disposed between the BLK-AP 554 and the second forming aperture S2-AP 555 (third area), for example the static electricity deflecting devices 525 and 526 have the same thickness (width) as shown in FIG. 15. In this embodiment, the static electricity deflecting devices are structured in the direction from the electron gun 501 to the semiconductor wafer W, or in the traveling direction of the electron beam emitted from the electron gun 501 such that the electron beam is properly controlled. Taking account of another static electricity deflecting device, for example the first CP static electricity deflecting device 541, the thickness of the first CP static electricity deflecting device 541 is larger than the thickness of each of the static electricity deflecting devices 525 and 526 such that the electron beam is properly controlled. Since the static electricity deflecting devices 525 and 526 having the same thickness are used and the static electricity deflecting device 541 whose thickness is larger than the thickness of each of the static electricity deflecting devices 525 and 526 is also used in combination, the electron beam can be properly controlled.

The second forming aperture S2-AP 555 is an aperture that forms the electron beam in any character and in any size. The electron beam 502 that passed through the PL block 562 is formed in any shape by the S2-AP 555.

The RL/OL block 563 is a region in which an image of the S2-AP 555 is focused on the semiconductor wafer W. The RL/OL block 563 includes a second CP static electricity deflecting device (CP2) 542, an RL 514, and an OL 571. The electron beam 502 that passed through the second forming aperture S2-AP 555 is adjusted by the second CP static electricity deflecting device (CP2) 542 such that the electron beam 502 passes through the center of the RL. The electron beam 502 is transferred on the semiconductor wafer W by the RL 514. As shown in FIG. 15, the thickness (width) of the second CP static electricity deflecting device 542 is nearly the same as or larger than the thickness (width) of the first CP static electricity deflecting device 541 such that the electron beam is properly controlled. As will be described later, the thickness (width) of the second CP static electricity deflecting device 542 is larger than that of the other static electricity deflecting devices except for the first CP static electricity deflecting device 541 such that the electron beam is properly controlled. The thicknesses of the static electricity deflecting devices are not limited to the foregoing example. Instead, the thicknesses of the static electricity deflecting devices can be properly selected such that the electron beam is properly controlled when necessary.

The number of deflecting electrodes of each of the adjustment static electricity deflecting devices 521 to 526 is plural, for example four. The number of deflecting electrodes of each of the blanking static electricity deflecting devices 531 and 532 is plurality, for example two. The number of deflecting electrodes of each of the CP static electricity deflecting devices 541 and 542 is plurality, for example eight. Thus, the column 100 has a plurality of static electricity deflecting devices whose numbers of deflecting electrodes are different. Static electricity deflecting devices whose numbers of deflecting electrodes are large are disposed on the semiconductor wafer W side, whereas static electricity deflecting devices whose numbers of deflecting electrodes are small are disposed on the electron gun 501 side. In addition, the blanking static electricity deflecting devices 531 and 532 having two deflecting electrodes are disposed between the adjustment static electricity deflecting devices 521 to 526 having four deflecting electrodes. When the electron beam is deflected by a static electricity deflecting device, the distortion of the electron beam is reversely proportional to the number of deflecting electrodes. However, when the number of deflecting electrodes of a static electricity deflecting device is large, it becomes difficult to form the deflecting electrodes of the static electricity deflecting device.

Thus, according to this embodiment, the number of deflecting electrodes of the static electricity deflecting devices, disposed in the semiconductor wafer W area, where distortion of deflection of the electron beam largely affects exposure accuracy, is plural, for example eight. The number of deflecting electrodes of the CL axis and PL axis adjustment static electricity deflecting devices, where distortion of deflection of the electron beam does not largely affect exposure accuracy, is plural, for example four. The number of deflecting electrodes of the static electricity deflecting devices that have an unnecessary electron beam shut-out function is plural, for example two. Thus, the manufacturing cost can be reduced. With respect to the number of deflecting electrodes of the static electricity deflecting devices, in the direction from the electron gun 501 to the semiconductor wafer W, or in the traveling direction of the electron beam of the electron gun 501, there are an area of at least one type of a static electricity deflecting device having a two's multiple or an even multiple of deflecting electrodes, for example 2×2=4 deflecting electrode, for example an area from the electron gun 501 to the first forming aperture S1-AP 553, an area of a plurality of types of static electricity deflecting devices having a two's multiple of deflecting electrodes, for example 2×1=2 deflecting electrodes and 2×2=4 deflecting electrodes, for example an area from the first forming aperture S1-AP 553 to the BLK-AP 554, namely a combination of static electricity deflecting devices having a two's integer multiple of deflecting electrodes or an even multiple of deflecting electrodes, for example 2×1=2 deflecting electrodes and 2×2=4 deflecting electrodes, an area of a plurality of, for example three or more types of static electricity deflecting devices having 2×4 deflecting electrodes, for example an area from the first forming aperture S1-AP 553 to the S2-AP 555, and an area of at least one type of a static electricity deflecting device having a two's integer multiple of deflecting electrodes or an even multiple of deflecting electrodes, for example 2×4=8 deflecting electrodes, for example an area from the S2-AP 555 to the semiconductor wafer W (fourth area). Instead, of course, at least one of the static electricity deflecting devices may have a two's odd multiple of deflecting electrodes rather than two's even multiple of deflecting electrodes, for example six deflecting electrodes or 10 deflecting electrodes. Instead, a static electricity deflecting devices having a two's odd multiple of deflecting electrodes, for example six deflecting electrodes or 10 deflecting electrodes may be used in combination. Instead, at least one of the static electricity deflecting devices may have a three's even multiple, a three's integer multiple, or a three's odd multiple of deflecting electrodes rather than a two's even multiple of deflecting electrodes. Instead, a static electricity deflecting device having a three's even multiple, a three's integer multiple, or a three's odd multiple of deflecting electrodes may be used in combination.

The CP static electricity deflecting devices 541 and 542 are longer than other static electricity deflecting devices. In other words, the static electricity deflecting devices are composed of cylindrical members. The axial length of each of the CP static electricity deflecting devices 541 and 542 is larger than that of each of other static electricity deflecting devices. When the length of a static electricity deflecting device is large, the deflection amount of the electron beam can be increased at low voltage. Thus, the length of each of the static electricity deflecting devices on the semiconductor wafer W side is larger than that of each of other static electricity deflecting devices such that the electron beam is emitted to a desired position on the semiconductor wafer W.

In this embodiment, there are two blanking static electricity deflecting devices that sandwich the BLK-AP 554. However, when a blanking static electricity deflecting device is disposed between the BLK-AP 554 and the electron gun 501, the electron beam can be cut. As in this embodiment, when the second blanking static electricity deflecting device (BLK2) 532 is also disposed between the BLK-AP 554 and the semiconductor wafer W, the amount of leakage of the electron beam that is cut can be decreased. As described above, although the first blanking static electricity deflecting device (BLK1) 531 and the second blanking static electricity deflecting device BLK2 532 have two deflecting electrodes each, these deflecting electrodes match when these static electricity deflecting devices are viewed from the top. With respect to the positions of the static electricity deflecting devices corresponding to a electron beam passing portion 609, which will be described later, the center position of each of the deflecting electrodes matches the passing line of the electron beam such that the electron beam passes from the electron gun 501 to the semiconductor wafer W or in the traveling direction of the electron beam from the electron gun 501. In addition, a space portion 608 of each deflecting electrode of each static electricity deflecting device is formed such that the space portion 608 matches the passing line of the electron beam.

The diameter of the electron beam passing portion of each of the static electricity deflecting devices except for the second blanking static electricity deflecting device BLK2 532 is nearly the same. In contrast, the diameter of the electron beam passing portion of the electron beam passing portion of the second blanking static electricity deflecting device BLK2 532 is larger than that of each of the static electricity deflecting devices. In other words, with the second blanking static electricity deflecting device BLK2 532, deflecting sensitivity is adjusted such that the two blanking static electricity deflecting devices operate as a diaphragm of the electron beam.

A voltage of −100 V to 100 V is designed to be able to be applied to the adjustment static electricity deflecting devices 521 to 526. A voltage of for example −20 V to 20 V, which is lower in an amplitude control width than the voltage applied to the adjustment static electricity deflecting devices 521 to 526, is designed to be able to be applied to the blanking static electricity deflecting devices 531 and 532. A voltage of for example −40 V to 40 V, which is lower in an amplitude control width than the voltage applied to the adjustment static electricity deflecting devices 521 to 526, and larger in an amplitude control width than the voltage applied to the blanking static electricity deflecting devices 531 and 532, is designed to be able to be applied to the CP static electricity deflecting devices 541 and 542. These static electricity deflecting devices are electrically independent from each other. They can be independently controlled. Two voltages with the same potential and different polarities, for example, −40 V and +40 V, can be applied to opposite electrodes.

The static electricity deflecting devices each have a temperature adjustment mechanism (not shown) such that they can be set at a predetermined temperature. The temperature adjustment mechanism allows an unnecessary matter to be prevented from adhering on each of the static electricity deflecting devices.

As shown in FIG. 15, the lenses, which are the GL 511, the CL 512, the PL 513, and the RL 514, are formed such that their thicknesses are reversely proportional to the distances from the semiconductor wafer W. A predetermined voltage, for example −4200 V to −4900 V, is designed to be able to be applied to the GL 511. A predetermined voltage, for example −2800 V, is designed to be able to be applied to the PL 513. A predetermined voltage, for example −2800 V, is applied to the PL 513. A predetermined voltage, for example −4300 V, is designed to be able to be applied to the RL 514. A predetermined voltage, for example −4300 V, is designed to be able to be applied to the RL 514.

Next, with reference to FIG. 16 to FIG. 19, an example of the structure of the foregoing static electricity deflecting devices will be described. In this example, a static electricity deflecting device having four deflecting electrodes used as an adjustment static electricity deflecting device will be described. The structure of a static electricity deflecting device having four deflecting electrodes is basically the same as the structure of a static electricity deflecting device having two deflecting electrodes or eight deflecting electrodes except that their numbers of deflecting electrodes are different. In the drawings, for easy understanding, their scales are different.

Figure 16:
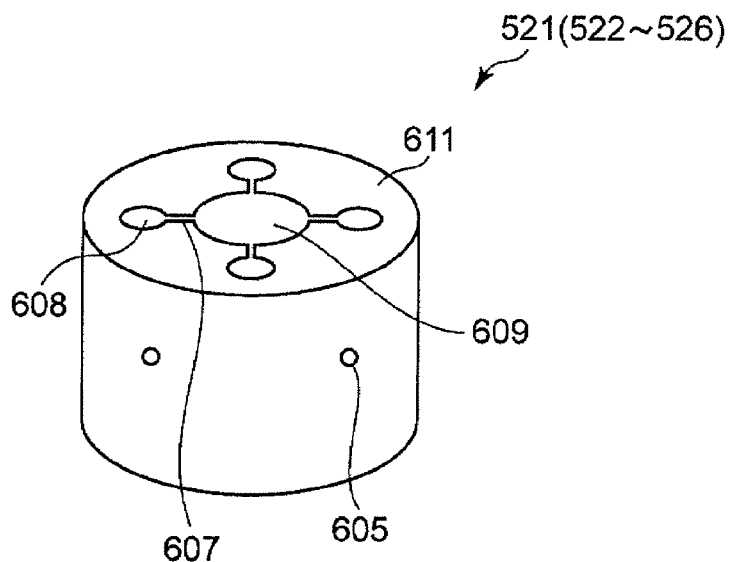
FIG. 16 is a perspective view showing an outline of a static electricity deflecting device of a column of the electron beam irradiating apparatus shown in FIG. 15.
Figure 17:
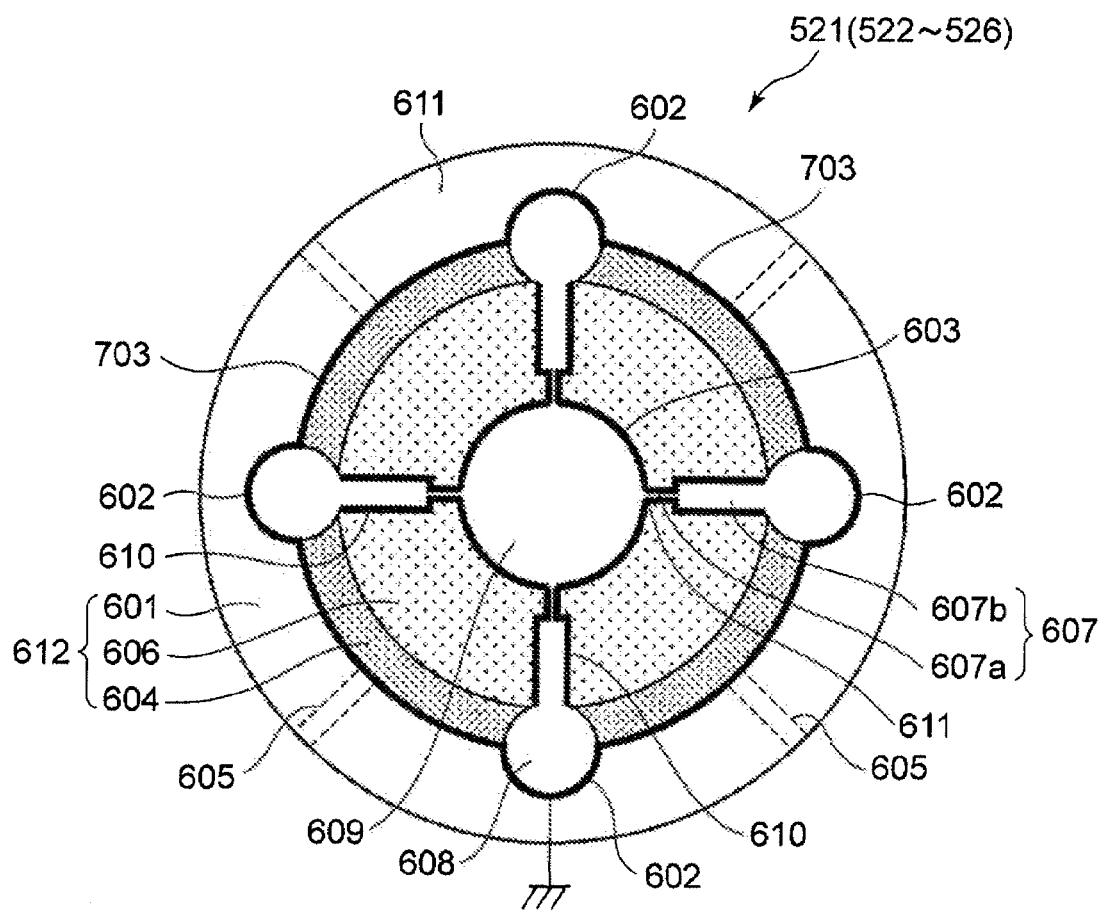
FIG. 17 is a top view showing the static electricity deflecting device shown in FIG. 16.
Figure 19:
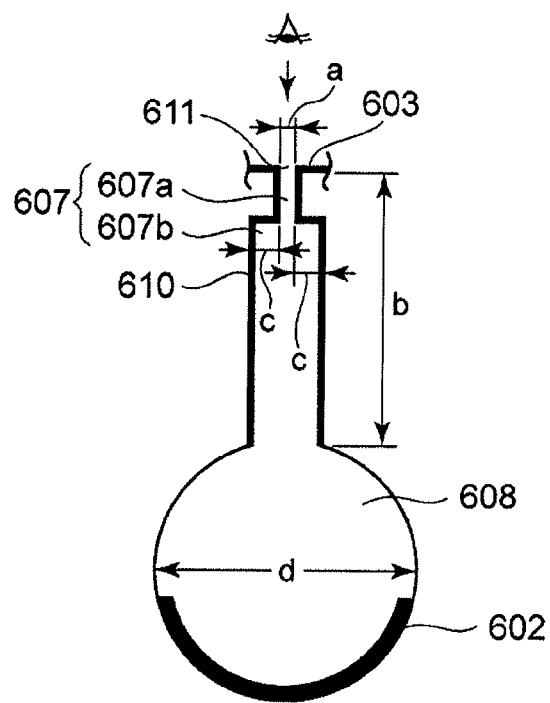
FIG. 19 is a partial plan view showing the static electricity deflecting device shown in FIG. 16.

FIG. 16 is a perspective view showing an outline of a static electricity deflecting device of the column 100 of the electron beam irradiating apparatus shown in FIG. 16. FIG. 17 is a top view showing the static electricity deflecting device shown in FIG. 16. FIG. 18 is a perspective view showing an outline of the static electricity deflecting device shown in FIG. 16, taken in the axial direction. FIG. 19 is a partial plan view showing the static electricity deflecting device shown in FIG. 16.

As shown in FIG. 16 and FIG. 17, the adjustment static electricity deflecting device 521 (522 to 526) includes a cylindrical member 612, which has the electron beam passing portion 609; four deflecting electrodes 603 disposed radially along the cylindrical axis on the inner wall surface of the cylindrical member 612 and electrically divide; four space portions 608 each of which is connected to a gap portion 611 between the two corresponding deflecting electrodes 603 and is disposed at an outer position of the corresponding gap portion 611 than the electron beam passing portion 609 when each of the space portions 608 are viewed from the electron beam passing portion 609; four connection portions 607 each of which connects the corresponding gap portion 611 and the corresponding space portion 608; four first conduction films 602 each of which is formed along the cylindrical axis on the wall surface of the corresponding space portion 608; four connection conductive films 703 each of which has a nearly ring-shaped section and which electrically connects the corresponding first conductive film 602; and four voltage input terminals 605 each of which applies a voltage to the corresponding deflecting electrode 603. Formed on the wall surface of each of the connection portions 607 is a second conductive film 610 that is electrically connected to the corresponding deflecting electrode 603. The second conductive film 610 is formed from the corresponding gap portion 611 to the corresponding space portion 608. The second conductive film 610 may protrude into the space portion 608 to some extent as long as the second conductive film 610 does not contact the first conductive film 602.

The cylindrical member 612 is composed of three layers of an inner layer 606, a middle layer 604, and an outer layer 601, each of which is composed of the same material, ceramic. The deflecting electrodes 603 and the second conductive films 610 that are electrically connected are insulated from the first conductive films 602 and the connection conductive films 703 that are electrically connected. In this embodiment, the deflecting electrodes 603 and the second conductive films 610 are insulated from the first conductive films 602 and the connection conductive films 703 by the middle layer 604 as an insulative area. In the space portions 608 formed in the middle layer 604, ceramic is exposed. In other words, the wall surface of each of the space portions 608 is composed of a conductive area on which the corresponding first conductive film 602 is formed and an insulative area in which ceramic is exposed. The connection conductive films 703 provide a shield effect that prevents the static electricity deflecting device 521 from being affected by an external electric field.

The deflecting electrodes 603 and the second conductive films 610 are formed on inner wall surfaces and divided surfaces of four divided portions of the inner layer 606, respectively. The deflecting electrode 603 and the second conductive film 610 formed on one of the four divided portions of the inner layer 606 are electrically insulated from another four divided portions. The connection portions 607 each have a first connection portion 607a connected to the electron beam passing portion 609 and a second connection portion 607b connected to the corresponding space portion 608 that is wider than the first connection portion 607a. Although the deflecting electrodes 603 and the second conductive films 610 are formed on the inner wall surfaces and the divided surfaces of the four axially-divided portions of the cylindrical inner layer 606, when necessary, a conductive film may not be formed on the surface (upper surface and/or the lower surface) of the outer layer 601. Instead, a conductive film electrically connected to the connection conductive film 703 and/or the first conductive film 602 may be formed on the surface (upper surface and/or the lower surface) of the outer layer 601.

Thus, when the width of each of the connection portions 607 on the electron beam passing portion 609 side (namely, each of the first connection portions 607a) is decreased, the amount of the electron beam that enters into the space portions 608 can be decreased. On the other hand, when the width of each of the second connection portions 607 on the space portion 608 side (namely, each of the second connection portions 607b) is increased, the exposed area of ceramic of the middle layer 604 on which the first conductive films is not formed in the space portions 608 can be decreased. In addition, since the second conductive film 610 is formed in each of the connection portions 607, electrons that enter into the corresponding connection portion 607 pass between two second conductive films 610. Thus, a potential between the two second conductive films 610 further prevents electrons from entering into the corresponding space portion 608.

The space portions 608 are wider than the connection portions 607. The space portions 608 have a nearly circular section. The first conductive films 602 are electrically insulated from the second conductive films 610. The first conductive films 602 are formed at least in an area that is visible when each of the space portions 608 is viewed from the electron beam passing portion 609. Although the space portions 608 have a circular section in this example, the space portions 608 may have a square section, an elliptic section or a section combination thereof. The volume, diameter, or distance of each of the space portions 608 need to be designed such that no abnormal discharge takes place. It is preferred that the volume that substantially forms each of the space portions 608 be larger than the volume of each of the connection portions 607, which will be described later. More specifically, in each of the connection portions 607 and the space portions 608, the volume that substantially forms the first connection portion 607a of the connection portion 607, the volume that substantially forms the second connection portion 607b, and the volume that substantially forms the space portion 608 satisfies the condition of the volume that substantially forms the first connection portion 607a<the volume that substantially forms the second connection portion 607b<the volume that substantially forms the space portion 608. When the first connection portion 607a of the connection portion 607 is a substantial connection portion, if the second connection portion 607b is processed as the first space portion, the space portion 608 can be processed as a second space portion. When each of the space portions 608 has a square section, it is preferred that the first conductive film 602 be formed in an area that is visible when each of the space portions 608 is viewed from the electron beam passing portion 609.

The connection conductive films 703 formed between the outer layer 601 and the middle layer 604 are electrically connected to the four first conductive films 602. Thus, when any one position of the connection conductive films 703 and the first conductive films 602 is grounded, all the first conductive films 602 can be collectively grounded. As a result, the structure of the static electricity deflecting device 521 (522 to 526) can be simplified.

In addition, the space portion 608 can be used as air vent openings through which the degree of vacuum of the electron beam passing portion 609 is increased. In addition, the space portions 608 can be also used as gas vent openings when the exposure processing chamber 4 is cleaned. Moreover, for safety reason, it is necessary to provide the space portions 608 with abnormal discharge detection mechanisms that detect abnormal discharge therein. In addition, as described above, the space portions 608 may be provided with temperature adjustment mechanisms, for example heaters, which keep the space portions 608 at a predetermined temperature to suppress depositing of unnecessary matter.

In the static electricity deflecting device 521 (522 to 526) of this embodiment, the space portions 608 are formed such that they are connected to the electron beam passing portion 609 through the corresponding gap portions 611 formed between adjacent deflecting electrodes 603. In addition, the first conductive films 602 are formed in the space portions 608. Thus, electrons that entered from the electron beam passing portion 609 into the space portions 608 do not easily return to the electron beam passing portion 609. Thus, the space portions 608 function as electron capturing areas. Electrons that passed through each of the gap portions 611 and that are stored in the corresponding space portion 608 are quickly discharged by the corresponding first conductive film 602. Thus, since occurrence of charge-up can be suppressed, an electron beam can be deflected in a desired shape. As a result, deterioration of the exposure accuracy due to charge-up can be prevented.

As described above, it is preferred that each of the first conductive films 602 be formed at least in an area that is visible when each of the space portion 608 is viewed from the electron beam passing portion 609. Electrons that passed through the gap portion 611 and entered into the space portion 608 are nearly securely captured by the first conductive film 602.

When electrons pass through each of the connection portions 607 and reached the corresponding space portion 608, the traveling direction of the electrons is restricted. Thus, when the first conductive film 602 is formed at least in an area that is visible when each of the space portion 608 is viewed from the electron beam passing portion 609, the electrons can be nearly securely captured by the first conductive film 602.

To electrically insulate each of the space portion 608 and the corresponding deflecting electrode 603, there is an area in which ceramic of the middle layer 604 is exposed in the space portion 608. As the material of the outer layer 601, the middle layer 604, and the inner layer 606 of the cylindrical member 612, it is preferred to use a material that satisfies the conditions of which the CR value (C represents capacitance, whereas R represents resistance) of the scanning frequency of the electron beam is equal to or smaller than 100 μm, the capacitance C is equal to or smaller than 100 pF, and the resistance R is $10^6$ to $10^7$ ohms. When the capacitance C is 100 pF, even if charge-up occurs in the area in which ceramic is exposed, the electrons tend to be easily discharged before next electrons enter. Thus, charge-up can be suppressed to some extent.

In this embodiment, since the space portions 608 have a curved section, electrons that entered into the space portions 608 do not easily return to the electron beam passing portion 609 although the electrons collide and bounce.

In addition, in this embodiment, since each of the space portions 608 is designed to be larger than the widths of the corresponding gap portion 611 and the corresponding connection portion 607, electrons that entered into each of the space portions 608 do not easily return to the electron beam passing portion 609. Thus, the electrons do not adversely affect an electron beam that passes through the electron beam passing portion 609.

In this embodiment, each of the connection portions 607 has the first connection portion 607a and the second connection portion 607b, which differ in their widths. Thus, in each of the space portions 608, an area in which ceramic is exposed in the middle layer 604, namely an area not coated with the first conductive film 602, can be decreased. As a result, charge-up can be suppressed.

In this embodiment, the first conductive films 602 and the connection conductive films 703, which are electrically connected, are grounded. Instead, when a plus potential is applied to the first conductive films 602, electrons can be securely captured.

In the exposure processing chamber 4, the first conductive films 602 of each of the static electricity deflecting devices of the column 100 are grounded and the semiconductor wafer W is also grounded. Thus, no potential occurs between the semiconductor wafer W and each of the static electricity deflecting devices. As a result, no electric charges are stored on the semiconductor wafer W. Instead, the static electricity deflecting devices may be designed such that the potential of each of the first conductive films 602 becomes the same as that of the semiconductor wafer W. In this case, no potential occurs between the semiconductor wafer W and each of the static electricity deflecting devices. As a result, no electric charges are stored on the semiconductor wafer W.

As the material of the cylindrical member 612, a non-conductive material for example alumina, ceramic, or conductive ceramic whose volume resistivity is $10^7$ to $10^{10}$ ohm-cm can be used. When a non-conductive material whose volume resistivity is $10^7$ to $10^{10}$ ohm-cm is used as the material of the cylindrical member 612, even if the cylindrical member 612 is charged with static electricity, the cylindrical member 612 is easily discharged. In addition, the cylindrical member 612 insulates the deflecting electrodes from the ground (GND). In this embodiment, as the cylindrical member 612, conductive ceramic is used. Instead, insulative ceramic may be used. When insulative ceramic is used, its volume resistivity may be $10^\infty$ ohm-cm. Instead, the cylindrical member 612 may be composed such that the specific resistance of ceramic of the middle layer 604 is higher than that of the outer layer 601 and/or the inner layer 606, for example the specific resistance of ceramic of the middle layer 604 is on the order of $10^7$ ohm-cm or higher and the specific resistance of ceramic of the outer layer 601 and/or the inner layer 606 is on the order of $10^7$ ohm-cm or lower. Instead, the cylindrical member 612 may be composed such that the specific resistance of ceramic of the middle layer 604 is higher than that of the outer layer 601 and/or the inner layer 606 and the specific resistance of the outer layer 601 is lower or higher than that of the inner layer 606.

In addition, as was described above, it is preferred to use a material that satisfies the conditions of which the CR value (C represents capacitance, whereas R represents resistance) of the scanning frequency of the electron beam is equal to or smaller than 100 μm, the capacitance C is equal to or smaller than 100 pF, and the resistance R is $10^6$ to $10^7$ ohms. The deflecting electrode 603 is composed of a platinum group metal such as ruthenium (Ru), rhodium (Rh), palladium (Pd), osmium (Os), iridium (Ir), or platinum or a conductive oxide such as ruthenium oxide, iridium oxide, or platinum oxide.

When the interior of the exposure processing chamber 4 is cleaned, a strong oxidizing agent is used. Thus, it is preferred that the deflecting electrodes 603 be composed of a material that is not easily oxidized. The first conductive films 602, the connection conductive films 703, and the second conductive films 610 may be composed of the same material as the deflecting electrodes 603 or different materials therefrom. Like the material of the deflecting electrodes 603, the material of the first conductive films 602, the connection conductive films 703, and the second conductive films 610 may be a platinum group metal such as ruthenium (Ru), rhodium (Rh), palladium (Pd), osmium (Os), iridium (Ir), or platinum or a conductive oxide such as ruthenium oxide, iridium oxide, or platinum oxide. As the first conductive films 602, the deflecting electrodes 603, the connection conductive films 703, and the second conductive films 610, gold-plated metal films may be used. In this embodiment, the deflecting electrodes 603, the first conductive films 602, the connection conductive films 703, and the second conductive films 610 are made of the same material, gold. As a conductive oxide, a conductive metal oxide such as vanadium dioxide ($VO_2$), chromium dioxide ($CrO_2$), molybdenum dioxide ($MoO_2$), tungsten dioxide ($WO_2$), rhenium dioxide ($ReO_2$), niobium dioxide ($NbO_2$), ruthenium dioxide ($RuO_2$), rhodium dioxide ($RhO_2$), iridium dioxide ($IrO_2$), palladium dioxide ($PdO_2$), platinum dioxide ($PtO_2$), or osmium dioxide ($OSO_2$) or a conductive complex oxide such as lanthanum nickel complex oxide ($LaNiO_3$), strontium vanadic acid ($SrVO_3$), calcium vanadic acid ($SrVO_3$), calcium vanadic acid ($CaVO_3$), strontium ferrate ($SrFeO_3$), lanthanum titanic acid ($LaTiO_3$), lanthanum strontium nickel complex oxide ($LaSrNiO_4$), strontium chromate ($SrCrO_3$), calcium chromate ($CaCrO_3$), calcium ruthenate ($CaRuO_3$), strontium ruthenate ($SrRuO_3$), or strontium iridate ($SrIrO_3$). It is preferred that these conductive films be formed by electrolytic plating method or spattering method.

In FIG. 19, width a of the gap portions 611 is a predetermined width, for example a predetermined value of 1 mm or less, for example around 0.5 mm. Length b of the connection portion 607 is a predetermined length, for example a predetermined value of 50 mm or less, for example around 1.5 mm to 25 mm. In this embodiment, the gap portion 611 and the connection portion 607 are designed to satisfy the relationship of which width a and length b are 1:10. When the diameter of the electron beam passing portion 609 and the diameter of the cylindrical member 612 are the same, electrons can be prevented from entering into the space portion 608 as length b increases. As a result, an electron beam that passes through the electron passing portion can be prevented from being affected by static electricity charged up in the space portion 608.

However, length b is reversely proportional to diameter d of the space portion 608. Thus, to secure a sufficient electron capturing area and decrease the area in which ceramic is exposed in the space portion 608 as much as possible, it is preferred that the ratio of width a and length b be a predetermined value, for example 1:1 or larger, for example 1:3 to 1:10.

In addition, in this embodiment, since the second connection portion 607b is wider than the first connection portion 607a, the area in which ceramic is exposed in the space portion 608 can be decreased in comparison with the case that the width of the connection portion 607 is the same as the width of the first connection portion 607a, namely the gap portion 611.

In this embodiment, the thickness of the first conductive film 602 is a predetermined thickness, for example a predetermined thickness of 0.5 μm to 5 μm, for example around 2 to 3 μm. Diameter d of the space portion 608 is a predetermined diameter, for example a predetermined diameter of 10 mm or less, for example around 2 to 3 mm. The thickness of the outer layer 601 is a predetermined thickness, for example a predetermined thickness of 10 mm or less, for example around 1 to 5 mm. The thickness of the middle layer is a predetermined thickness, for example a predetermined thickness of 5 mm or less, for example around 0.5 to 1 mm. The thickness of the inner layer 606 is a predetermined thickness, for example a predetermined thickness of 10 mm or less, for example around 1.5 to 5 mm. The thickness of the deflecting electrode 603 is a predetermined thickness, for example a predetermined thickness of 10 μm or less, for example around 2 to 3 μm. The diameter of the electron beam passing portion 609 is a predetermined diameter, for example a predetermined diameter of 20 mm or less, for example around 4 to 11 mm. These values may be changed depending on the type of the static electricity deflecting device. In this embodiment, the relationship of the thickness of the outer layer 601, the thickness of the middle layer 604, and the thickness of the inner layer 606 satisfies the condition of the thickness of the inner layer 606≧the thickness of the outer layer 601>the thickness of the middle layer 604. Instead, the relationship of the thickness of the outer layer 601≧the thickness of the inner layer 606>the thickness of the middle layer 604 may be satisfied.

In the column 100 of this embodiment, all the static electricity deflecting devices have the space portions 608. Instead, at least static electricity deflecting devices that are disposed in the vicinity of the semiconductor wafer W and whose charge-up largely and adversely affects exposure accuracy, for example CP static electricity deflecting devices in this embodiment, necessitate the space portions 608.

Figure 20:
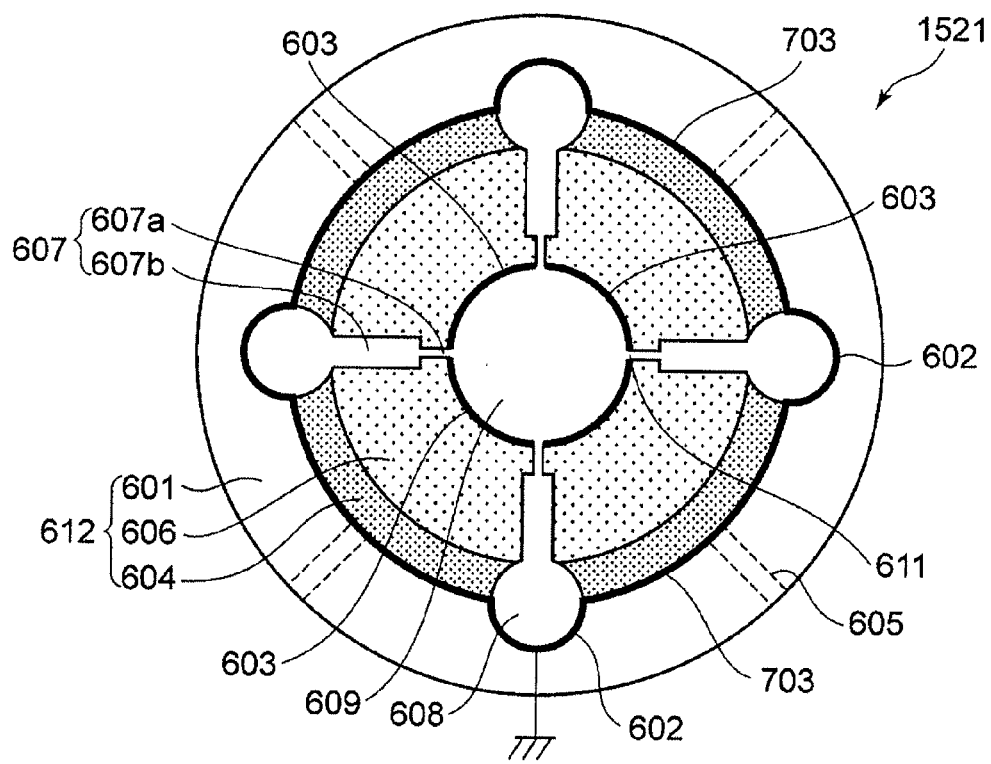
FIG. 20 is a top view showing a static electricity deflecting device according to a modification of the embodiment.

The static electricity deflecting devices are not limited to those of the foregoing embodiment. Instead, they may be modified and/or changed without departing from the spirit and scope of the present invention. FIG. 20 is a plan view showing a static electricity deflecting device 1521 according to a modification of the foregoing embodiment. For simplicity, in FIG. 20, similar portions to those of the foregoing embodiment are denoted by similar reference numerals. In the embodiment, the second conductive film 610 is formed on the wall surface of each of the connection portions 607. In contrast, in this modification, a conductive film may not be formed on the wall surface of the connection portion 607 such that ceramic of the inner layer 606 is exposed.

Figure 21:
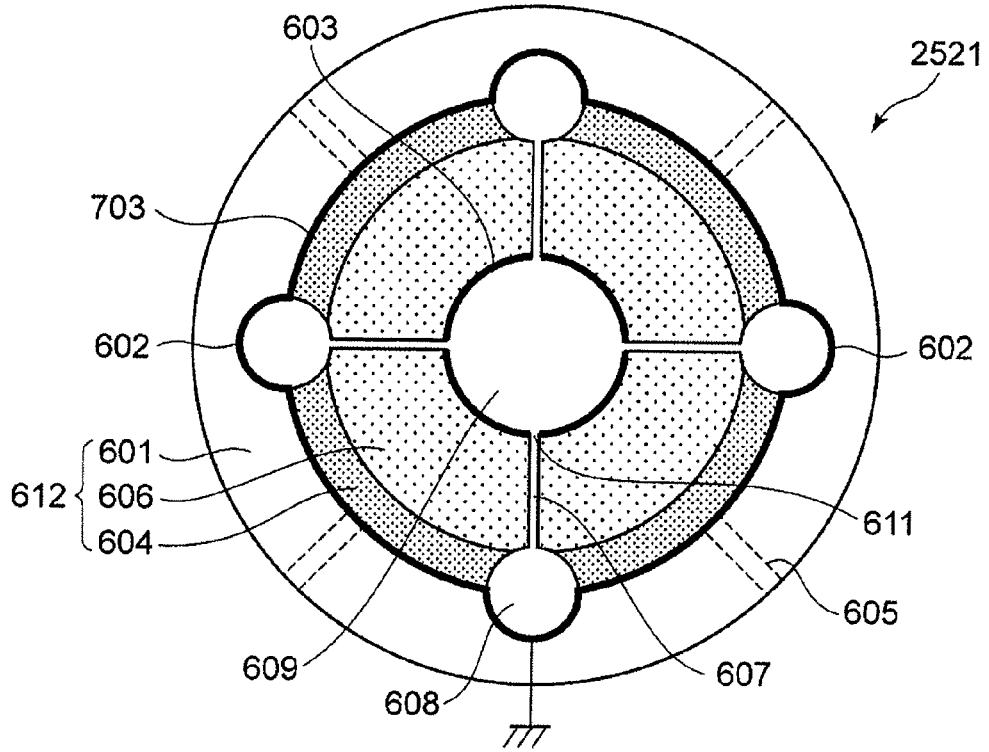
FIG. 21 is a top view showing a static electricity deflecting device according to another modification of the embodiment.

FIG. 21 is a plan view showing a static electricity deflecting device 2521 according to another modification of the foregoing embodiment. Likewise, for simplicity, in FIG. 21, similar portions to those of the foregoing embodiment are denoted by similar reference numerals. In the foregoing embodiment, the shape, width, of the connection portion 607 partially varies. In this modification, as shown in FIG. 21, the shape, width, of a connection portion 707 that connects the space portion 608 and the electron beam passing portion 609 may be formed constant. Thus, since the width of the connection portion 707 is narrow, it prevents electrons from entering into the space portion 608. In addition, the ratio of width a and length b substantially becomes large.

Figure 22:
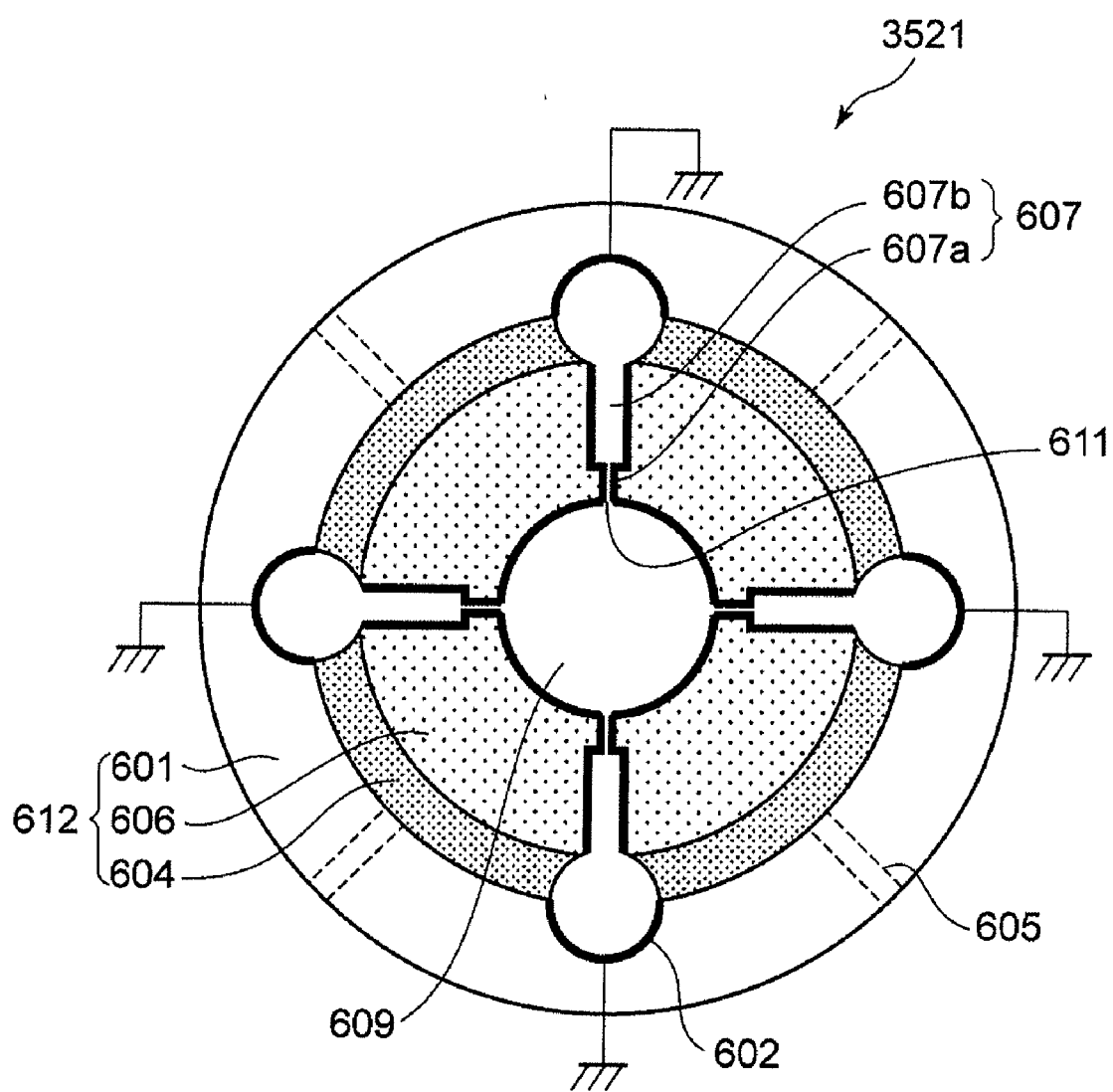
FIG. 22 is a top view showing a static electricity deflecting device according to another modification of the embodiment.

FIG. 22 is a plan view showing a static electricity deflecting device 3521 according to another modification of the foregoing embodiment. For simplicity, in FIG. 22, similar portions to those of the foregoing embodiment are denoted by similar reference numerals. In the foregoing embodiment, the first conductive films 602 are electrically connected by the connection conductive film 703. Instead, in this modification, as shown in FIG. 22, each of the first conductive films 602 may be grounded without the connection conductive film 703. Ammeters may be disposed in grounding paths of the first conductive films 602 to detect the amounts of charge-up of the deflecting electrodes. Corresponding to the detected results, voltages applied to the deflecting electrodes may be controlled by a control mechanism. The outer layer 601 and the inner layer 606 of the upper surface and the lower surface of the cylindrical member 612 may be gold-plated. The plated conductive film may be grounded.

Next, with reference to FIG. 23 and FIG. 24, the structures of the GL 511, the CL 512, the PL 513, and the RL 514 will be described. Their structures are basically the same.

Figure 23:
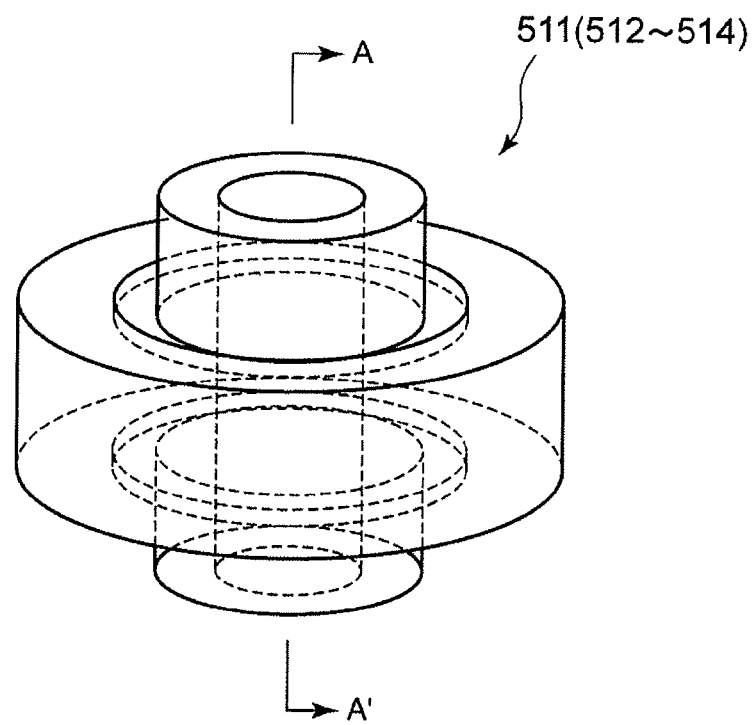
FIG. 23 is a perspective view showing an outline of a lens of the column of the electron beam irradiating apparatus shown in FIG. 15.

FIG. 23 is a perspective view showing an outline of the lens 511 (512 to 514). FIG. 24 is a sectional view showing an outline of the state of which the lens 511 (512 to 514) is mounted in the column 100.

Figure 24:
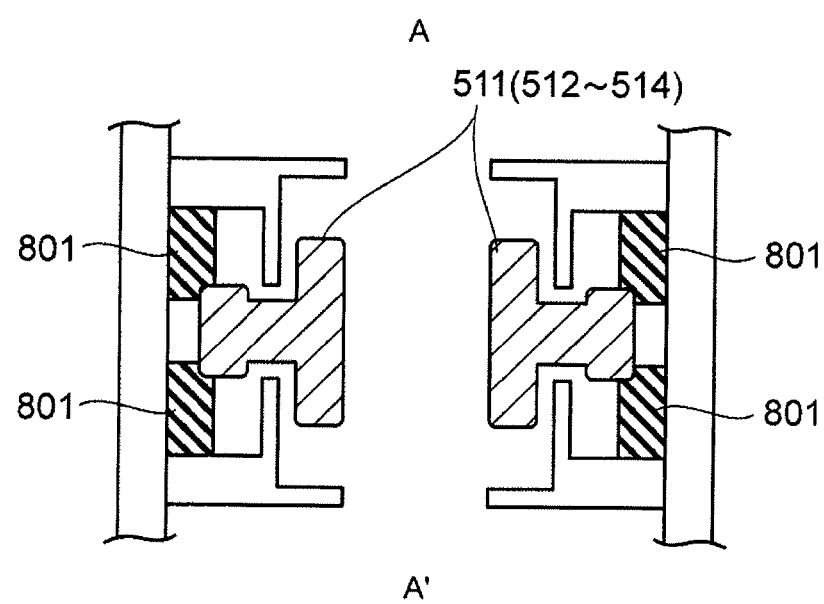
FIG. 24 is a sectional view showing an outline of the lens shown in FIG. 23, taken along line A-A1.

As shown in FIG. 24, the lens 511 (512 to 514) has a rail-shaped section. The lens 511 (512 to 514) is supported and secured by a support member 801. The lens 511 (512 to 514) is made of titanium or the like. The support member 801 is made of ceramic or the like. A film made of gold is formed between the lens 511 and the support member 801. As shown in FIG. 15, the GL 511, the CL 512, the PL 513, and the RL 514 are designed such that the thicknesses (widths) of the plurality of lenses disposed from the electron gun 501 to the first forming aperture S1-AP 553, for example the lenses 511 and 512, are nearly the same. In this embodiment, in the direction from the electron gun 501 to the semiconductor wafer W, or in the traveling direction of an electron beam from the electron gun 501, the thicknesses of the lenses increase. The thickness (width) of the lens 513 disposed from the first forming aperture S1-AP 553 to the second forming aperture S2-AP 555 is smaller than that of each of the lenses 511 and 512. The thickness (width) of the lens 514 disposed from the second forming aperture S2-AP 555 to the semiconductor wafer W is smaller than the thickness (width) of the lens 513. At least, the lenses that satisfy the foregoing conditions are disposed in these areas. More preferably, the plurality of lenses disposed from the electron gun 501 to the first forming aperture S1-AP 553, for example the lens 511 and 512, are designed to satisfy the condition of the thickness (width) of the lens 511≈the thickness (width) of the lens 512 the thickness (width) of the lens 513>the thickness (width) of the lens 514.

The lens 511 (512 to 514) is made of a conductive material, for example a nonmagnetic and conductive material, for example tungsten carbide. In addition, DC voltages are independently applied to the lenses 511, 512, 513, and 514. The voltages of the lenses 511 to 514 are set by the control mechanism. The voltage applied to the lens 511 is a predetermined value of 4.0 to 5.0 kV. The voltage applied to the lens 512 is a predetermined value of 2.0 to 4.0 kV. The voltage applied to the lens 513 is a predetermined voltage of 2.5 to 3.5 kV. The voltage applied to the lens 514 is a predetermined voltage of 3.5 to 4.0 kV. It is preferred that the relationship of the voltage of the lens 511>the voltage of the lens 514>the voltage of the lens 512 or the voltage of the lens 513 be satisfied. Since the lens 513 projects the first forming aperture S1-AP 553 to the second forming aperture S2-AP 555, it is preferred that the voltage applied to the lens 513 be a predetermined value of 2.8 to 3.2 kV. The inner diameters of the lenses 511 to 514 satisfy the condition of the inner diameter of the lens 513≈the inner diameter of the lens 512>the inner diameter of the lens 514. Members 2010 disposed at an upper portion and a lower portion of the lens 511 (512 to 514) are made of a conductive material, for example a nonmagnetic and conductive material, for example tungsten carbide. The members 2010 are grounded. When only the lens 512 is provided with an extension portion 2011 only on the member 2010 side, namely the electron gun side, the inner diameter of the member 2010 is smaller than the inner diameter of the lens 512, whereas the inner diameter of the member 2010 on the semiconductor wafer W side is nearly the same as the inner diameter of the lens 512. It is preferred that the inner diameter of the member 2010 be nearly the same as the inner diameter of each of the other lenses 511, 513, and 514.

Figure 47:
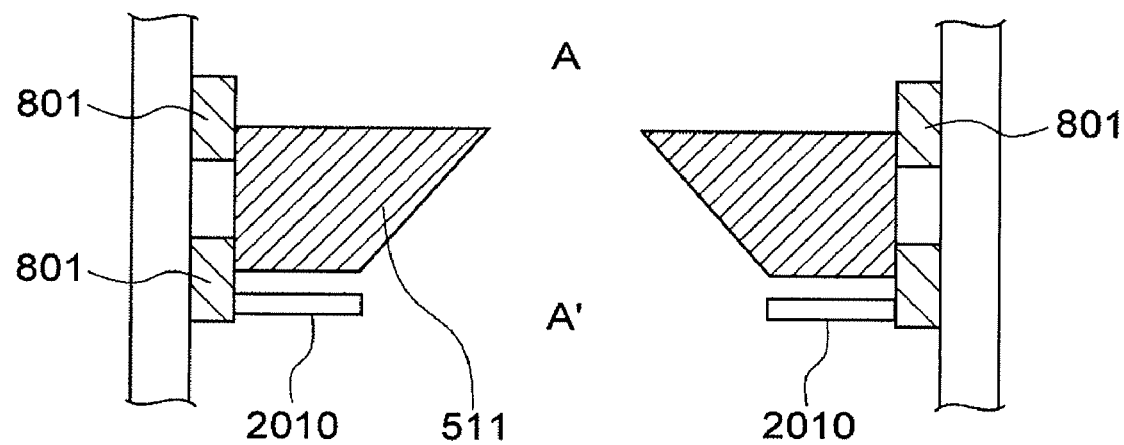
FIG. 47 is a sectional view showing an outline of a lens according to another embodiment of the present invention.
Figure 48:
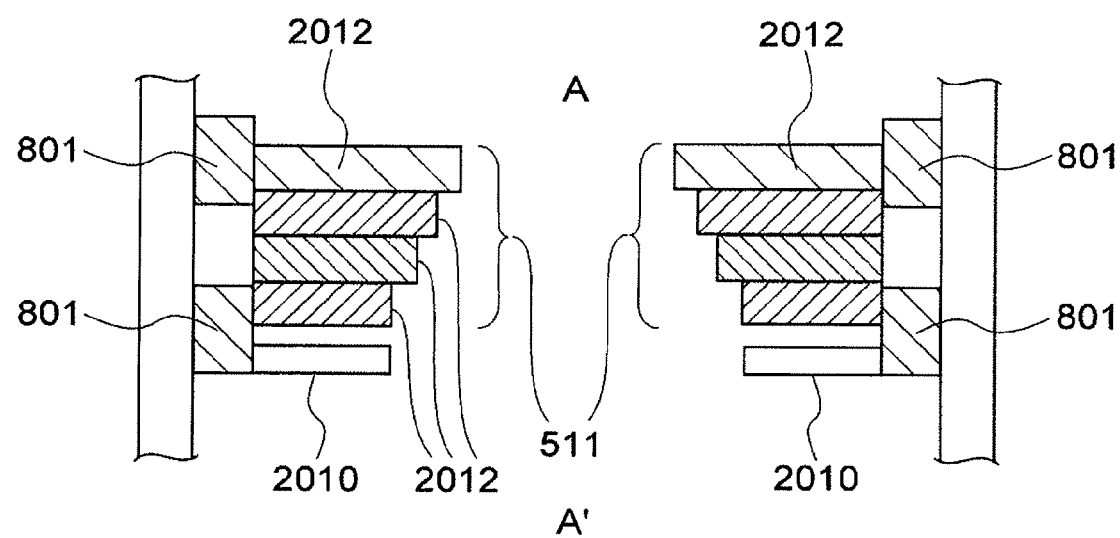
FIG. 48 is a sectional view showing an outline of a lens according to another embodiment of the present invention.

As shown in FIG. 47, a lens 511 according to another embodiment may be composed of a ring member 511 whose inner diameter increases in the traveling direction of the electron beam. In this case, the inner diameter of the grounding member 2010 on the semiconductor wafer W side is nearly the same as the inner diameter of the bottom position of the ring member 511. The grounding member 2010 is not disposed on the electron gun side such that the distance between the source of the electron beam and the ring member 511 becomes as short as possible. In this structure, the efficiency of which the electron beam passes is improved. As shown in FIG. 48, a lens 511 according to another embodiment may be composed of a plurality of ring members 2012 whose inner diameters increase in the traveling direction of the electron beam. The lens 511 may be adequately structured in a combination of the disclosed technologies.

Figure 25:
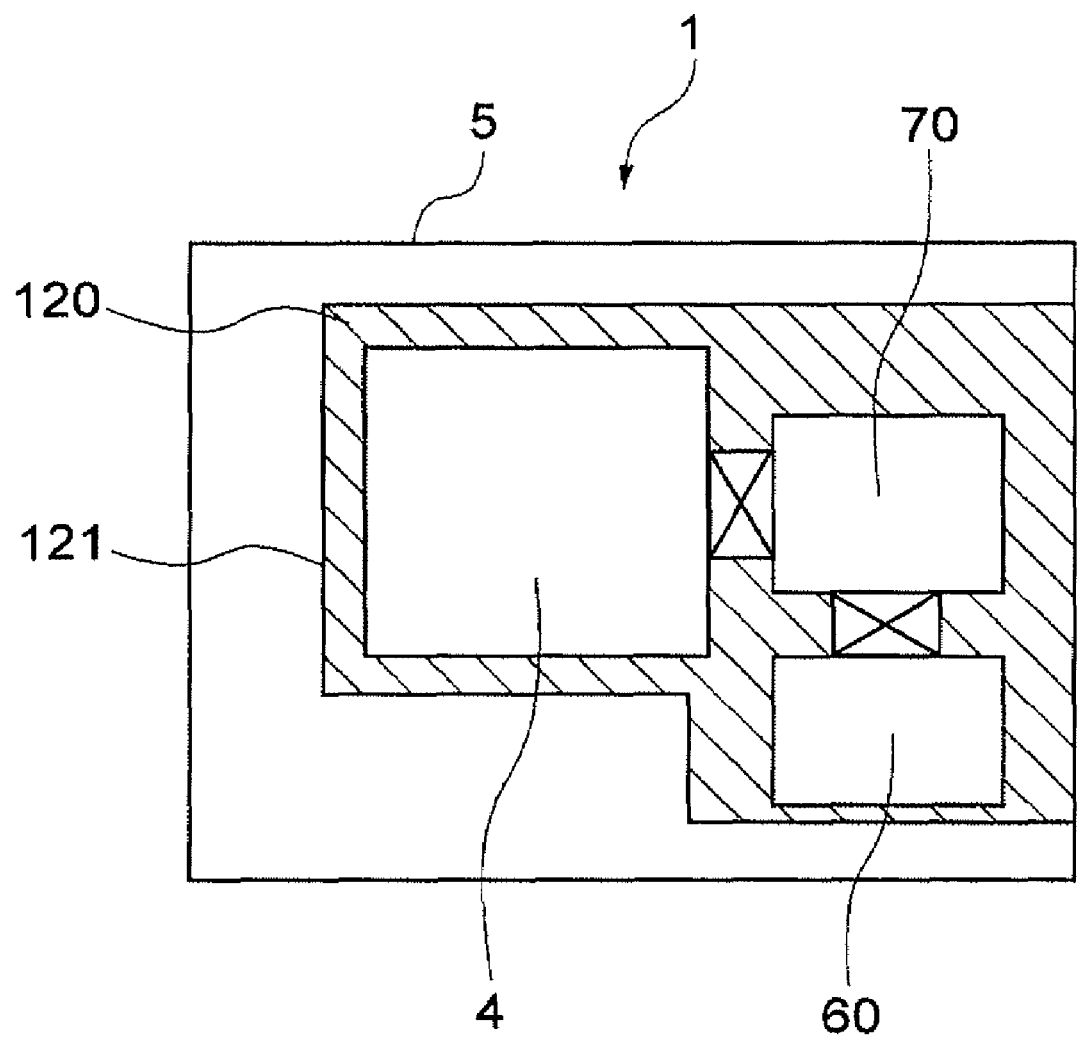
FIG. 25 is a plan view describing an outline of the structure of the substrate processing apparatus shown in FIG. 1.

With respect to a structure of suppressing the penetration of magnetism in the exposure processing chamber 4 that emits an electron beam to a semiconductor wafer W and performs the exposure process for a semiconductor wafer W, as shown in FIG. 25, the exposure processing chamber 4, the reduced pressure conveying chamber 70, and the vacuum preparation chamber 60 are surrounded by a magnetism penetration suppressing mechanism, for example a magnetic shield member 121 such as a member made of a material such as permalloy, magnetic soft iron, magnetic steel iron, Sendust, or ferrite. In the exposure processing chamber 4, the reduced pressure conveying chamber 70, and the vacuum preparation chamber 60, an electron beam is affected by an external magnetism, for example it is deflected. Thus, the yield of semiconductor wafers W in the exposure process are affected. Although the whole apparatus may be surrounded by the magnetic shield member 121, in this case, the size of the apparatus will increase. Thus, this approach would be neither practical, nor economical. In addition, since the apparatus has magnetism generation sources such as a control device and so forth, it is preferred that the exposure processing chamber 4, the reduced pressure conveying chamber 70, and the vacuum preparation chamber 60 be covered by the magnetic shield member 121. Instead, only the exposure processing chamber 4 may be covered by the magnetic shield member 121. In this case, magnetism generated by the reduced pressure conveying chamber 70 and the vacuum preparation chamber 60 may not be sufficiently protected. Thus, it is necessary to cover at least the exposure processing chamber 4 and the reduced pressure conveying chamber 70 by the magnetic shield member 121. It is preferred that the exposure processing chamber 4, the reduced pressure conveying chamber 70, and the vacuum preparation chamber 60 be covered by the magnetic shield member 121.

Thus, an area 120 that is more than half of the floor area of the apparatus is covered by the magnetic shield member 121. In addition, it is preferred that the magnetic shield member 121 have a thickness and structure that allows the intensity of magnetic field inside the magnetic shield member 121 is half or less of the intensity of magnetic field outside the magnetic shield member 121 or the apparatus.

Figure 26:
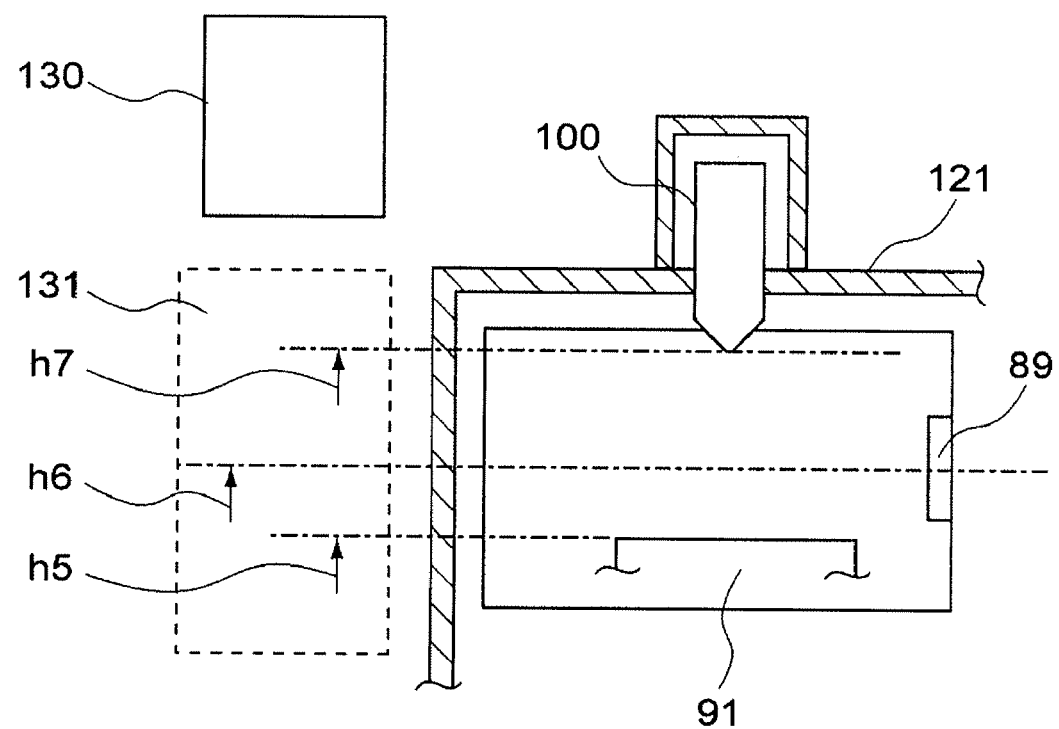
FIG. 26 is a sectional view describing an outline of the structure of the substrate processing apparatus shown in FIG. 1.

In addition, as shown in FIG. 26, as an example of magnetism generation sources, there is a power supply section as an energy source that generates an electron beam, for example an amplifier section 130. The amplifier section 130 is disposed opposite to the reduced pressure conveying chamber 70 of the exposure processing chamber 4. The height of the bottom position of the amplifier section 130 is greater than the height h5 of the holding surface of the semiconductor wafer W on the stage 91. Preferably, the height of the bottom position of the amplifier section 130 is greater than the height h6 of the loading openings 89 from which the semiconductor wafer W is loaded into the exposure processing chamber 4. More preferably, the height of the bottom position of the amplifier section 130 is greater than the height of radiation position h7 of an electron beam emitted from the column 100. This arrangement prevents an electron beam used for the exposure process from being adversely affected by electromagnetic waves emitted from the amplifier section 130.

A maintenance space section 131 is disposed below the amplifier section 130. The maintenance space section 131 allows a worker to maintain the exposure processing chamber 4 and so forth. Thus, not only influence of electromagnetic waves, but efficiency of a maintenance work is considered.

Since the space of the apparatus is effectively used, the size of the apparatus is downsized and the foot print thereof is decreased.

Figure 27:
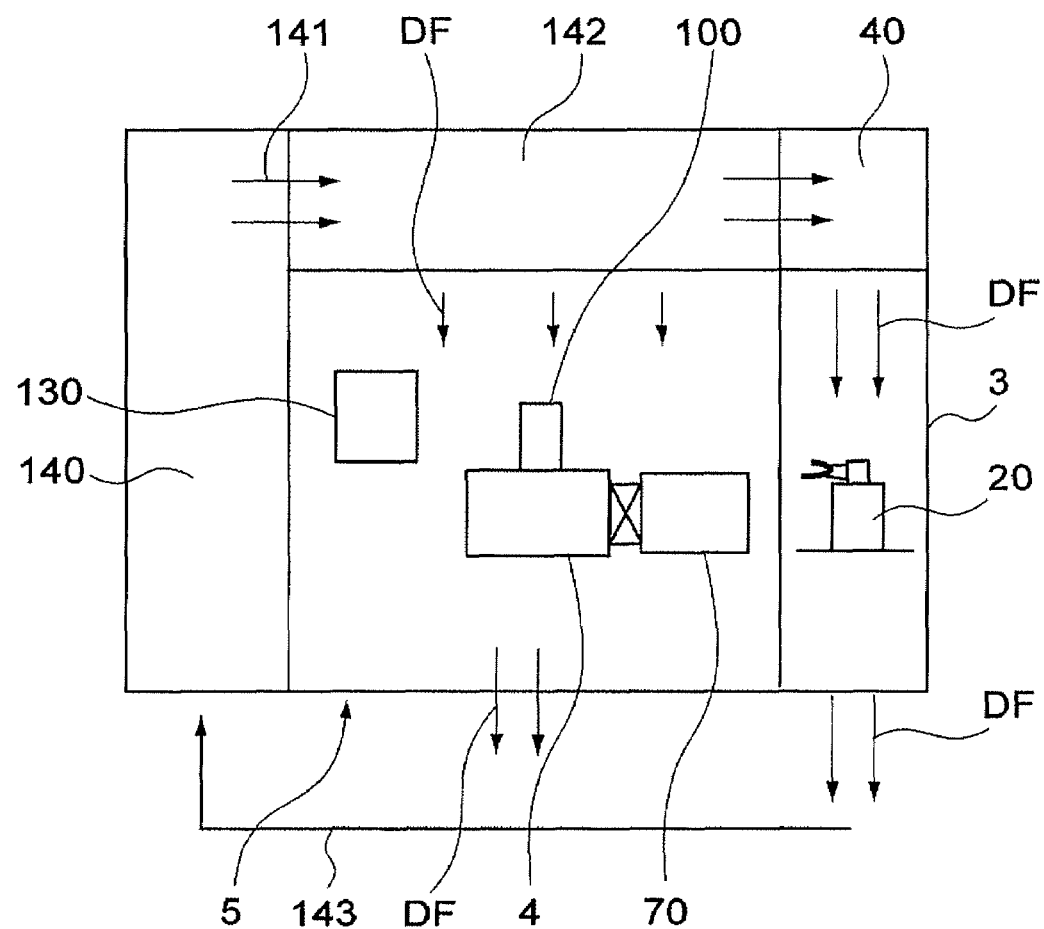
FIG. 27 is a sectional view describing an outline of the structure of the substrate processing apparatus shown in FIG. 1.

As shown in FIG. 27, a gas supplying mechanism 140 is disposed opposite to the atmospheric aligner section 3 of the exposure processing section 5. The gas supplying mechanism 140 supplies a gas, for example clean air to the whole apparatus. At least the temperature and humidity of the clean air are controlled. The gas supplying mechanism 140 also supplies clean air 141 to the FFU 40 through a gas flow path 142 disposed above the exposure processing section 5. In addition, the gas supplying mechanism 140 supplies the clean air 141 to the exposure processing section 5 through the gas flow path 142 at a predetermined flow rate so that a down-flow DF takes place in the exposure processing section 5. The clean air 141 is collected at lower positions of the exposure processing section 5 and the atmospheric aligner section 3. The collected clean air 141 is supplied to the gas supplying mechanism 140 through a gas collection path 143. As a result, a recycling system is effectively achieved.

Figure 28:
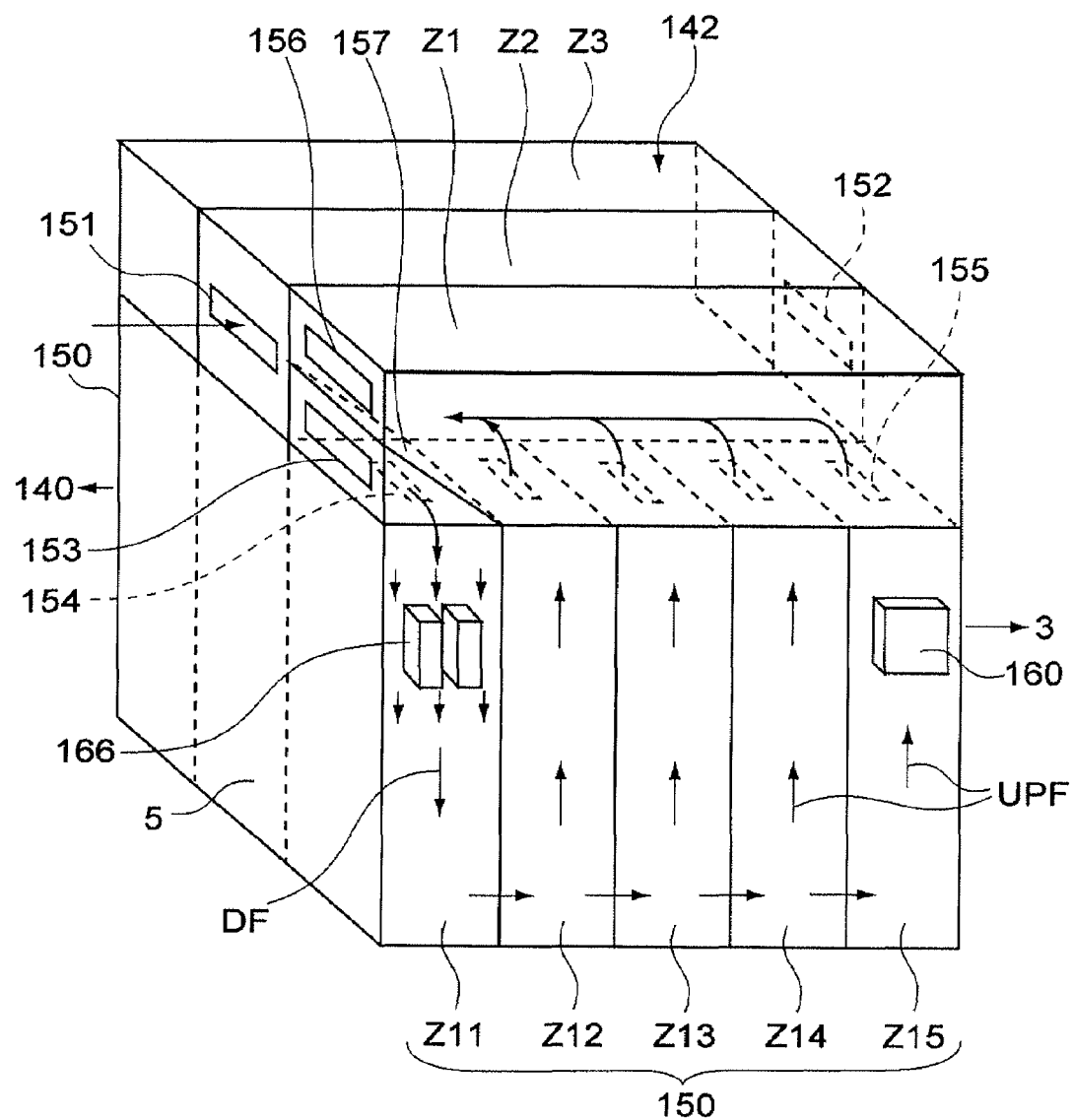
FIG. 28 is a perspective view describing an outline of the structure of the substrate processing apparatus shown in FIG. 1.

As shown in FIG. 28, the gas flow path 142 is divided into a plurality of zones Z1, Z2, and Z3. In addition, a plurality of air flow paths 150 are disposed on both wall sides of the exposure processing section 5. Each of the air flow paths 150 has a plurality of vertical zones Z11, Z12, Z13, Z14, and Z15. The zone Z2 of the gas flow path 142 has an air supplying opening 152 that is a flow path through which clean air supplied from the gas supplying mechanism 140 and taken from an air taking opening 151 is supplied to the exposure processing section 5 and the FFU 40.

The zone Z1 and the zone Z3 of the gas flow path 142 have an air supply opening 153 through which clean air is supplied from the gas supplying mechanism 140 to a flow path of at least one zone, for example the zone Z11 of the gas flow path 150. The supplied clean air is taken from a gas taking opening 154 disposed above a flow path of the zone Z11. The taken clean air forms a down-flow DF that flows downward as shown in FIG. 28. The down-flow DF is guided to flow paths of the zones Z12, Z13, Z14, and Z15 from a lower position of the flow path of the zone Z11. The guided clean air forms up-flows UPF in the plurality of zones Z12, Z13, Z14, and Z15 as shown in FIG. 28. All the up-flows UPF in the flow paths of the plurality of zones Z12, Z13, Z14, and Z15 are collected to the gas flow path 142 through gas collection openings 155. The collected air is supplied to the gas supplying mechanism 140 through a gas collection opening 156. As a result, a recycling system is effectively achieved.

Thus, a partition plate 157 as a gas separation member is disposed in the flow paths of the zones Z1 and Z3 so that a gas supply path of clean air to the zone Z11 and a gas collection path of clean air from the zones Z12, Z13, Z14, and Z15 are formed. Disposed in the follow path of the zone Z11 in which a down-flow is formed is a heat source, for example a control mechanism 166 of the exposure processing section 5. Disposed in the zone Z15 in which an up-flow UPF is formed is an operation mechanism of the control mechanism 166, for example an operation panel 160, whose heat generation is smaller than the control mechanism 166.

The magnetic shield prevents magnetism from entering into the inside of the apparatus. In addition, heat management is performed outside the magnetic shield. Thus, the whole system can be prevented from being environmentally affected. In addition, the system prevents itself from affecting the environment of the outside. Alternatively, a heat source may be provided to at least one of the up-flow UPF zones Z12, Z13, Z14, and Z15 and heat caused by the heat source may be actively collected, heat can be prevented from staying in the apparatus. As a result, the influence of heat against the processing chamber may be suppressed. Thus, the yield of semiconductor wafers W may be preferably improved.

Figure 29:
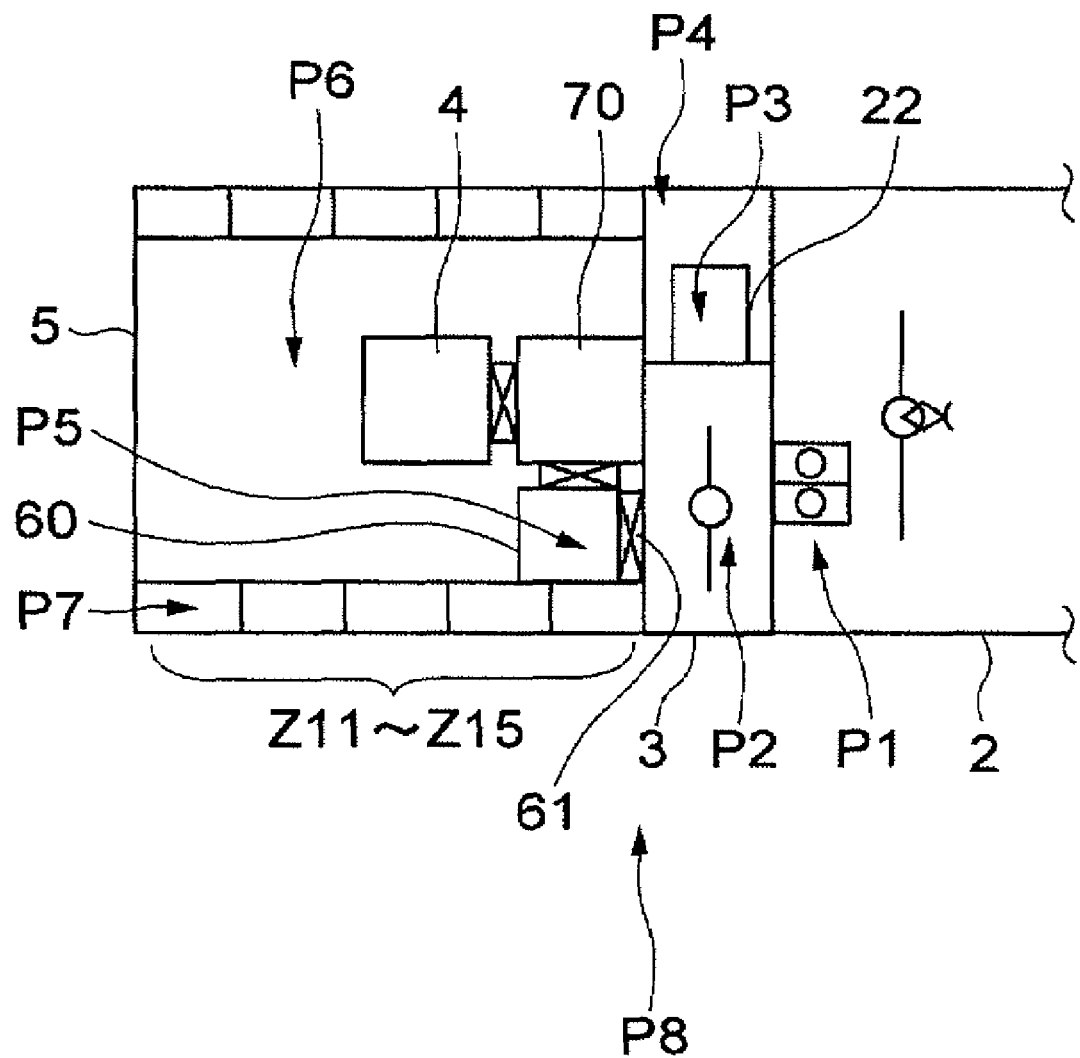
FIG. 29 is a plan view describing an outline of the structure of the substrate processing apparatus shown in FIG. 1.

With respect to the relationship of inner pressures of individual sections of the apparatus, as shown in FIG. 29, when the inner pressure of the resist processing device 2 is denoted by P1, the inner pressure of the atmospheric aligner section 3 is denoted by P2, the inner pressure of the heat processing section 22 is denoted by P3 (when heat processing section 22 has an opening and closing mechanism, it is open), the pressure in the space of the heat processing section 22 is denoted by P4 (clean air may be supplied from the gas supplying mechanism 140 or a down-flow may be formed by clean air supplied from the FFU 40), the inner pressure of the vacuum preparation chamber 60 is denoted by P5 (when an opening and closing mechanism 61 is open), the inner pressure of the exposure processing section 5 is denoted by P6, the inner pressure of the zones Z11, Z12, Z13, Z14, and Z15 is denoted by P7, and the inner pressure of the clean room in which the apparatus is disposed is denoted by P8, the conditions of P6>P2, P1>P2, P5>P2, P2>P4, P2>P3, and P6≧P7 are kept.

The conditions of P6>P2, P1>P2, and P5>P2 are kept because clean air is prevented from flowing from the atmospheric aligner section 3 to the processing chambers of the resist processing device 2 and the exposure processing section 5. As a result, the problem of cross contamination of the apparatus can be solved.

In addition, when the inner pressure P8 of the clean room is compared with the conditions of P6>P2, P1>P2, and P5>P2, the condition of P2>P8 is kept. Thus, air in the clean room is prevented from adversely affecting the process environment. Next, the relationship of P2>P4 and P2>3 will be described. As was described above, vented gas from the heat processing section 22 flows from the temperature adjustment mechanism side to the heat process mechanism side. These conditions prevent heat from affecting the conveying mechanism side. In addition, these conditions prevent particles that take place from a semiconductor wafer W for the heat process of the heat process mechanism from leaking into the conveying mechanism side. In addition, since there are heat generation sources such as a power supply section, a thermal process control mechanism, and so forth above the heat processing section, these conditions prevent heat from leaking into the conveying mechanism side. Of course, when the inner pressures of the resist processing device 2, and the exposure processing chamber 4, the atmospheric aligner section 3, and the atmospheric aligner section 3 are compared with the inner pressure of the clean room, the conditions of (P2, P4, P3)>P8 are kept. With respect to the relationship of P4 and P3, it is preferred that the condition of P3≧P4 is kept to prevent heat from affecting the heat processing section 22.

In addition, the condition of P6≧P7 is kept. This is because a down-flow is formed in the exposure processing section 5. However, since the processing chamber and so forth are disposed in the exposure processing section 5, a part of the down-flow bents horizontally. Although gas is collected downwardly, since gas is prevented from being agitated in the apparatus, it is preferred that the inner pressure of the zone Z15, P7, be lower than the inner pressure of the exposure processing section 5, P6, and that gas be collected on the side wall side even if gas leaks. In other words, even if a worker forgot to mount a panel in place during a maintenance work and a gap occurred, gas could be collected on the side wall side. When the inner pressure P6 of the exposure processing section 5 and the inner pressure P7 of the zones 11 to 15 are compared with the inner pressure P8 of the clean room the conditions of (P6, P7)>P8 are kept. Thus, air in the clean room can be prevent from adversely affecting the process environment.

With respect to the relationship of P5, P2, and P1, the conditions of P5≧P1>P2 are kept. These conditions prevent particles from entering into the vacuum preparation chamber 60. When the inner pressure of the atmospheric aligner section 3 is compared with the inner pressure P8 of the clean room, the condition of P2>P8 is kept.

With respect to the relationship of the inner pressure of the vacuum preparation chamber 60 (when the opening and closing mechanism 67 is open) and the inner pressure of the reduced pressure conveying chamber 70 (when the opening and closing mechanism 67is open), the condition of which the inner pressure of the vacuum preparation chamber 60 be equal to or greater than the inner pressure of the reduced pressure conveying chamber 70 is kept. Preferably, the condition of which the inner pressure of the vacuum preparation chamber 60 be greater than the inner pressure of the reduced pressure conveying chamber 70 is kept. With respect to the relationship of the inner pressure of the reduced pressure conveying chamber 70 (when an opening and closing mechanism 92 is open) and the inner pressure of the exposure processing chamber 4 (when the opening and closing mechanism 92 is open), the condition of which the inner pressure of the exposure processing chamber 4 be equal to or greater than the inner pressure of the reduced pressure conveying chamber 70 is kept. Preferably, the condition of which the inner pressure of the exposure processing chamber 4 be greater than the inner pressure of the reduced pressure conveying chamber 70 is kept. This condition allows particles that take place in the vacuum preparation chamber 60 to be collected by the reduced pressure conveying chamber 70 and prevents particles from entering into the exposure processing chamber 4.

Thus, in this condition, the yield of substrates under processing is improved. With respect to the relationship of the inner pressure of the reduced pressure conveying chamber 70 and the inner pressure of the vacuum preparation chamber 60, preferably, the conditions of which the inner pressure of the vacuum preparation chamber 60 is greater than the inner pressure of the exposure processing chamber 4, the inner pressure of the exposure processing chamber 4 is greater than the inner pressure of the reduced pressure conveying chamber 70 are kept.

With respect to inner temperatures, the condition of which the inner temperature of the resist processing device 2 is equal to or greater than the inner temperature of the atmospheric aligner section 3 is kept. Preferably, the condition of which the inner temperature of the resist processing device 2 is greater than the inner temperature of the atmospheric aligner section 3 is kept. As described above, the difference between the inner temperature of the atmospheric aligner section 3 and the inner temperature of the resist processing device 2 is small, for example from a fraction of 1° C. to 3° C., preferably, from 0.1 to 0.5° C. This condition prevents the resist film formed on a semiconductor wafer W from expanding and shrinking and thereby the accuracy of the exposure process from deteriorating. When a semiconductor wafer W is conveyed to the load lock (vacuum preparation chamber 60) with the temperature adjustment plate 27 whose temperature is slightly higher than the temperature of the upper portion of the stage 91, the decrease of the temperature of the semiconductor wafer W due to the vacuum venting of the load lock (vacuum preparation chamber 60) can be offset. In addition, the conditions of which the inner temperature of the atmospheric aligner section 3 is equal to the inner temperature of the exposure processing section 5 and the inner temperature of the exposure processing section 5 is equal to the inner temperature of the zones Z11, Z12, Z13, Z14, and Z15 are kept. In this description, the phrase "equal to" means "nearly" that implies an error within 3° C.

With respect to the relationship of inner humidities, the conditions of which the inner humidity of the atmospheric aligner section 3 is equal to the inner humidity of the exposure processing section 5, the inner humidity of the exposure processing section 5 is equal to the inner humidity of the zones Z11, Z12, Z13, Z14, and Z15, and the inner humidity of the zones Z11, Z12, Z13, Z14, and Z15 is equal to the inner humidity of the vacuum preparation chamber 60 (when the opening and closing mechanism 61 is open) are kept. In addition, the condition of which the inner humidity of the atmospheric aligner section 3 is equal to or greater than the inner humidity of the vacuum preparation chamber 60 (when the opening and closing mechanism 61 is open) is kept. Preferably, the condition of which the inner humidity of the atmospheric aligner section 3 is greater than the inner humidity of the vacuum preparation chamber 60 (when the opening and closing mechanism 61 is open) is kept. Thus, of course, the condition of which the inner humidity of the resist processing device 2 is greater than the inner humidity of the vacuum preparation chamber 60 (when the opening and closing mechanism 61 is open) is kept. This is because atmospheric pressure and reduced pressure take place in the vacuum preparation chamber 60. Thus, if moisture entered into the vacuum preparation chamber 60, the throughput of the pressure reduction would decrease. Thus, it is necessary to cause an inert gas, for example $N_2$, to flow from the vacuum preparation chamber 60 to the atmospheric aligner section 3.

Figure 30:
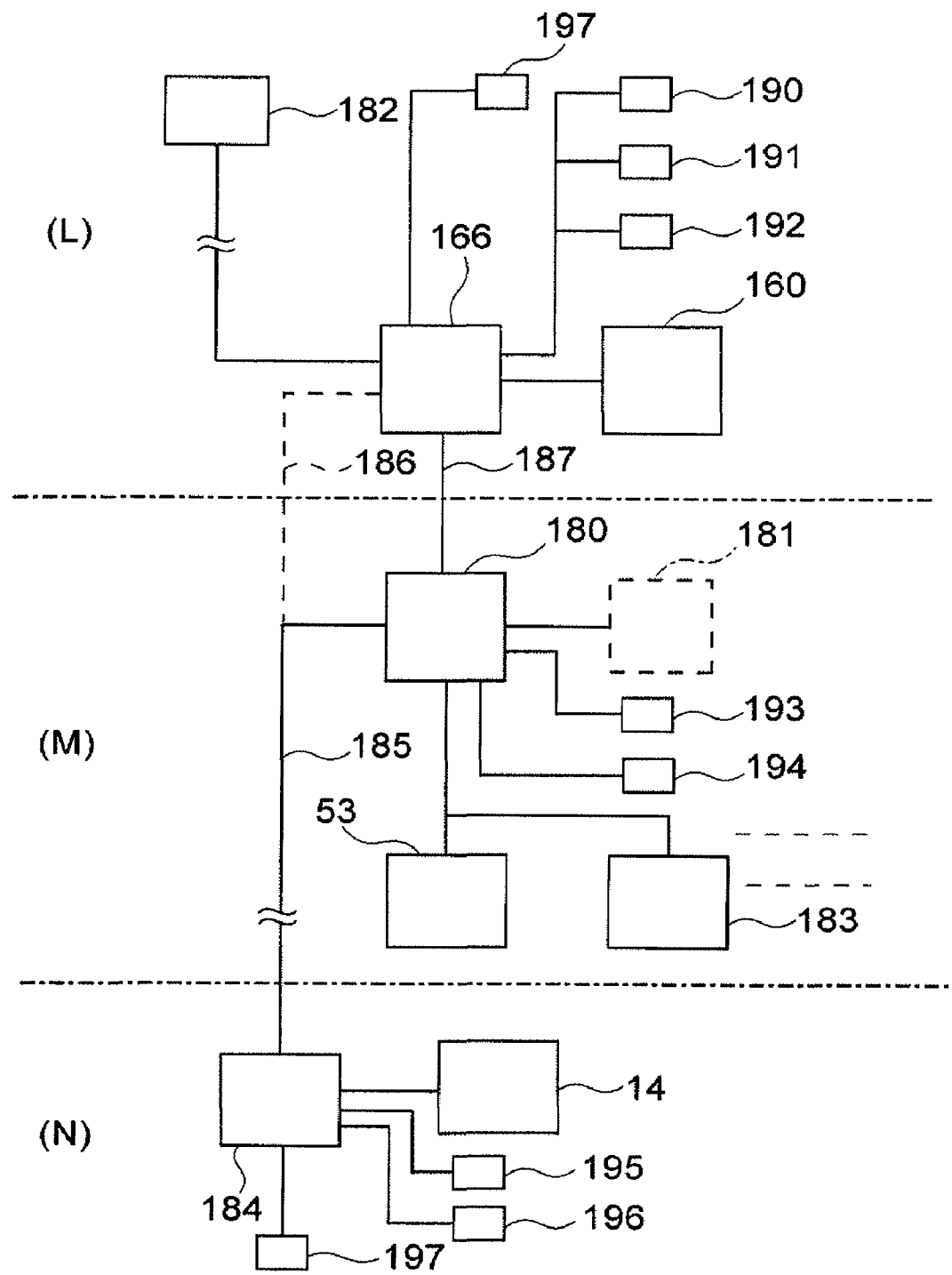
FIG. 30 is a schematic diagram describing an outline of the structure of a control system of the substrate processing apparatus shown in FIG. 1.

With respect to control signals and a control structure, as shown in FIG. 30, as described above, the control mechanism 166 is disposed in the exposure processing section 5. In addition, an operation mechanism 160 is disposed. The operation mechanism 160 has a display mechanism. The control mechanism 166 controls individual devices of the exposure processing section 5. The control mechanism 166 sends and receives signals to a management host computer (block L in FIG. 30) of the plant in which the apparatus is disposed. The atmospheric aligner section 3 has a control mechanism 180 that controls individual devices of the atmospheric aligner section 3. An operation mechanism 181 is connected to the control mechanism 180. The operation mechanism 181 has a display mechanism. The operation mechanism 181 may be shared by the operation mechanism 160. When necessary, if the atmospheric aligner section 3 is manufactured and sold as one independent unit or maintained, the operation mechanism 181 may be able to be freely connected to the atmospheric aligner section 3.

The control mechanism 180 sends and receives signals to and from the control mechanism 53 that controls the heat processing section as described above. In addition, the control mechanism 180 sends and receives signals to and from a control mechanism 183 that controls the conveying mechanism 20 (block M in FIG. 30). In addition, the control mechanism 180 sends and receives signals to and from a control mechanism 184 on the resist processing device 2 side through a signal line 185. The control mechanism 184 is connected to an operation panel 14. The operation panel 14 has a display mechanism. Signals that are sent and received to and from the resist processing device 2 are signals that cause a semiconductor wafer W to be transferred between the conveying mechanism 20 and the passing portion 10 and the receiving portion 11 of the resist processing device 2 and signals about atmospheric pressures in the resist processing device 2.

By sending a signal about the inner atmospheric pressure of the atmospheric aligner section 3 to the control mechanism 184 of the resist processing device 2 through the control mechanism 180, the atmospheric pressure may be checked mutually on the resist processing device 2 side and the atmospheric aligner section 3 side. The control mechanism 166 may control the atmospheric pressure of the whole apparatus based on the information. In the foregoing example, the control mechanism 180 and the control mechanism 184 were described. Instead, the control mechanism 166 may receive a signal from the control mechanism 184 through a signal line 186. The control mechanism 166 may send a control command to the control mechanism 180.

The control mechanism 166 and the control mechanism 180 send and receive signals through a signal line 187. Since the control mechanism 166 manages the whole apparatus, the control mechanism 166 can freely receive signals about the states of individual functions of the atmospheric aligner section 3 from the control mechanism 180. One of important signals that the control mechanism 166 sends to the control mechanism 180 is a signal that causes the control mechanism 180 to control the control mechanism 53 to start the heat process based on the start time or the end time of the exposure process for a semiconductor wafer W in the exposure processing chamber 4.

Since the state of a resist film formed on a semiconductor wafer W deteriorates with time, it is one of factors that cause the yield of semiconductor wafers W to decrease. Thus, the time management from exposure process to PEB heat process is important. Since the control mechanism 166 manages the whole exposure device, the yield of semiconductor wafers W is prevented from decreasing.

Since the state of a resist film formed on a semiconductor wafer W deteriorates with time, the control mechanism 184 on the resist processing device 2 side informs the control mechanism 180 of the end time of resist coating. In addition, the control mechanism 184 informs the control mechanism 166 of time information such as conveying time in the atmospheric aligner section 3. The control mechanism 166 causes the exposure processing chamber 4 to perform the exposure process for a semiconductor wafer W based on conveying times of a semiconductor wafer W and/or change factors of the state of a resist film formed on a semiconductor wafer W in the reduced pressure conveying chamber 70, the vacuum preparation chamber 60, and the exposure processing chamber 4. The control mechanism 180 manages times such as the start time for PEB heat process for a semiconductor wafer W that has been exposed based on change factors of the state of the resist film and the information received from the control mechanism 166.

After the PEB heat process has been completed, the control mechanism 180 sends information about transfer time for the resist processing device 2 and so forth to the control mechanism 184. The control mechanism 184 manages times for a semiconductor wafer W, for example the start time of the development process for a resist film formed on a semiconductor wafer W. Thus, a plurality of substrates can be prevented from becoming different in their processes. As a result, the yield of semiconductor wafers W can be improved. In the foregoing description, the control mechanism 180 was provided. Instead, of course, the control mechanism 166 may contain at least a part of the functions of the control mechanism 180. Their information is stored in a storage mechanism, for example a nonvolatile memory or a CD-R, of each control mechanism and can be freely displayed on a display mechanism of each operation mechanism.

The control mechanism 166 or the control mechanism 180 can send time information such as the end time of the PEB heat process in the atmospheric aligner section 3 and/or atmospheric information about the atmospheric aligner section 3 to the control mechanism 184. The control mechanism 184 can manage the development start time. As a result, the yield of semiconductor wafers W can be improved. In addition, the control mechanism 166 or the control mechanism 180 receives information about the time at which the resist solution was coated on a semiconductor wafer W, information about the time at which the heat process was performed after coating of the resist solution, information about the heat process and manages the start time for the exposure process.

Connected to the control mechanism 166 are a pressure detection mechanism, for example a pressure sensor 190, that detects the pressure of a predetermined portion of the exposure processing chamber 5, a pressure detection mechanism, for example a pressure sensor group 191, that detects pressures of predetermined portions of the zones Z11, Z12, Z13, Z14, and Z15, and a pressure detection mechanism, for example a pressure sensor 192, that detects the pressure of a predetermined portion of the vacuum preparation chamber 60.

Connected to the control mechanism 180 are a pressure detection mechanism, for example a pressure detection sensor 193, that detects the pressure of a predetermined portion of the atmospheric aligner section 3, and a chemical detection mechanism 194 that detects a chemical component, for example ammonia or the like, of a predetermined portion of the atmospheric aligner section 3. Connected to the control mechanism 184 are a pressure detection mechanism, for example a pressure sensor 195 that detects the pressure of a predetermined section of the resist processing device 2, and a chemical detection mechanism 196 that detects a chemical component, for example ammonium, of a predetermined section of the resist processing device 2.

Connected to the control mechanism 166 and/or the control mechanism 184 is a pressure detection mechanism, for example a pressure sensor 197, that detects the pressure outside the apparatus, for example the inner pressure of the clean room in which the apparatus is disposed. In such a manner, the pressure and so forth of the individual sections can be monitored. Since a chemical component that is present in the process section of the resist processing device 2 is one of factors that adversely affect the process of a semiconductor wafer W, the chemical detection mechanisms in the resist processing device 2 and the atmospheric aligner section 3 monitor a chemical component that is present therein. Thus, a chemical component needs to be monitored not only in the resist processing device 2, but in the atmospheric aligner section 3.

The substrate processing apparatus according to this embodiment is structured as described above. Next, operations for processes of a semiconductor wafer W will be described.

First, the coating device (coater COT) of the resist processing device 2 coats resist solution on the process surface of a semiconductor wafer W. Thereafter, a heating process is performed for the semiconductor wafer W at a predetermined temperature. Thereafter, the temperature of the semiconductor wafer W is adjusted to nearly the same temperature as the inner temperature of the resist processing device 2. Thereafter, the semiconductor wafer W is conveyed to the alignment mechanism 15. The alignment mechanism 15 aligns the semiconductor wafer W (this operation is referred to as the first alignment of the resist processing device 2). Thereafter, the semiconductor wafer W is conveyed to the passing portion 10 by the conveying mechanism 12. The passing portion 10 aligns the semiconductor wafer W by physically placing the semiconductor wafer W in a predetermined position (this operation is referred to as the second alignment of the resist processing device 2). After the control mechanism 184 has checked the presence or absence of a semiconductor wafer W at the passing portion 10 with a sensor, the control mechanism 184 sends a "conveyance ready completion" signal to the control mechanism 166 and/or the control mechanism 180.

When the control mechanism 166 and/or the control mechanism 180 has received the "conveyance ready completion" signal, the semiconductor wafer W is received from the passing portion 10 by the conveying mechanism 20. Thereafter, the control mechanism 166 and/or the control mechanism 180 checks the presence or absence of the semiconductor wafer W with a sensor of the conveying mechanism 20 and then sends a "conveyance completion" signal to the control mechanism 184. During this operation, the semiconductor wafer W is conveyed to the alignment mechanism 21 by the conveying mechanism 20. The alignment mechanism 21 aligns the semiconductor wafer W (this operation is referred to as the alignment of the atmospheric aligner section 3). During the conveying operation, the temperature of the semiconductor wafer W is adjusted to nearly the same temperature as the inner temperature of the resist processing device 2 or to a lower temperature than the inner temperature of the resist processing device 2 with the inner temperature of the atmospheric aligner section 3.

Thereafter, the semiconductor wafer W is conveyed to the vacuum preparation chamber 60, which is a substrate loading and unloading section of the exposure processing section 5, by the conveying mechanism 20. The vacuum preparation chamber 60 is vented so that a positive pressure higher than the inner atmospheric pressure of the atmospheric aligner section 3 becomes a predetermined reduced pressure (this reduced pressure is the same as the pressure at which the semiconductor wafer W is transferred to the reduced pressure conveying chamber 70, which will be described later. When the inner pressure of the vacuum preparation chamber 60 is slightly lower than the inner pressure of the reduced pressure conveying chamber 70, particles can be prevented from entering into the reduced pressure conveying chamber 70). After the vacuum preparation chamber 60 has been vented or while it is being vented, the state of the semiconductor wafer W is detected by a plurality of CCD cameras 65 (position detection step). Thereafter, the opening and closing mechanism 67 is opened. Thereafter, the semiconductor wafer W is conveyed from the vacuum preparation chamber 60 to the reduced pressure conveying chamber 70 by the conveying mechanism 72 of the reduced pressure conveying chamber 70. Thereafter, the opening and closing mechanism 67 is closed.

Thereafter, the vacuum pump 83 is driven so that the inner pressure of the reduced pressure conveying chamber 70 is nearly the same as the inner pressure of an exposure processing section 90 (the inner pressure of the reduced pressure conveying chamber 70 may be slightly lower than the inner pressure of the exposure processing section 90 so as to prevent particles from entering into the exposure processing section 90). Thereafter, the opening and closing mechanism 92 is opened. The conveying mechanism 72 adjusts the angle of approach of the semiconductor wafer W to the exposure processing section 90 corresponding to position data detected by the CCD cameras 65. Before or after the semiconductor wafer W is conveyed, the stage 91 of the exposure processing section 90 is moved to an expected transfer position at which the semiconductor wafer W is transferred to the conveying mechanism 72 (this operation is referred to as the first alignment of the exposure processing section 5).

The semiconductor wafer W is placed on a support mechanism disposed in the stage 91. The support mechanism supports the rear surface of the semiconductor wafer W. The support mechanism receives the semiconductor wafer W from the conveying mechanism 72 by raising a plurality of support pins. The support mechanism places the semiconductor wafer W on an insulation portion 299 of the static electricity chuck mechanism 110 by lowering the support pins. While or after the semiconductor wafer W is placed on the insulation portion 299, the conveying mechanism 72 retreats from the exposure processing section 90. Thereafter, the opening and closing mechanism 92 is closed.

Next, the semiconductor wafer W is placed on the insulation portion 299 of the static electricity chuck mechanism 110. Thereafter, the conductive needle 305 is moved and contacted to the predetermined film on the process surface of the semiconductor wafer W by the raising and lowering mechanism 306. Thereafter, the semiconductor wafer W is electrostatically sucked by the static electricity chuck mechanism 110. Thereafter, the conductive needle 303 is moved and contacted to the predetermined film on the rear surface of the semiconductor wafer W by the raising and lowering mechanism 304 as a conveying mechanism. Thereafter, electric charges on the semiconductor wafer W are discharged such that they becomes lower than a predetermined value.

Thereafter, the mark detection mechanism 105 of the exposure processing section 90 detects an alignment mark on a semiconductor wafer W held by the static electricity chuck mechanism 110 on the stage 91. The stage 91 is moved on the X and Y axes corresponding to the detected data. Finally, the semiconductor wafer W is aligned (this operation is referred to as the second alignment of the exposure processing section 5). After this alignment, an exposure process is performed, namely an electron beam is emitted from the column 100 to the resist film formed on the semiconductor wafer W at an acceleration voltage in the range from 1 kV to 60 kV, preferably in the range from 1 kV to 10 kV, more preferably 5 kV so that a predetermined pattern is formed on the semiconductor wafer W. It is preferred that the acceleration voltage of the electron beam be set so that the electron beam acts on the resist film formed on the semiconductor wafer W. It is necessary to prevent electrons of the electron beam emitted to silicon (Si), which is the base material of the semiconductor wafer W, from diffusing. In addition, while the semiconductor wafer W is being exposed, the first conductive film of the space portion of each of the static electricity deflecting devices in the column 100 is grounded.

After the exposure process, the stage 91 is moved to the transfer position of the semiconductor wafer W to the conveying mechanism 72. First, the voltages applied to the first electrode 300 and the second electrode 301 are turned off. Thereafter, the switches SW2 and SW5 are turned on. The current value of the leak current that flows in the conductive needle 303 and/or the conductive needle 305 is measured. When the current value is out of the predetermined allowable range, the predetermined voltage is applied to the conductive needle 303 and/or the conductive needle 305 at least one time or the error process is performed. When the determined result indicates that the current value of the leak current is in the predetermined range, after it is checked that the conductive needle 305 and the conductive needle 303 are kept apart from the semiconductor wafer W, the semiconductor wafer W is kept apart from the static electricity chuck mechanism 110.

Thereafter, the semiconductor wafer W is unloaded from the exposure processing chamber 4 by the conveying mechanism 72.

Thereafter, the semiconductor wafer W is loaded into the vacuum preparation chamber 60 by the conveying mechanism 72. Next, the semiconductor wafer W is unloaded from the vacuum preparation chamber 60 by the conveying mechanism 20. The semiconductor wafer W is conveyed to the temperature adjustment plate 27 of the heat processing section 22 by the conveying mechanism 20. The semiconductor wafer W is held on the temperature adjustment plate 27 or by the conveying mechanism 20 for a predetermined period of time (this period of time is constant for each of the plurality of semiconductor wafers W) based on information that the control mechanism 166 has calculated corresponding to the end time of the exposure process and a period of time for which the semiconductor wafer W has been placed in reduced pressure. Thereafter, the semiconductor wafer W is placed on the heating plate 26. The heating plate 26 performs a heat process for the semiconductor wafer W. Since the period of time for which the heat process is started needs to be constant for each of the plurality of semiconductor wafers W, it is necessary to manage the period of time for which the semiconductor wafer W is conveyed from the temperature adjustment plate 27 to the heating plate 26. When the semiconductor wafer W is held by the conveying mechanism 20, it is necessary to manage the period of time for which the semiconductor wafer W is conveyed from the conveying mechanism 20 to the temperature adjustment plate 27 and the period of time for which the semiconductor wafer W is conveyed from the temperature adjustment plate 27 to the heating plate 26.

The semiconductor wafer W for which the heat process has been performed at the predetermined temperature is transferred to the temperature adjustment plate 27. Thereafter, the semiconductor wafer W is transferred from the temperature adjustment plate 27 to the conveying mechanism 20. Thereafter, the semiconductor wafer W is unloaded from the heat processing section 22 by the conveying mechanism 20. Thereafter, the semiconductor wafer W is temporarily aligned by the alignment mechanism 21 and then conveyed to the receiving portion 11 of the resist processing device 2. Instead, the semiconductor wafer W may be directly conveyed to the receiving portion 11 of the resist processing device 2. When the semiconductor wafer W is conveyed, the control mechanism 180 and/or the control mechanism 166 needs to ask the control mechanism 184 whether the receiving portion 11 has a semiconductor wafer W. Only when the control mechanism 180 and/or the control mechanism 166 has checked that the receiving portion 11 does not have a semiconductor wafer W, the conveying mechanism 20 conveys the semiconductor wafer W to the receiving portion 11. Before or after the semiconductor wafer W is conveyed to the receiving portion 11, the control mechanism 180 and/or the control mechanism 166 sends information about the semiconductor wafer W and information about the end time of the process of the heating plate 26 to the control mechanism 184.

The control mechanism 184 manages time information about individual sections of the apparatus corresponding to information received from the control mechanism 180 and/or the control mechanism 166 and conveys the semiconductor wafer W to the developing device (developer (DEV)). The developing device performs a developing process for the semiconductor wafer W. Thereafter, a sequence of operations is completed.

Figure 31:
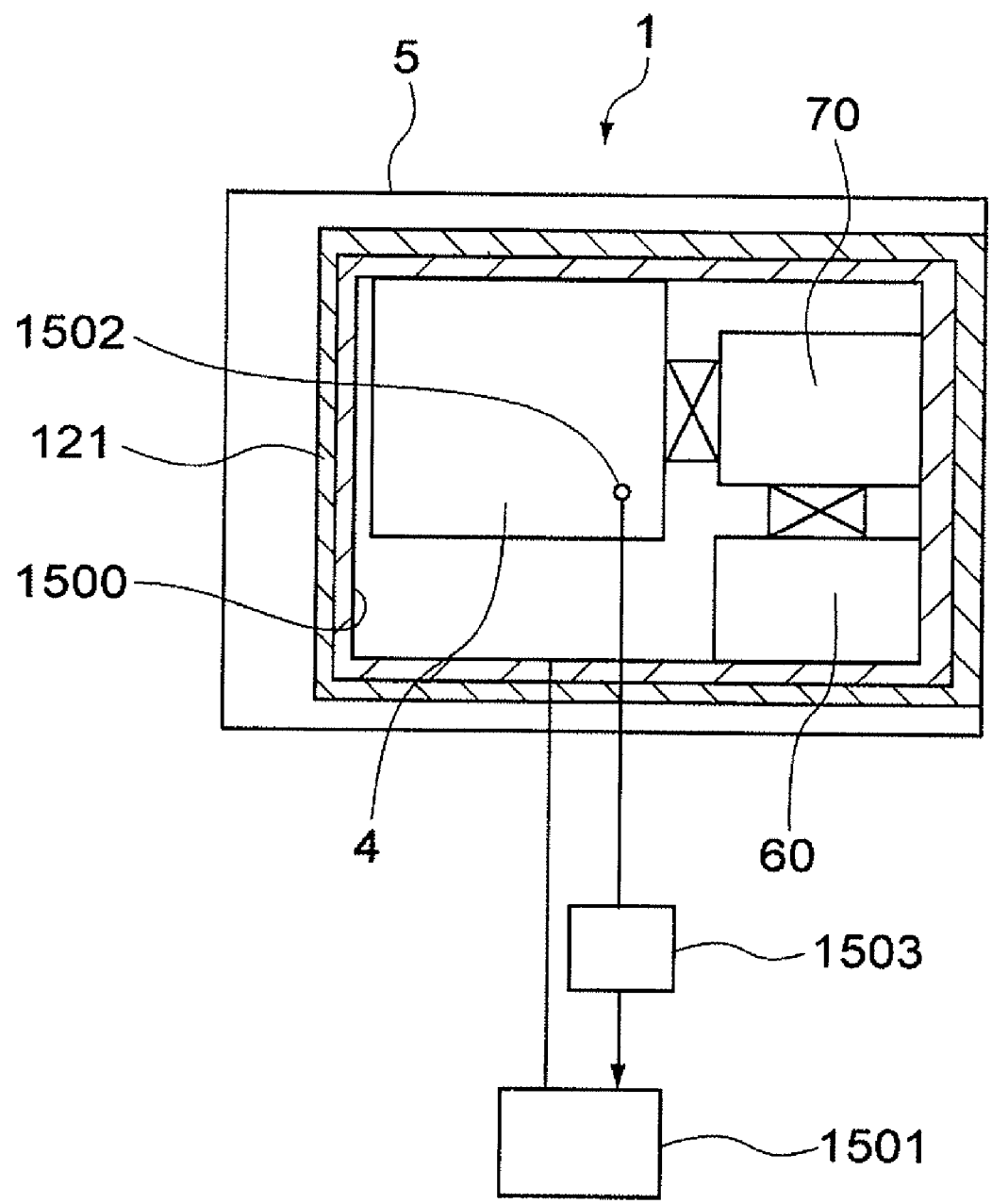
FIG. 31 is a plan view showing the structure of a substrate processing apparatus according to another embodiment of the present invention.

Next, with reference to FIG. 31, a substrate processing apparatus according to another embodiment of the present invention will be described. In FIG. 31, similar portions to those of the foregoing embodiment will be denoted by similar reference numerals and their description will be described. As shown in FIG. 31, six surfaces, which are an upper surface, a lower surface, a left surface, a right surface, a front surface, and a rear surface of each of an exposure processing chamber 4, a reduced pressure conveying chamber 70, and a vacuum preparation chamber 60 are covered by a magnetism penetration suppressing mechanism (first magnetic shield), for example a magnetic shield member 121 that non-magnetically shields a member made of for example permalloy, magnetic soft iron, magnetic steel iron, Sendust, or ferrite. As described above, the exposure processing chamber 4 is covered by the magnetic shield member 121 because an electron beam is deflected by magnetism. Thus, the magnetism shield member 121 prevents the yield of the exposure process for a semiconductor wafer W from lowering. Although the whole apparatus may be covered by the magnetism shield member 121, since the apparatus becomes large, such a method is neither practical, nor economical. In addition, since the apparatus has a magnetic generation source such as a control device, it is preferred that the exposure processing chamber 4, the reduced pressure conveying chamber 70, and the vacuum preparation chamber 60 be covered by the magnetism shield member 121. Although only the exposure processing chamber 4 may be covered by the magnetism shield member 121, magnetism generated by the reduced pressure conveying chamber 70 and the vacuum preparation chamber 60 cannot be effectively prevented. Thus, it is necessary to cover at least the exposure processing chamber 4 and the reduced pressure conveying chamber 70 by the magnetism shield member 121. It is preferred that the exposure processing chamber 4, the reduced pressure conveying chamber 70, and the vacuum preparation chamber 60 be covered by the magnetism shield member 121. In addition, to downsize the system, it is more preferred that only the exposure processing chamber 4 be covered by the magnetism shield member 121.

Disposed inside the magnetic shield member 121 is a magnetism penetration suppressing mechanism (second magnetic shield), for example a magnetic shield member 500, that electromagnetically shields the inside. The magnetic shield member 1500 is for example Helmholtz coils. The Helmholtz coils are disposed on the six inner surfaces, which are an upper surface, a lower surface, a left surface, a right surface, a front surface, and a rear surface of the magnetism shield member 121. A power supply 1501 is connected to each surface of the magnetic shield member 1500 so that a current having a predetermined current value and a predetermined frequency flows in each surface. Disposed at a predetermined position of an inner area of the magnetic shield member 1500 is a magnetic sensor 1502 that measures magnetism. Based on the measured result of the magnetic sensor 1502, a control mechanism 1503 controls the power supply 1501 for a current value, frequency, and current direction for the current that flows in the magnetic shield member 1500 so as to control a magnetic field generated in an inner area of the magnetic shield member 1500.

In this structure, the exposure processing chamber 4 can be prevented from being affected by a magnetic field generated by an external device. Thus, the throughput of the exposure process can be improved. In addition, although the magnetic shield member 1500 generates a magnetic field that varies, since the magnetic shield member 1500 is covered by the magnetic shield member 121, the magnetic shield member 1500 does not magnetically affect the outside of the apparatus. Thus, the intensity of the magnetic field in the exposing device 1 is half or less of that of the outside thereof.

Like the foregoing amplifier section 130, the power supply 1501 is disposed opposite to the reduced pressure conveying chamber 70 of the exposure processing chamber 4. The height of the power supply 1501 is greater than the height h5 of the holding surface of a semiconductor wafer W on the stage 91. Preferably, the height of the power supply 1501 is greater than the height h6 of a loading openings 89 as a conveying opening for the semiconductor wafer W of the exposure processing chamber 4. More preferably, the height of the power supply 1501 is greater than the height h7 of an electron beam emitted from a column 100. Otherwise, an electromagnetic wave generated from the power supply 1501 affects an electron beam.

It is preferred that the magnetic sensor 1502 be disposed outside the exposure processing chamber 4 or at a predetermined position of the inside of the exposure processing chamber 4. As long as a semiconductor wafer W exposed in the exposure processing chamber 4 is prevented from being magnetically affected, the magnetic sensor 1505 may be disposed anywhere outside the exposure processing chamber 4 or at a predetermined position of the inside of the exposure processing chamber 4. When the magnetic sensor 1502 cannot be disposed in the exposure processing chamber 4, data of magnetic field in the exposure processing chamber 4 and data of magnetic field shielded by the coils controlled by the control mechanism 1503 may be stored in a storage mechanism. Based on the relationship of the stored magnetic data and the magnetic sensor 1502 disposed outside the exposure processing chamber 4, the coils may be controlled.

Figure 32:
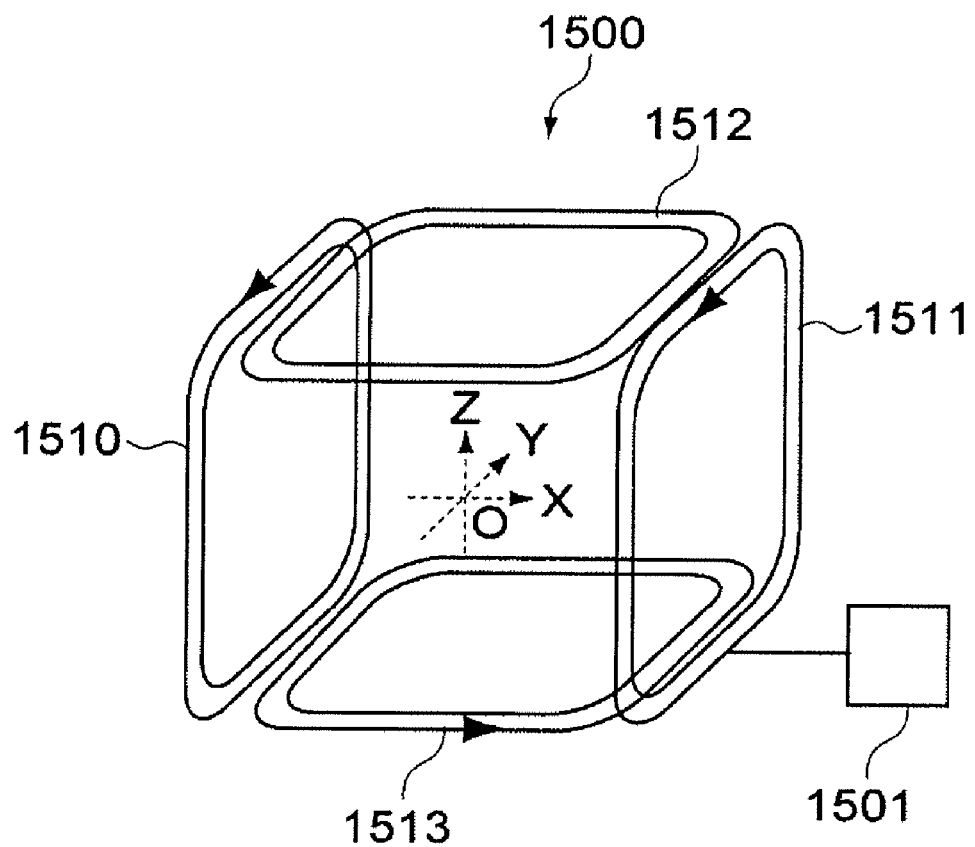
FIG. 32 is a perspective view showing an outline of the structure of Helmholtz coils shown in FIG. 31.

As shown in FIG. 32, with respect to controls of the Helmholtz coils 1500, a left coil 1510, a right coil 1511, an upper coil 1512, and a lower coil 1513 are disposed (for convenience, description of a front coil and a rear coil will be omitted). Currents that flow in the same direction (arrow directions in FIG. 37) are supplied from the power supply 1501 to a pair of coils that face each other, for example the left coil 1510 and the right coil 1511. Likewise, currents that flow in the same direction (arrow direction in FIG. 32) are supplied from the power supply 1501 to another pair of coils that face each other, for example the upper coil 1512 and the lower coil 1513. Of course, this applies to another pair that face each other, for example the front coil and the rear coil. However, with respect to frequency, current value, and/or DC (Direct Current component) value, it is preferred that the coils be controlled by the control mechanism 1503 in different condition, for example the frequency and/or current value of for example the left coil 1510 is different from that of the right coil 1511 or the frequency, current value, and/or DC value of the right coil 1511 and the left coil 1510 is different from that of the upper coil 1512 and the lower coil 1513 so that the magnetic field at a predetermined position, for example position 0, becomes a predetermined value, for example 0. In the foregoing description, for convenience, only the left coil 1510, the right coil 1511, the upper coil 1512, and the lower coil 1513 were controlled. However, of course, the coils including the front coil and the rear coil need to be properly controlled. These coils need to be controlled on the X, Y, and Z axes so that the magnetic field at the predetermined position 0 becomes a predetermined value.

When necessary, the Helmholtz coils 1500 need to be controlled based on electric charges that are present in the static electricity chuck and that are measured by an ammeter 320 of the static electricity chuck or pre-stored data. In addition, as described above, the Helmholtz coils 1500 generate a varying magnetic field. Thus, the Helmholtz coils 1500 may generate a magnetic field outside the apparatus. Thus, although the magnetic shield member 121 as a magnetic field suppressing mechanism prevents a magnetic field from entering into the apparatus, the magnetic shield member 121 also has a function as a mechanism that prevents a magnetic field of the Helmholtz coils 1500 from diffusing outside the apparatus.

Figure 33:
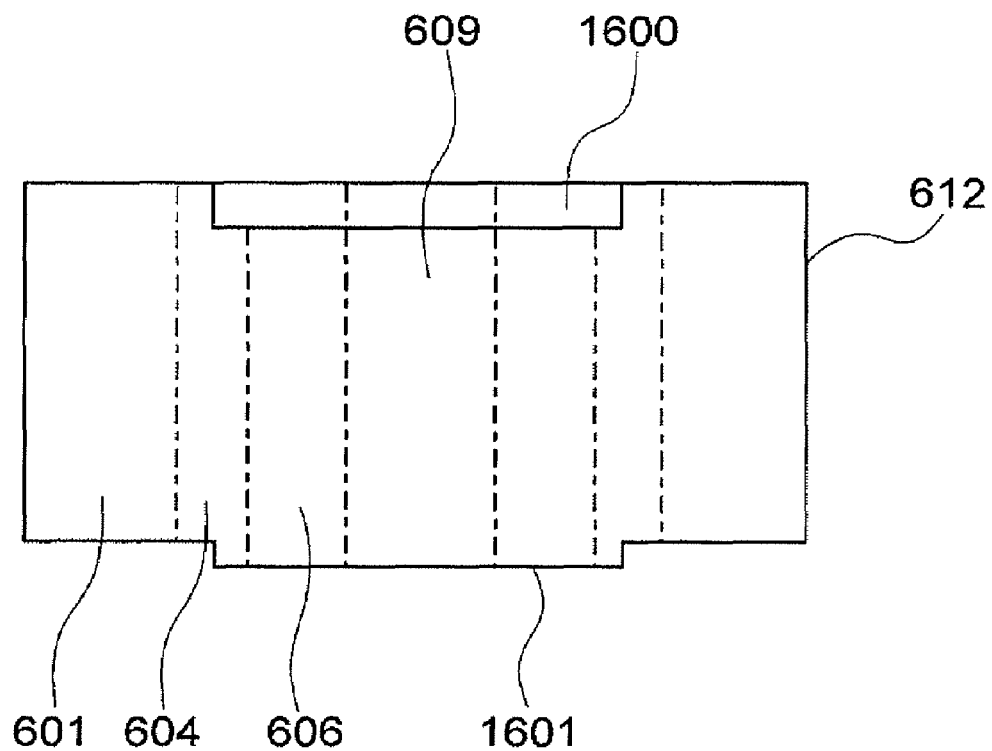
FIG. 33 is a sectional view describing an outline of a static electricity deflecting device according to another embodiment of the present invention.

Next, with reference to FIG. 33, a static electricity deflecting device according to another embodiment of the present invention will be described. For simplicity, in FIG. 33, similar portions to those of the foregoing embodiment will be denoted by similar reference numerals and their description will be omitted. As shown in FIG. 33, formed on an upper surface (an upper portion (an electron gun 501 side)) of a cylindrical member 612 of the static electricity deflecting device is a concave portion 1600 as a circular cutout portion. Formed on a lower surface (a lower portion of FIG. 33 (on a semiconductor wafer W side)) of the cylindrical member 612 of the static electricity deflecting device is a convex portion 1601 as a circular protrusion portion. In this structure, when two static electricity deflecting devices or a static electricity deflecting device and another member are stacked through a support member made of an insulative material, they can be easily aligned. As a result, maintenance work or mounting work can be quickly and efficiently performed. The concave portion 1600 and/or the convex portion 1601 is formed the middle of an middle layer 604 to an inner layer 606. Instead, the concave portion 1600 and/or the convex portion 1601 may be formed only in the inner layer 606.

Figure 34:
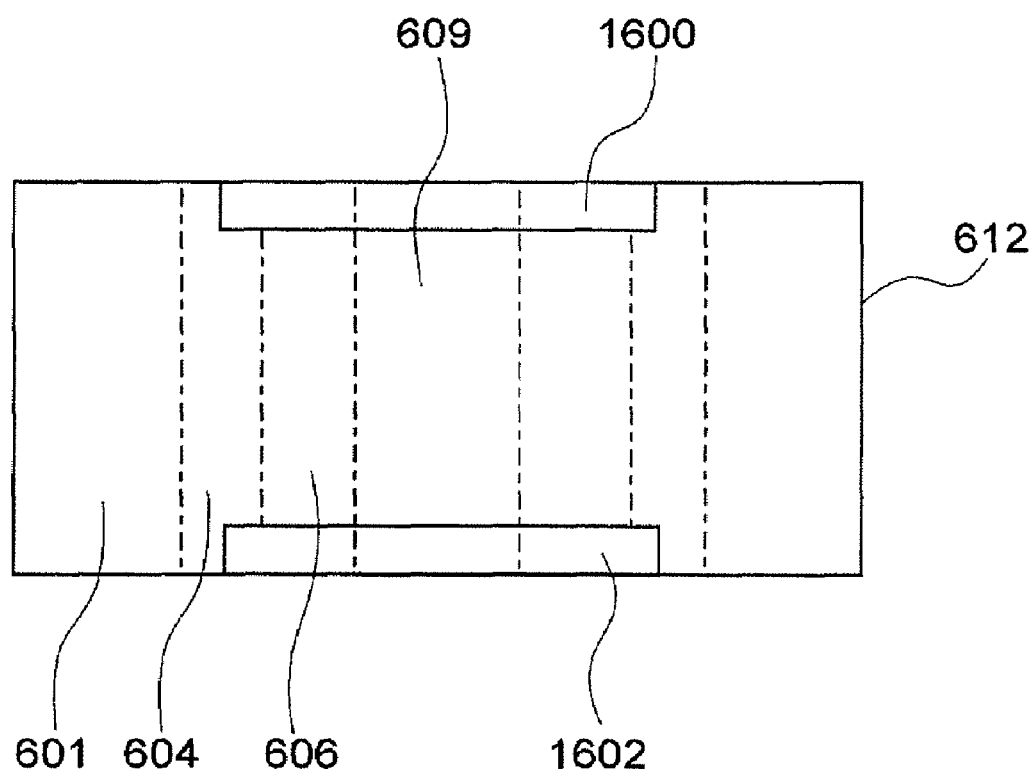
FIG. 34 is a sectional view describing an outline of a static electricity deflecting device according to another embodiment of the present invention.

Next, with reference to FIG. 34, a static electricity deflecting device according to another embodiment of the present invention will be described. For simplicity, in FIG. 34, similar portions to those of the foregoing embodiment will be denoted by similar reference numerals and their description will be omitted. As shown in FIG. 34, formed on an upper surface (an upper portion of FIG. 34 (on an electron gun 501 side)) of a cylindrical member 612 of the static electricity deflecting device is a first concave portion 1600 as a circular cutout portion. Formed on a lower surface (a lower portion of FIG. 34 (on a semiconductor wafer W side)) of the cylindrical member 612 is a second concave portion 1602 as a circular cutout portion. In this structure, when two static electricity deflecting devices or a static electricity deflecting device and another member are stacked through a support member made of an insulative material, they can be easily aligned. Thus, maintenance work or mounting work can be quickly and efficiently performed. The concave portions 1600 and 1602 are formed from the middle of a middle layer 604 to a inner layer 606. Instead, the concave portions 1600 and 1602 may be formed only in the inner layer 606.

Figure 35:
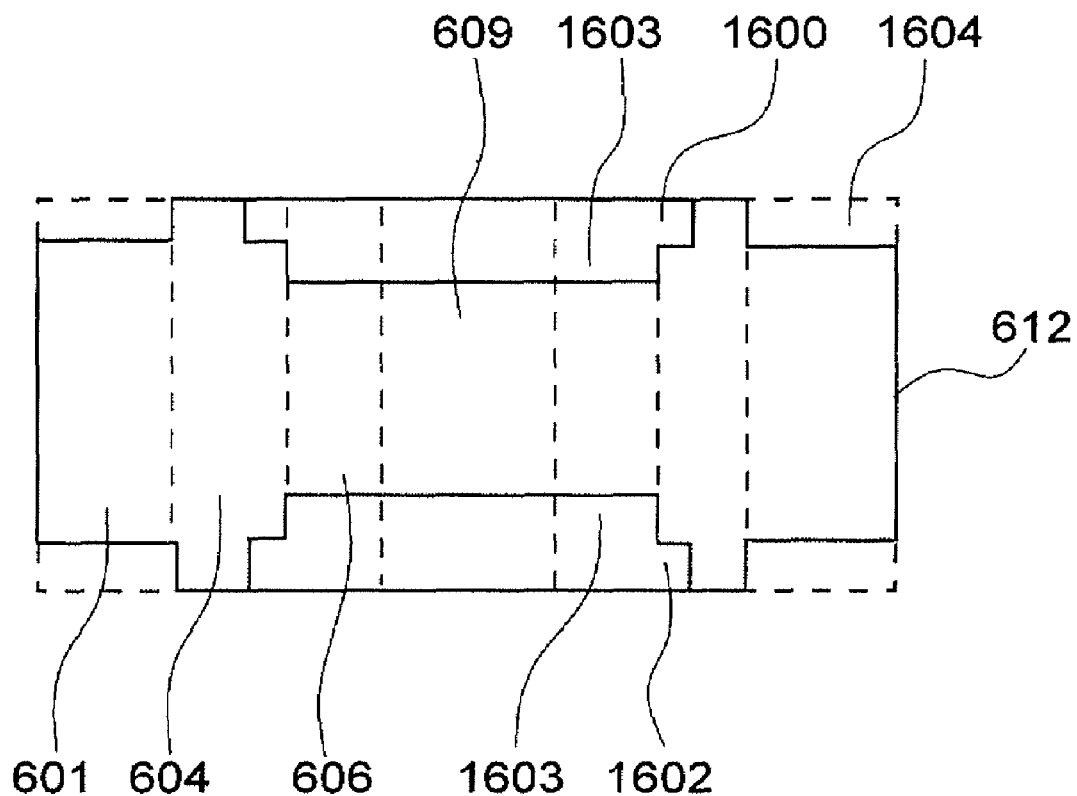
FIG. 35 is a sectional view describing an outline of a static electricity deflecting device according to another embodiment of the present invention.

Next, with reference to FIG. 35, a static electricity deflecting device according to another embodiment of the present invention will be described. For simplicity, in FIG. 35, similar portions to those of the foregoing embodiment will be denoted by similar reference numerals and their description will be omitted. As shown in FIG. 35, formed on an upper surface (an upper portion of FIG. 35 (on an electron gun 501 side)) of a cylindrical member 612 of the static electricity deflecting device is a first concave portion 1600 as a ring-shaped cutout portion. Formed on a lower surface (a lower portion of FIG. 35 (on a semiconductor wafer W side)) is a second concave portion 1602 as a cutout portion. Formed inside the concave portion 1600 and/or the second concave portion 1602 is a third concave portion 1603 as a circular cutout portion. Since only a middle layer 604 as an electrical insulator protrudes, when two static electricity deflecting devices are stacked, since only their middle layers 604 contact, a support member made of an insulator can be omitted. Thus, the system can be efficiently structured. In addition, formed on an outer layer 601 is a fourth concave portion 1604 as a ring-shaped cutout portion. In this structure, the static electricity deflecting device can be easily supported by a support member made of an insulative material from an outer circumference of the static electricity deflecting device. The concave portions 1600, 1602, and 1603 are formed from the middle of a middle layer 604 to an inner layer 606. Instead, the concave portions 1600, 1602, and 1603 may be formed only in the inner layer 606. In these embodiments, various convex portions and/or concave portions are formed on the upper surface and/or the lower surface of the static electricity deflecting device. Instead, convex portions and/or concave portions may be formed in various combinations on the upper surface and/or the lower surface of the static electricity deflecting device such that static electricity deflecting devices efficiently mounted and/or aligned.

Figure 36:
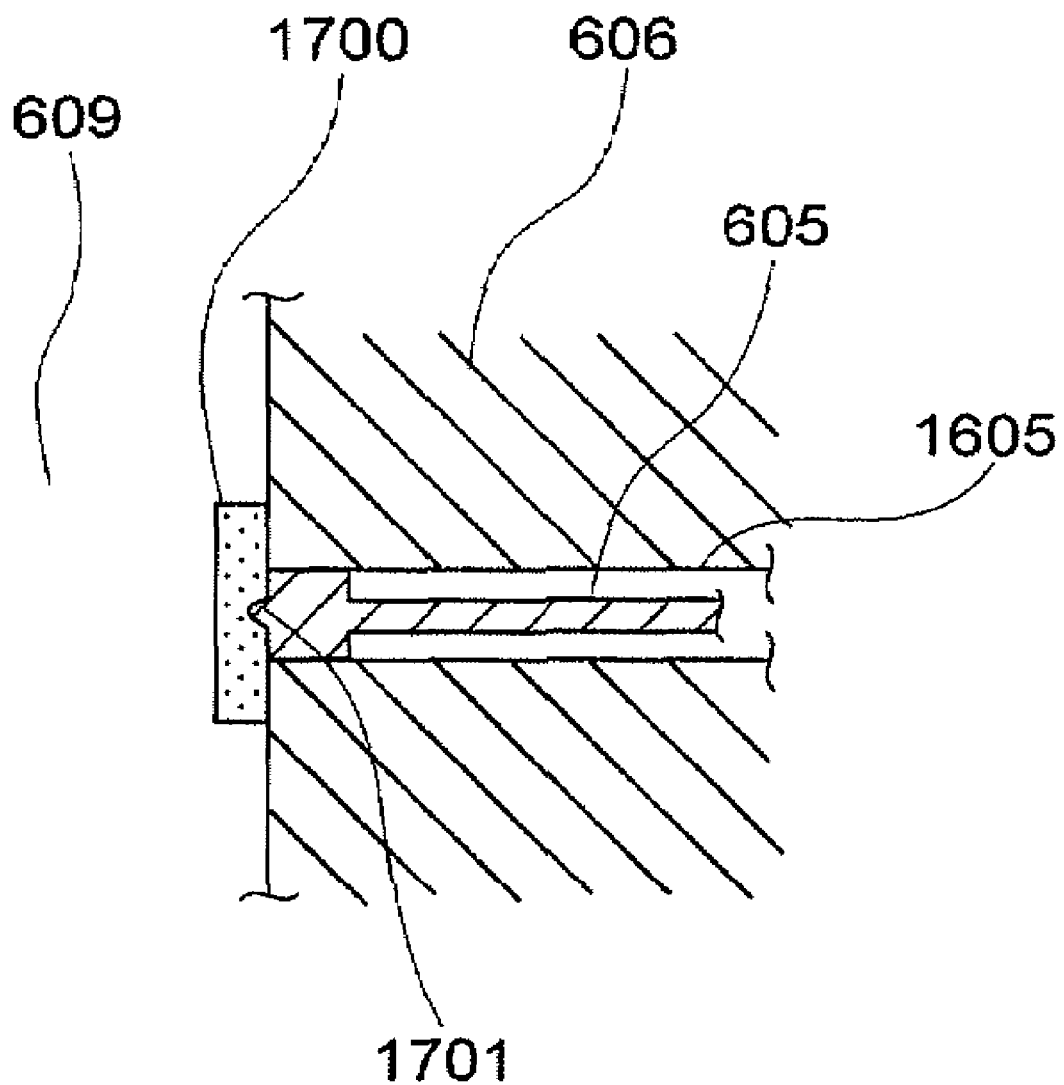
FIG. 36 is a sectional view describing an outline of a manufacturing process of the static electricity deflecting device shown in FIG. 17.
Figure 37:
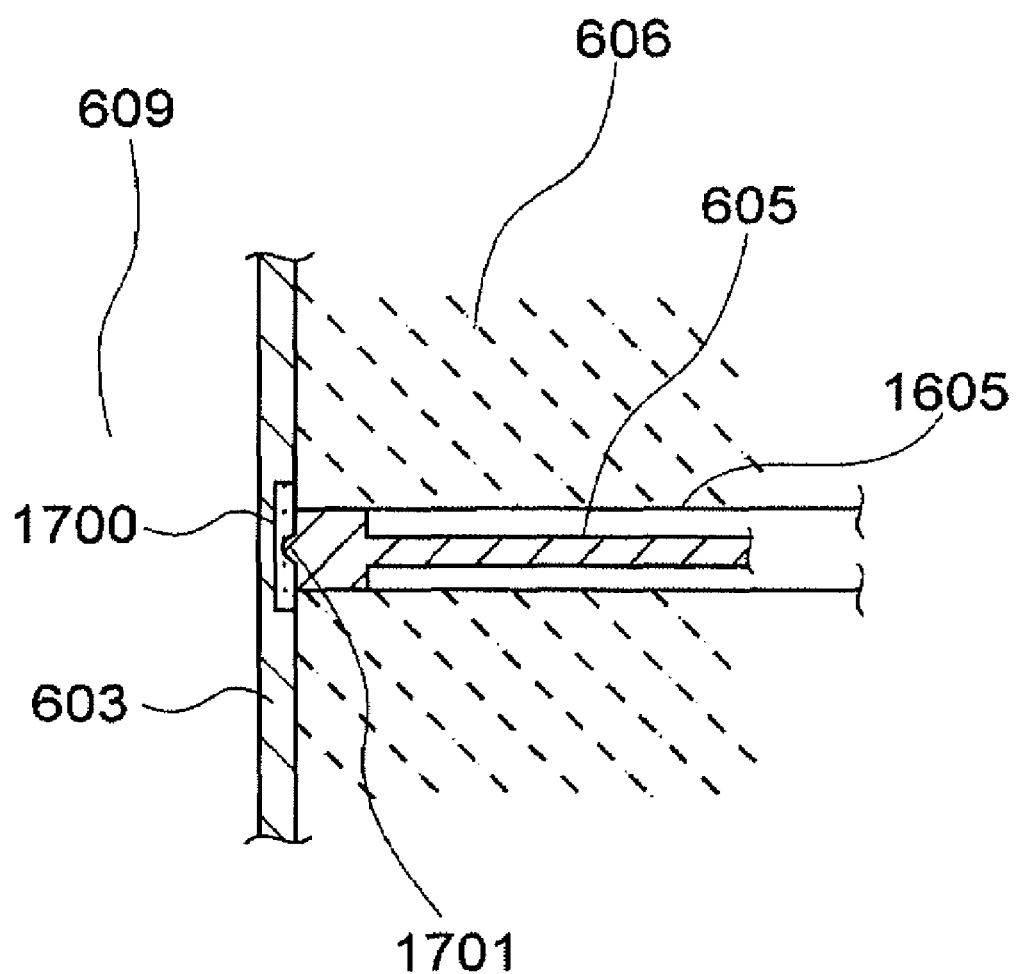
FIG. 37 is a sectional view describing an outline of a manufacturing process of the static electricity deflecting device shown in FIG. 17.

Next, a manufacturing method of the static electricity deflecting device according to an embodiment of the present invention will be described. For simplicity, in FIG. 36, similar portions to those of the foregoing embodiment will be denoted by similar reference numerals and their description will be omitted. As shown in FIG. 36, a predetermined member, for example a conductive member 1700, that can contact a voltage input terminal 605 is disposed on an electron beam passing portion 609 side of a inner layer 606 of the static electricity deflecting device. The voltage input terminal 605 is inserted into a voltage input terminal opening 1605 from the outside of an outer layer 601. An edge portion 1701 of the voltage input terminal 605 is pressed to the conductive member 1700. As a result, the voltage input terminal 605 is connected to the static electricity deflecting device. The edge portion 1701 of the voltage input terminal 605 has a convex portion 1701, for example a plurality of needle-shaped members, that allow the edge portion 1701 to securely electrically contact the conductive member 1700. Thereafter, as shown in FIG. 37, the conductive member 1700 is scraped off for a predetermined thickness. It is preferred that the thickness of the conductive member 1700 to be scraped off be smaller than the thickness of the deflecting electrode 603. Since at least a part of the conductive member 1700 is scraped off, it can be said that the conductive member 1700 is a sacrifice member.

Thereafter, a deflecting electrode 603 is formed on the inner layer 606 on the electron beam passing portion 609 side of the static electricity deflecting device for a predetermined thickness by the spatter method or plating method. At this point, it is preferred that the deflecting electrode 603 on the electron beam passing portion 609 side of the inner layer 606 of the static electricity deflecting device be not unevenly formed. Thus, when the deflecting electrode 603 is flat against an electron beam emitted from the electron gun 501, the deflecting electrode 603 can be prevented from adversely affecting the electron beam. As another example, after a base film (first film) of the deflecting electrode 603 is formed, the conductive member 1700 is formed. Thereafter, the voltage input terminal 605 is inserted from the outside of the outer layer 601 into the voltage input terminal opening 1605. The edge portion 1701 of the voltage input terminal 605 is pressed to the conductive member 1700. As a result, the voltage input terminal 605 is connected to the static electricity deflecting device. Thereafter, the conductive member 1700 is scraped off for a predetermined thickness. Thereafter, the deflecting electrode 603 as the foregoing main base film (second film) is formed on the inner layer 606 on the electron beam passing portion 609 side of the static electricity deflecting device by the spatter method or the plating method.

Figure 38:
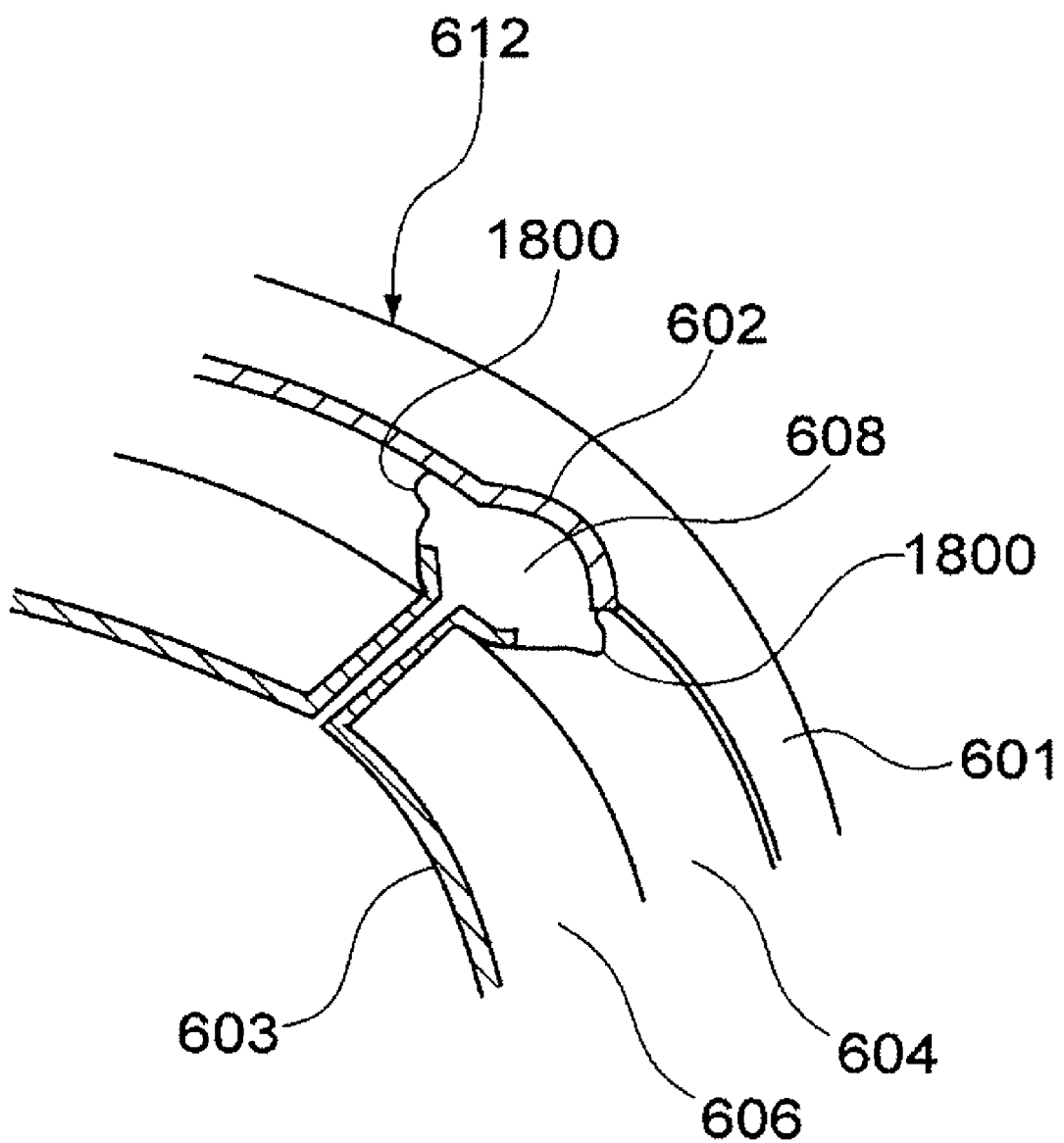
FIG. 38 is a perspective view describing an outline of a static electricity deflecting device according to another embodiment of the present invention.

Next, with reference to FIG. 38, a static electricity deflecting device according to another embodiment of the present invention will be described. For simplicity, in FIG. 38, similar portions to those of the foregoing embodiment will be denoted by similar reference numerals and their description will be omitted. As shown in FIG. 38, a space portion 608 of a cylindrical member 612 of the static electricity deflecting device is formed in an elliptic shape. In addition, elliptic concave portions 1800 are formed at a plurality of positions, for example two positions. A part of a deflecting electrode 603 is uniformly formed for a predetermined portion of the space portion 608. In addition, a first conductive film 602 is formed nearly from the end of the concave portion 1800. Since the space portion 608 is formed in such an elliptic shape, the diameter of the static electricity deflecting device can be decreased. In addition, since the concave portions 1800 allow the substantial volume of the space portion 608 to be provided, resulting in preventing an abnormality such as abnormal discharging from occurring.

Figure 39:
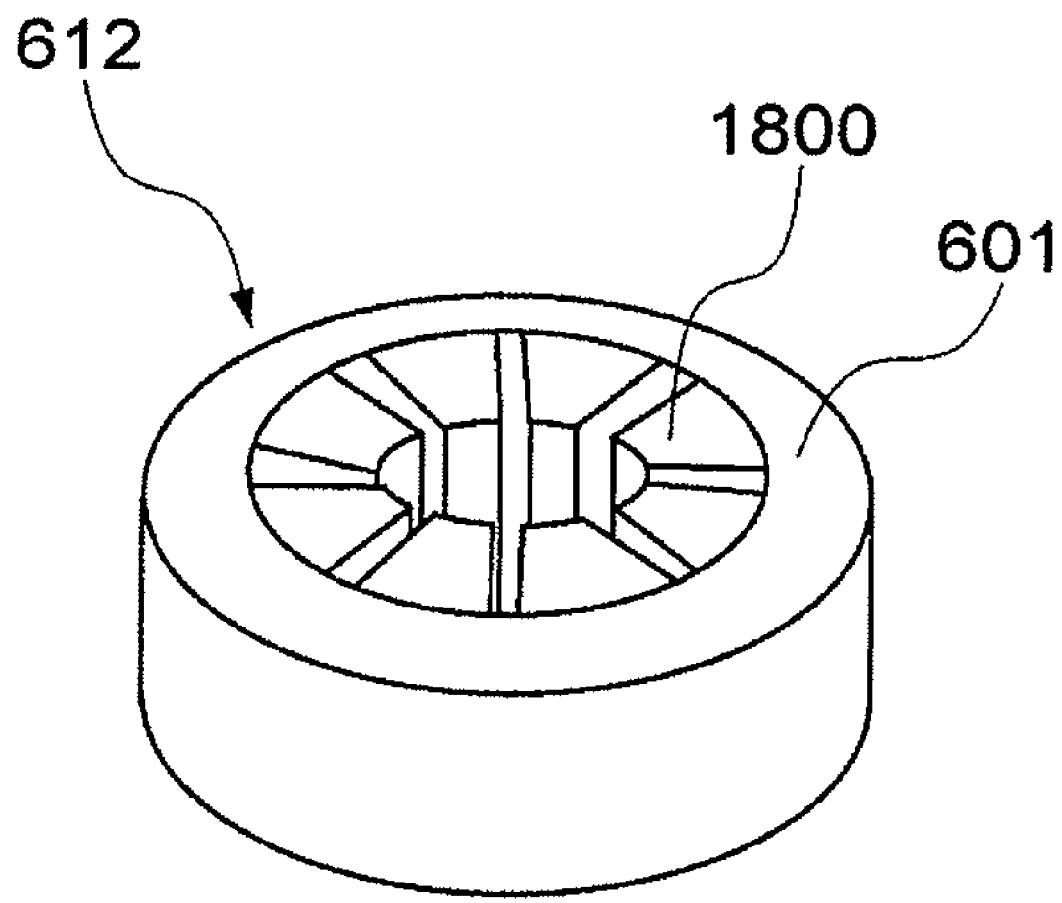
FIG. 39 is a perspective view describing an outline of a static electricity deflecting device according to another embodiment of the present invention.
Figure 40:
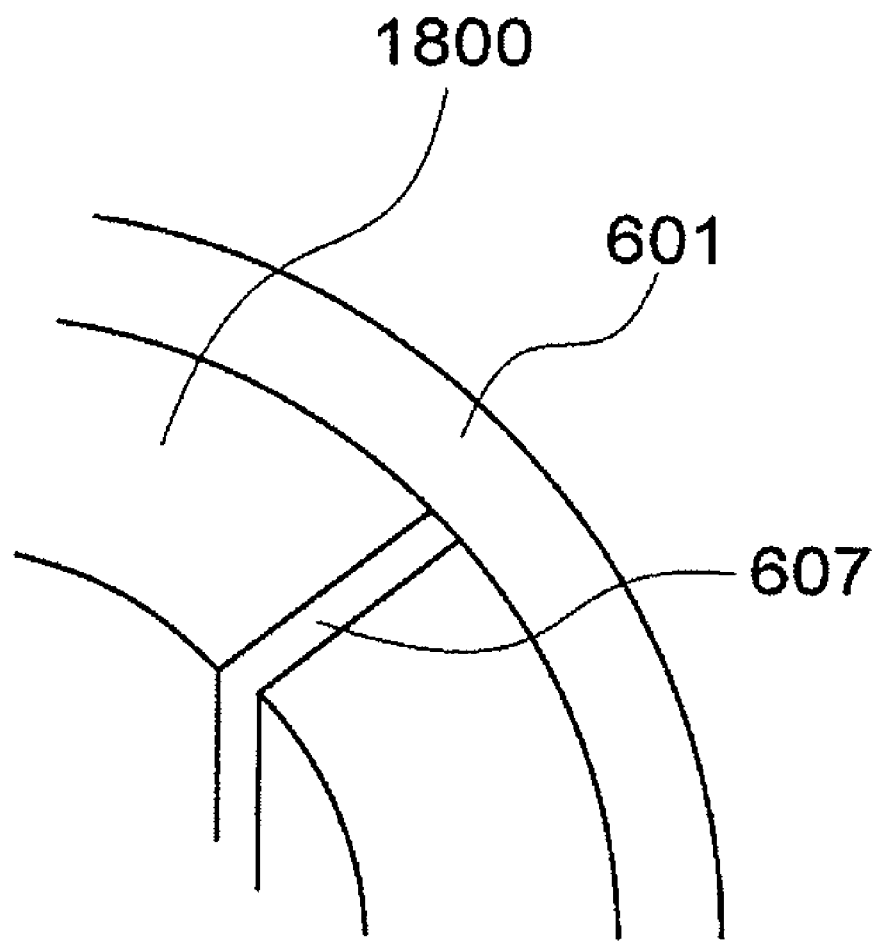
FIG. 40 is a perspective view describing an outline of principal sections of the static electricity deflecting device shown in FIG. 39.

Next, with reference to FIG. 39, a static electricity deflecting device according to another embodiment of the present invention will be described. For simplicity, in FIG. 39, similar portions to those of the foregoing embodiment will be denoted by similar reference numerals and their description will be omitted. As shown in FIG. 39, a cylindrical member 612 of the static electricity deflecting device is composed of an inner layer 1800 made of a conductive material for example a metal and an outer layer 601 made of an insulative material, for example ceramic. In this example, the static electricity deflecting device has eight deflecting electrodes. As shown in FIG. 40, a connection portion 607 is a groove radially formed from the center of the static electricity deflecting device. The outer layer 601 is visible from the center of the static electricity deflecting device. In addition, since the material of the inner layer 1800 is substantially different from the material of the outer layer 601, they are unified by connecting or brazing them. In this structure, the insulative area of one connection portion 607 (groove) becomes small in comparison with that of the related art. Since the inner layer 1800 is made of a metal, the groove can be easily formed. In addition, since the groove can be easily formed, the aspect ratio (the length of the groove/the width of the groove) of the inner layer 1800 to the outer layer 601 as an insulative member become large. Thus, deflecting electrodes that less drift can be formed.

Figure 41:
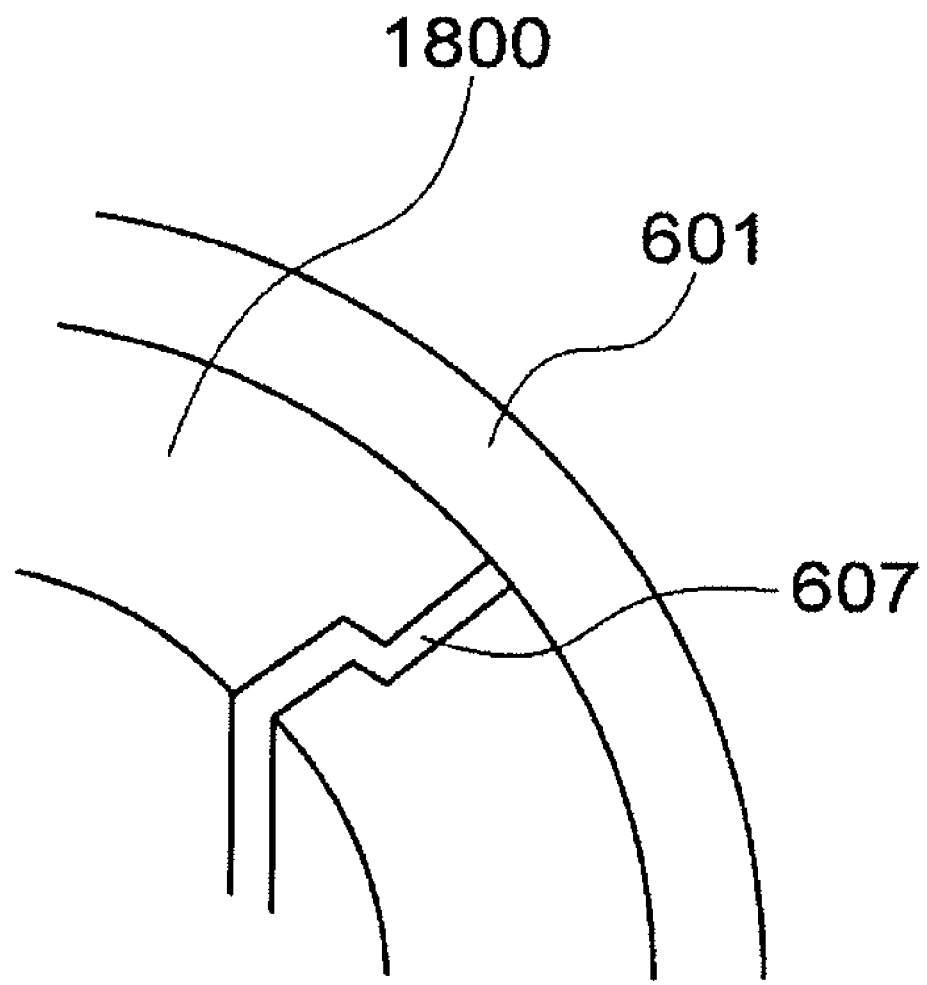
FIG. 41 is a perspective view describing an outline of the static electricity deflecting device shown in FIG. 40.

Next, with reference to FIG. 41, a static electricity deflecting device according to another embodiment of the present invention will be described. For simplicity, in FIG. 41, similar portions to those of the foregoing embodiment will be denoted by similar reference numerals and their description will be omitted. As shown in FIG. 41, a connection portion 607 of a cylindrical member 612 of the static electricity deflecting device is radially formed as a groove having a plurality of stairs from the center of the static electricity deflecting device. Thus, since grooves are radially formed from the center of the static electricity deflecting device, the outer layer 601 is not visible from the center of the static electricity deflecting device. In this structure, the aspect ratio (the length of the groove/the width of the groove) becomes large. Thus, deflecting electrodes that less drift can be formed.

Figure 42:
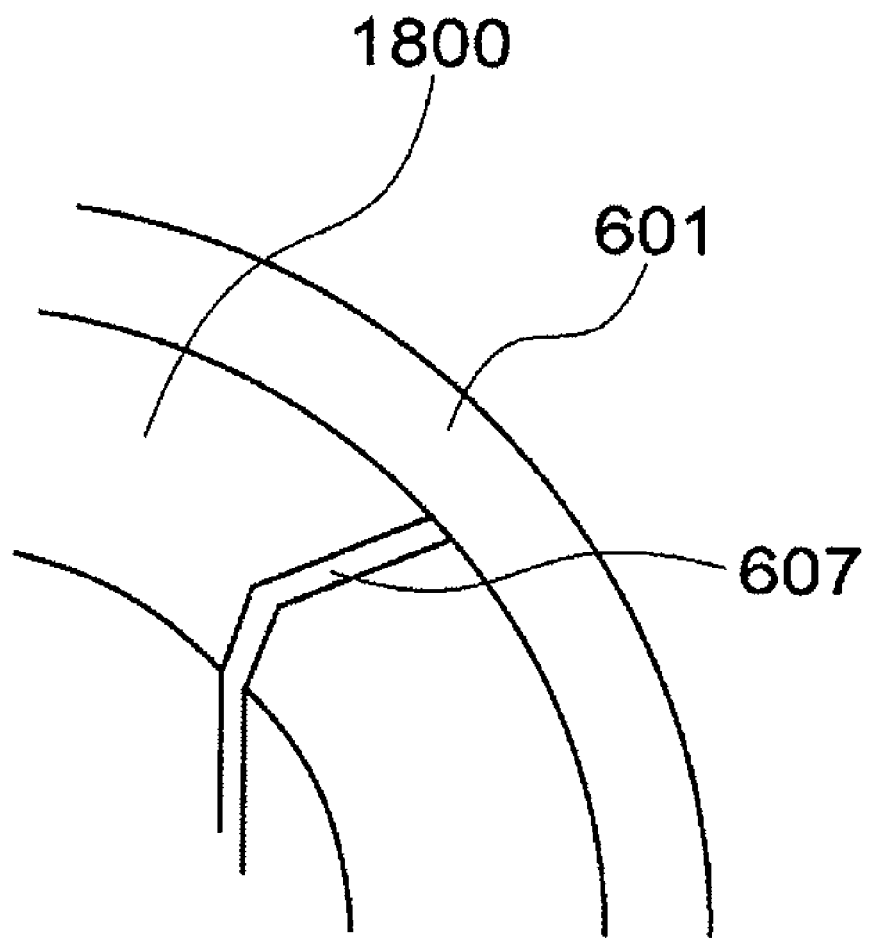
FIG. 42 is a perspective view describing an outline of the static electricity deflecting device shown in FIG. 40.

Next, with reference to FIG. 42, a static electricity deflecting device according to another embodiment of the present invention will be described. For simplicity, in FIG. 42, similar portions to those of the foregoing embodiment will be denoted by similar reference numerals and their description will be omitted. As shown in FIG. 42, a connection portion 607 of a cylindrical member 612 of the static electricity deflecting device is composed of a groove that has a predetermined length and a predetermined angle (first angle), for example $\theta 1$, measured from a radial line from the center of the static electricity deflecting device, and a grove that is connected the foregoing groove and the outer layer 601 and that has a predetermined angle (first angle), for example $-\theta 2$, measured from the radial line from the center of the static electricity deflecting device. Thus, since grooves are radially formed from the center of the static electricity deflecting device, the outer layer 601 is not visible from the center of the static electricity deflecting device. In this structure, the aspect ratio (the length of the groove/the width of the groove) becomes large. Thus, deflecting electrodes that less drift can be formed.

Figure 43:
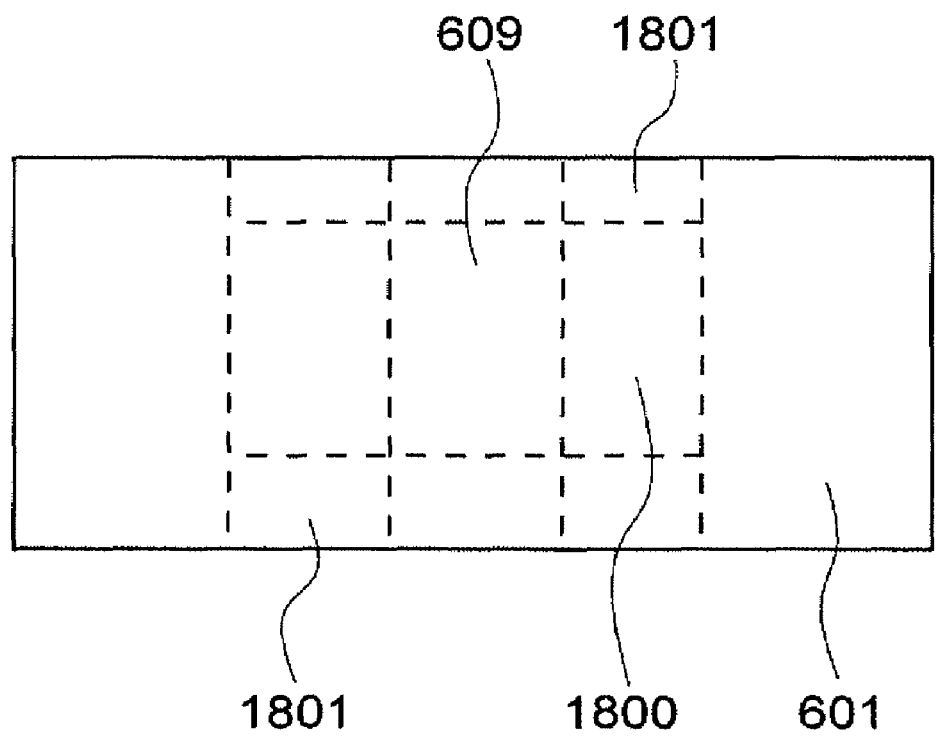
FIG. 43 is a perspective view describing an outline of the static electricity deflecting device shown in FIG. 39.

Next, with reference to FIG. 43, a static electricity deflecting device according to another embodiment of the present invention will be described. For simplicity, in FIG. 43, similar portions to those of the foregoing embodiment will be denoted by similar reference numerals and their description will be omitted. As shown in FIG. 43, in an inner layer 1800, a concave portion 1801 is formed such that static electricity deflecting devices can be easily stacked or a static electricity deflecting device can be easily aligned with a support member. In this embodiment, the thickness of the inner layer 1800 is smaller than the thickness of an outer layer 601. Instead, the concave portion 1801 may be formed from the middle of the outer layer 601 to the inner layer 1800. A connection portion 607 of a cylindrical member 612 of the static electricity deflecting device is radially formed as a groove having a plurality of stairs from the center of the static electricity deflecting device. Thus, since grooves are radially formed from the center of the static electricity deflecting device, the outer layer 601 is not visible from the center of the static electricity deflecting device. In this structure, the aspect ratio (the length of the groove/the width of the groove) becomes large. Thus, deflecting electrodes that less drift can be formed.

Figure 44:
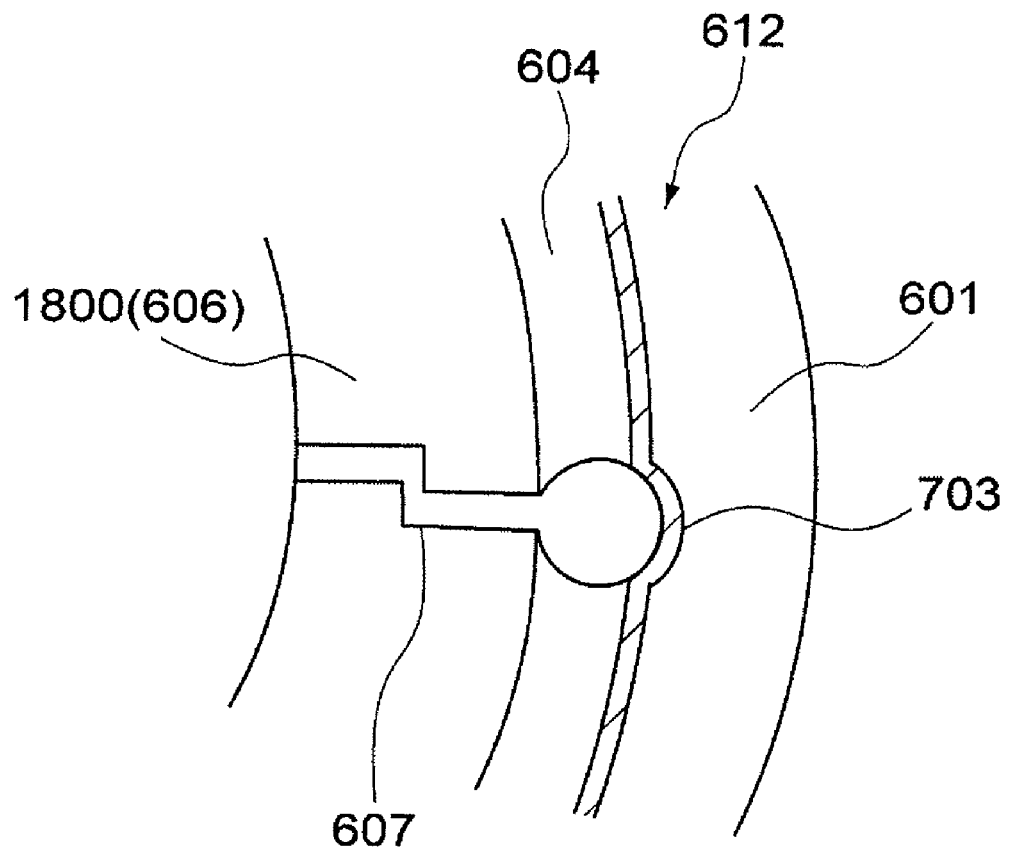
FIG. 44 is a perspective view describing an outline of the static electricity deflecting device shown in FIG. 40.

Next, with reference to FIG. 44, a static electricity deflecting device according to another embodiment of the present invention will be described. For simplicity, in FIG. 44, similar portions to those of the foregoing embodiment will be denoted by similar reference numerals and their description will be omitted. As shown in FIG. 44, a cylindrical member 612 of the static electricity deflecting device is composed of an inner layer 1800 (corresponding to the inner layer 606) made of a conductive material for example a metal, a middle layer 604 made of the foregoing material, and an outer layer 601 made of the foregoing material, for example ceramic. In this example, the static electricity deflecting device has eight deflecting electrodes. As shown in FIG. 40, a connection portion 607 is a stair-shaped (or radial) groove from the center of the static electricity deflecting device. The outer layer 601 is not visible from the center of the static electricity deflecting device. In addition, since the material of the inner layer 1800 is substantially different from the material of the outer layer 601, they are unified by connecting or brazing them. In this structure, the insulative area of one connection portion 607 (groove) becomes small in comparison with that of the related art. Since the inner layer 1800 is made of a metal, the groove can be easily formed. In addition, since the groove can be easily formed, the aspect ratio (the length of the groove/the width of the groove) of the inner layer 1800 to the outer layer 601 as an insulative member become large. Thus, deflecting electrodes that less drift can be formed. In such a manner, the static electricity deflecting device can be structured in a combination of the foregoing embodiments without departing from the spirit and scope of the present invention.

Figure 45:
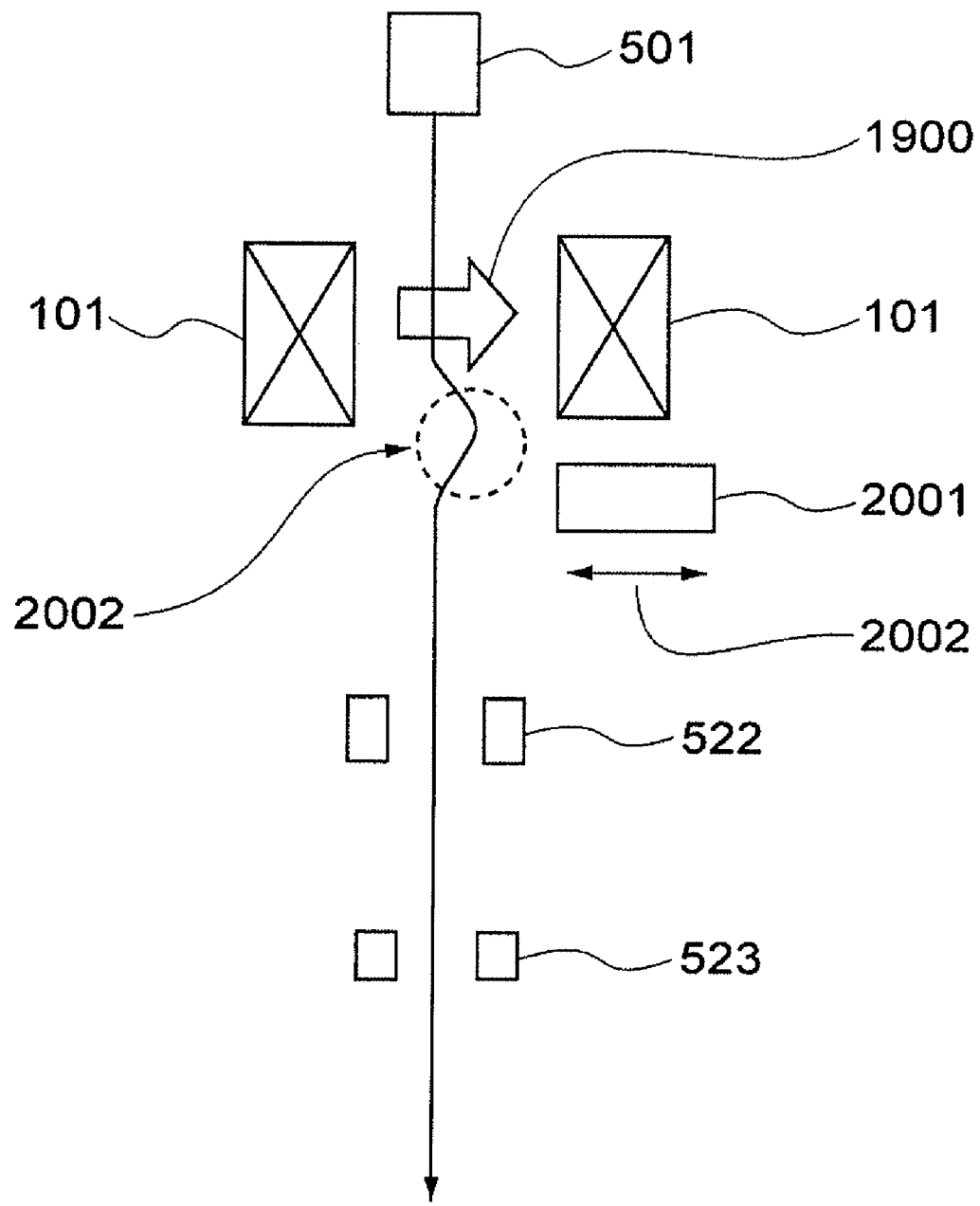
FIG. 45 is a schematic diagram describing an outline of the structure of a substrate processing apparatus according to another embodiment of the present invention.
Figure 46:
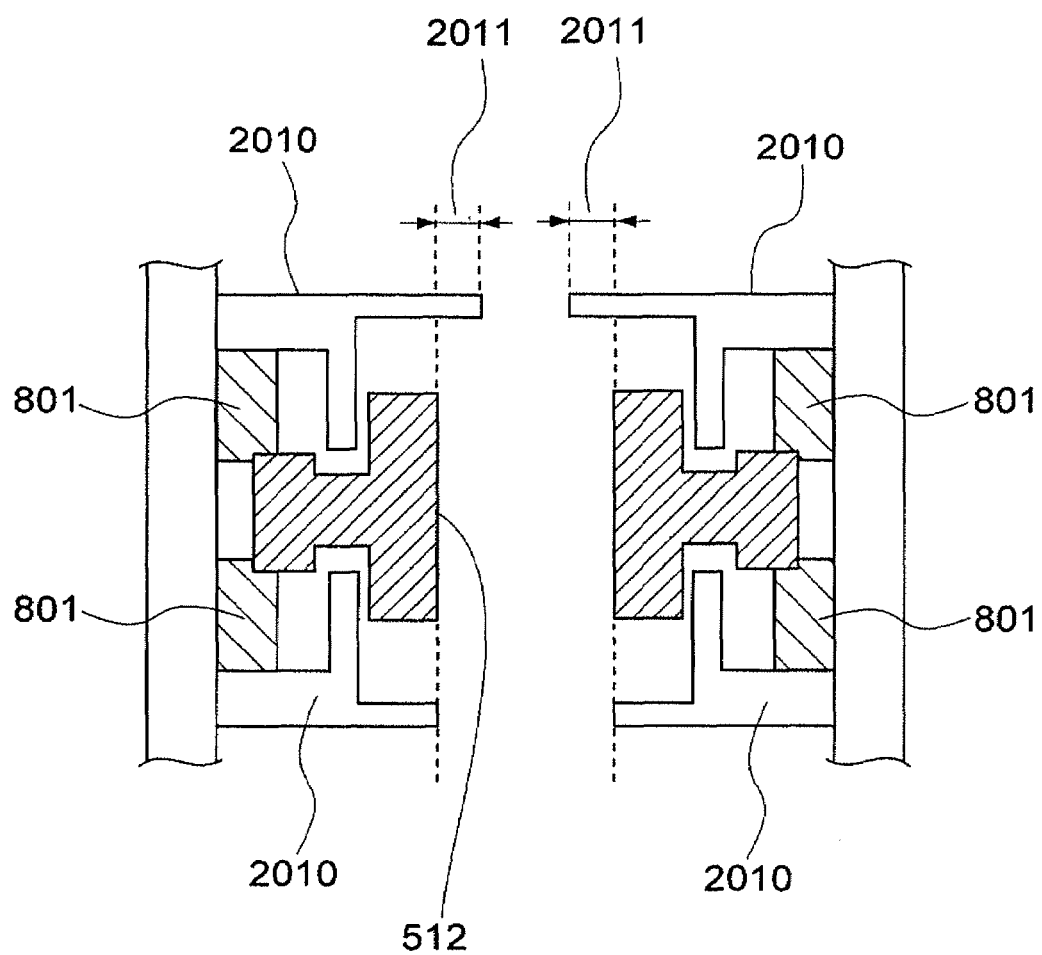
FIG. 46 is a sectional view showing an outline of a lens according to another embodiment of the present invention.

Next, with reference to FIG. 45, a substrate processing apparatus according to another embodiment of the present invention will be described. For simplicity, in FIG. 45, similar portions to those of the foregoing embodiment will be denoted by similar reference numerals and their description will be omitted. As shown in FIG. 45, when a magnetic field generating mechanism such as an air vent mechanism, for example an ion pump, for example, a coaxial type ion pump, is used, a magnetic field 1900 is generated in a predetermined direction. The magnetic field 1900 prevents an electron beam that is emitted by the electron gun 501 from traveling straight, thereby causing the electron beam to become a bent beam 2002. To suppress such a problem, as deflection compensation means that compensates traveling of an electron beam outside the exposure processing chamber 4 and that surrounds a magnetic field generation source such as an ion pump, for example a motor, a power supply, an amplifier portion 130, or a control mechanism, a magnetic field suppressing mechanism (third magnetic shield) that surrounds them, for example a magnetic shield member 2001, for example a member made of for example permalloy, magnetic soft iron, magnetic steel iron, Sendust, ferrite, or the like. The magnetic shield member 2001 is designed to cause a moving mechanism (not shown) to compensate the bent portion 2002 of the electron beam with a moving mechanism (not shown). The control mechanism may be designed to automatically control the moving mechanism to move the magnetic shield member 2001. Instead, the magnetic shield member 2001 may be manually aligned.

When a varying magnetic field suppressing mechanism (third magnetic field), for example, a magnetic shield member that electromagnetically shields a substance, for example, a Helmholtz coil is used for the magnetic shield member 2001 instead of the foregoing fixed shield, the moving mechanism may be omitted. When a magnetic source generates a DC magnetic field, such a shield may be used. The column 100 may be surrounded by this shield.

As the relationship of the magnetic shield member 1500, which is the second magnetic shield, and the magnetic shield member 2001, which is the third magnetic shield, one of the second magnetic shield and the third magnetic shield may be disposed outside the other of the second magnetic shield and the third magnetic shield. For example, the third magnetic shield may be disposed inside the second magnetic shield. The second magnetic shield may be disposed inside the third magnetic shield. Instead, the third magnetic shield may be disposed inside the second magnetic shield and the second magnetic shield is disposed inside the third magnetic shield as a mixed arrangement. However, it is preferred that the first magnetic shield, which is the foregoing fixed shield, be disposed outside the second magnetic shield and the third magnetic shield to prevent a magnetic field from being generated outside the second magnetic shield and the third magnetic shield.

As described above, in this embodiment, since a static electricity deflecting device of the column in the electron beam irradiating apparatus disposed in the exposure processing chamber is provided with space portions as electron capturing areas, electrons that entered into the space portions do not easily return to the electron beam passing section. Even if charge-up occurs due to electrons that entered into the space portions, electrons are quickly discharged by the first conductive film. Thus, an electron beam is not deflected to other than a desired position. As a result, the exposure accuracy does not deteriorate due to charge-up.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention. For example, in the foregoing embodiments, a semiconductor wafer was described as a substrate under processing. However, the substrate under processing may be a plate shape substrate such as an LCD substrate. In addition, the shape of the space portions was described as a circular shape having curved portions. However, the present invention is not limited to such an example.

What is claimed is:

1. A substrate processing apparatus which irradiates a substrate under processing with an electron beam and processes the substrate with the electron beam, comprising:
    an electron beam generation mechanism which generates the electron beam;
    a first area having a plurality of first static electricity deflecting devices whose thicknesses gradually increase in a traveling direction of the electron beam; and
    a second area disposed on a downstream side of the electron beam of the first area and having a plurality of second static electricity deflecting devices whose thicknesses are nearly same in the traveling direction of the electron beam.

2. The substrate processing apparatus as set forth in claim 1, further comprising:
    a plurality of lenses whose thicknesses gradually decrease in the traveling direction of the electron beam, at least one of the plurality of lenses being disposed in each of the first area and the second area.

3. The substrate processing apparatus as set forth in claim 1,
    wherein at least either of the plurality of first static electricity deflecting devices and the plurality of second static electricity deflecting devices each includes:
    a cylindrical member having an electron beam passing portion,
    a plurality of deflecting electrodes which are disposed on an inner wall surface of the cylindrical member along a cylindrical axis thereof and each of which is electrically divided,
    a plurality of space portions each of which is connected to a gap portion formed by adjacent two of the plurality of deflecting electrodes, each of the plurality of space portions being disposed at an outer position of the gap portion when each of the plurality of space portions is viewed from the electron beam passing portion, and
    a first conductive film formed in each of the plurality of space portions.

4. The substrate processing apparatus as set forth in claim 1,
    wherein at least either of the plurality of first static electricity deflecting devices and the plurality of second static electricity deflecting devices each includes:
    a cylindrical member having an electron beam passing portion,
    a plurality of deflecting electrodes which are disposed on an inner wall surface of the cylindrical member along a cylindrical axis thereof and each of which is electrically divided,
    a plurality of space portions each of which is connected to a gap portion formed by adjacent two of the plurality of deflecting electrodes, each of the plurality of space portions being disposed at an outer position of the gap portion when each of the plurality of space portions is viewed from the electron beam passing portion, and
    a first conductive film formed in each of the plurality of space portions,
    wherein the first conductive film is disposed in an area which is visible when each of the plurality of space portions is viewed from the electron beam passing portion.

5. The substrate processing apparatus as set forth in claim 1,
    wherein at least either of the plurality of first static electricity deflecting devices and the plurality of second static electricity deflecting devices each includes:
    a cylindrical member having an electron beam passing portion,
    a plurality of deflecting electrodes which are disposed on an inner wall surface of the cylindrical member along a cylindrical axis thereof and each of which is electrically divided,
    a plurality of space portions each of which is connected to a gap portion formed by adjacent two of the plurality of deflecting electrodes, each of the plurality of space portions being disposed at an outer position of the gap portion when each of the plurality of space portions is viewed from the electron beam passing portion,
    a first conductive film formed in each of the plurality of space portions,
    a first connection portion which is connected to the electron beam passing portion, and
    a second connection portion which is wider than the first connection portion and narrower than each of the plurality of space portions and which is connected to each of the plurality of space portions.

6. The substrate processing apparatus as set forth in claim 1, further comprising:
    a magnetic shield mechanism which is disposed outside the substrate processing apparatus and which substantially deflects the traveling of the electron beam; and
    a control mechanism which electrically controls the magnetic shield mechanism or freely controls moving of the magnetic shield mechanism.

7. A substrate processing apparatus which irradiates a substrate under processing with an electron beam and processes the substrate with the electron beam, comprising:
    an electron beam generation mechanism which generates the electron beam;
    a first area having a plurality of first static electricity deflecting devices, the first area being disposed in a traveling direction of the electron beam, each of the plurality of first static electricity deflecting devices having a first number of electrodes; and
    a second area disposed on a downstream side of the electron beam of the first area and having a second static electricity deflecting device, the second static electricity deflecting device having a second number of electrodes which is a quotient of which the first number of electrodes is divided by an even number.

8. The substrate processing apparatus as set forth in claim 7, further comprising:
    a third area having at least one third static electricity deflecting device, the third static electricity deflecting device having a third number of electrodes which is a product of which the first number of electrodes is multiplied by an even number and is larger than the first number of electrodes and the second number of electrodes.

9. The substrate processing apparatus as set forth in claim 8, further comprising:
    a plurality of lenses whose thicknesses gradually decrease in a traveling direction of the electron beam, at least one of the plurality of lenses being disposed in each of the first area, the second area, and the third area.

10. The substrate processing apparatus as set forth in claim 8, further comprising:
a fourth area downstream of the third area; and
a plurality of lens, at least one of which is disposed in each of the first area, the second area, the third area, and the fourth area,
wherein inner diameters of the lenses disposed in the second area and the third area are nearly same,
wherein an inner diameter of the fourth area is smaller than each of the inner diameters of the lenses disposed in the second area and the third area and/or thicknesses of the lenses disposed in the second area and the third area are nearly same,
wherein a thickness of the lens disposed in the fourth area is smaller than that of each of the lenses disposed in the second area and the third area and/or that of each of the lenses disposed in the second area and the third area are nearly same, and
wherein a thickness of the lens disposed in the first area is larger than that of each of the lenses disposed in the second area and the third area.

11. The substrate processing apparatus as set forth in claim 8, further comprising:
a fourth area downstream of the third area; and
a plurality of lens, at least one of which is disposed in each of the first area, the second area, the third area, and the fourth area,
wherein a DC voltage applied to the lenses disposed in the second area and the third area is lower than a DC voltage applied to the lens disposed in the first area and/or the lens disposed in the fourth area.

12. The substrate processing apparatus as set forth in claim 7,
wherein at least either of the plurality of first static electricity deflecting devices and the second static electricity deflecting device each includes:
a cylindrical member having an electron beam passing portion,
a plurality of deflecting electrodes which are disposed on an inner wall surface of the cylindrical member along a cylindrical axis thereof and each of which is electrically divided,
a plurality of space portions each of which is connected to a gap portion formed by adjacent two of the plurality of deflecting electrodes, each of the plurality of space portions being disposed at an outer position of the gap portion when each of the plurality of space portions is viewed from the electron beam passing portion, and
a first conductive film formed in each of the plurality of space portions.

13. The substrate processing apparatus as set forth in claim 7,
wherein at least either of the plurality of first static electricity deflecting devices and the second static electricity deflecting device each includes:
a cylindrical member having an electron beam passing portion,
a plurality of deflecting electrodes which are disposed on an inner wall surface of the cylindrical member along a cylindrical axis thereof and each of which is electrically divided,
a plurality of space portions each of which is connected to a gap portion formed by adjacent two of the plurality of deflecting electrodes, each of the plurality of space portions being disposed at an outer position of the gap portion when each of the plurality of space portions is viewed from the electron beam passing portion, and
a first conductive film formed in each of the plurality of space portions.
wherein the first conductive film is disposed in an area which is visible when each of the plurality of space portions is viewed from the electron beam passing portion.

14. The substrate processing apparatus as set forth in claim 7,
wherein at least either of the plurality of first static electricity deflecting devices and the second static electricity deflecting device each includes:
a cylindrical member having an electron beam passing portion,
a plurality of deflecting electrodes which are disposed on an inner wall surface of the cylindrical member along a cylindrical axis thereof and each of which is electrically divided,
a plurality of space portions each of which is connected to a gap portion formed by adjacent two of the plurality of deflecting electrodes, each of the plurality of space portions being disposed at an outer position of the gap portion when each of the plurality of space portions is viewed from the electron beam passing portion,
a first conductive film formed in each of the plurality of space portions,
a first connection portion which is connected to the electron beam passing portion, and
a second connection portion which is wider than the first connection portion and narrower than each of the plurality of space portions and which is connected to each of the plurality of space portions.

15. The substrate processing apparatus as set forth in claim 7, further comprising:
a magnetic shield mechanism which is disposed outside the substrate processing apparatus and which substantially deflects the traveling of the electron beam; and
a control mechanism which electrically controls the magnetic shield mechanism or freely controls moving of the magnetic shield mechanism.

16. A substrate processing method of irradiating a substrate under processing with an electron beam and processing the substrate with the electron beam, the method comprising the steps of:
causing a plurality of first static electricity deflecting devices each of which has a first number of electrodes to deflect the electron beam and a first lens having a first thickness to focus the electron beam in a traveling direction of the electron beam in a first area;
causing a second static electricity deflecting device which has a second number of electrodes which is a quotient of which the first number of electrodes is divided by an even number to deflect the electron beam and a second lens having a second thickness which is larger than the first thickness to focus the electron beam in the traveling direction of the electron beam in a second area downstream of the electron beam of the first area; and
causing at least one third static electricity deflecting device having a third number of electrodes which is a product of which the first number of electrodes is multiplied by an even number and which is larger than the first number of electrodes and the second number of electrodes and a third lens having a third thickness which is smaller than the second thickness to focus the electron beam in the traveling direction of the electron beam in a third area downstream of the electron beam of the second area.

17. The substrate processing method as set forth in claim 16, further comprising the step of:
   causing a plurality of lenses at least one of which is disposed in each of the first area, the second area, and the third area, thicknesses of the lenses gradually decreasing in the traveling direction of the electron beam, to focus the electron beam.

18. The substrate processing method as set forth in claim 16,
   wherein at least either of the plurality of first static electricity deflecting devices and the second static electricity deflecting device each includes:
   a cylindrical member having an electron beam passing portion,
   a plurality of deflecting electrodes which are disposed on an inner wall surface of the cylindrical member along a cylindrical axis thereof and each of which is electrically divided,
   a plurality of space portions each of which is connected to a gap portion formed by adjacent two of the plurality of deflecting electrodes, each of the plurality of space portions being disposed at an outer position of the gap portion when each of the plurality of space portions is viewed from the electron beam passing portion, and
   a first conductive film formed in each of the plurality of space portions, and
   wherein the electrons are captured by the first conductive film.

19. The substrate processing method as set forth in claim 16, further comprising the step of:
   substantially deflecting the traveling of the electron beam outside a processing apparatus.

* * * * *